(12) United States Patent
Inoue et al.

(10) Patent No.: US 10,760,155 B2
(45) Date of Patent: Sep. 1, 2020

(54) VAPOR DEPOSITION SOURCE AND VAPOR DEPOSITION DEVICE FOR PRODUCING VAPOR DEPOSITION FILM WITH HIGH MATERIAL USAGE EFFICIENCY

(71) Applicant: Sharp Kabushiki Kaisha, Sakai, Osaka (JP)

(72) Inventors: Satoshi Inoue, Sakai (JP); Shinichi Kawato, Sakai (JP); Manabu Niboshi, Sakai (JP); Yuhki Kobayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 282 days.

(21) Appl. No.: 15/761,169

(22) PCT Filed: Sep. 20, 2016

(86) PCT No.: PCT/JP2016/077623
§ 371 (c)(1),
(2) Date: Mar. 19, 2018

(87) PCT Pub. No.: WO2017/051790
PCT Pub. Date: Mar. 30, 2017

(65) Prior Publication Data
US 2018/0258521 A1    Sep. 13, 2018

(30) Foreign Application Priority Data

Sep. 24, 2015 (JP) .................................. 2015-187431

(51) Int. Cl.
*C23C 14/24* (2006.01)
*H01L 51/50* (2006.01)
(Continued)

(52) U.S. Cl.
CPC .......... *C23C 14/243* (2013.01); *C23C 14/042* (2013.01); *C23C 14/12* (2013.01);
(Continued)

(58) Field of Classification Search
CPC ..... C23C 14/243; C23C 14/042; C23C 14/12; H01L 1/50; H01L 51/5012; H01L 51/001; H01L 51/5048; H01L 51/56
See application file for complete search history.

(56) References Cited

U.S. PATENT DOCUMENTS 6,383,954 B1 * 5/2002 Wang ................ H01L 21/31629
438/789
6,787,180 B2 * 9/2004 Gimmi .................... G03F 7/162
118/320

(Continued)

FOREIGN PATENT DOCUMENTS

CN    103385035 A    11/2013
EP    1 418 250 A2    5/2004
(Continued)

OTHER PUBLICATIONS

Versteeg, Vera A., et al., "Metalorganic Chemical Vapor Deposition by Pulsed Liquid Injection Using an Ultrasonic Nozzle: Titanium Dioxide on Sapphire from Titanium(IV) Isopropoxide". J. Am. Ceram. Soc., 78 [10] 2763-2768 (1995).*

(Continued)

*Primary Examiner* — Bret P Chen
(74) *Attorney, Agent, or Firm* — Keating & Bennett, LLP

(57) ABSTRACT

To provide a vapor deposition source of which material usage efficiency is higher as compared with the related art. A vapor deposition source (10) includes a vapor deposition particles ejecting unit (30) configured to include multistage of nozzle units layered apart from each other in a vertical direction, each of the nozzle units including at least one
(Continued)

vapor deposition nozzle (32, 52), and at least one space part (43) provided between the multistage of vapor deposition nozzles, and a vacuum exhaust unit (14) connected with the at least one space part (43).

14 Claims, 13 Drawing Sheets

(51) Int. Cl.
*C23C 14/04* (2006.01)
*H05B 33/10* (2006.01)
*H05B 33/14* (2006.01)
*C23C 14/12* (2006.01)
*H01L 51/00* (2006.01)
*H01L 51/56* (2006.01)

(52) U.S. Cl.
CPC .......... *H01L 51/50* (2013.01); *H01L 51/5012* (2013.01); *H05B 33/10* (2013.01); *H05B 33/14* (2013.01); *H01L 51/001* (2013.01); *H01L 51/5048* (2013.01); *H01L 51/56* (2013.01)

(56) References Cited

U.S. PATENT DOCUMENTS

| | | | | |
|---|---|---|---|---|
| 2010/0009079 | A1* | 1/2010 | Yamazaki | C23C 16/45557 427/255.28 |
| 2013/0186335 | A1* | 7/2013 | Kawato | C23C 14/12 118/720 |
| 2013/0319331 | A1* | 12/2013 | Sonoda | C23C 14/562 118/720 |
| 2013/0323882 | A1* | 12/2013 | Inoue | C23C 14/042 438/99 |
| 2013/0337174 | A1* | 12/2013 | Goebert | H01L 31/03923 427/255.395 |
| 2017/0330745 | A1* | 11/2017 | Nagashima | C30B 25/14 |
| 2018/0119268 | A1* | 5/2018 | Kawato | C23C 14/24 |
| 2018/0219187 | A1* | 8/2018 | Inoue | C23C 14/26 |

FOREIGN PATENT DOCUMENTS

| | | | | |
|---|---|---|---|---|
| JP | 2004-137583 A | | 5/2004 | |
| WO | WO 2013/159642 | * | 10/2013 | ........... C23C 16/455 |

OTHER PUBLICATIONS

George, C, et al., "Nozzle Optimization for Dissociated Species Transport in Low Pressure Plasma Chemical Vapor Deposition". Plasma Chemistry and Plasma Processing, vol. 16, No. 1, 1996 (Supplement), pp. 43S-56S.*
Zhang, X.T., et al., "Luminescence of ZnSe nanowires grown by metalorganic vapor phase deposition under different pressures". Journal of Applied Physics, vol. 95, No. 10, May 15, 2004, pp. 5752-5755.*
Bachmann, K.J., et al., "Optimal Design of a High Pressure Organometallic Chemical Vapor Deposition Reactor". Mathematical and Computer Modelling 29 (1999) 65-80.*
Official Communication issued in corresponding Chinese Patent Application No. 201680054843.7, dated Apr. 29, 2019.
Chen et al., "Xinbian Wuli Huaxue Shiyan, a New Physical Chemistry Experiment", China University of Technology Press, Feb. 2014, 6 pages.

* cited by examiner

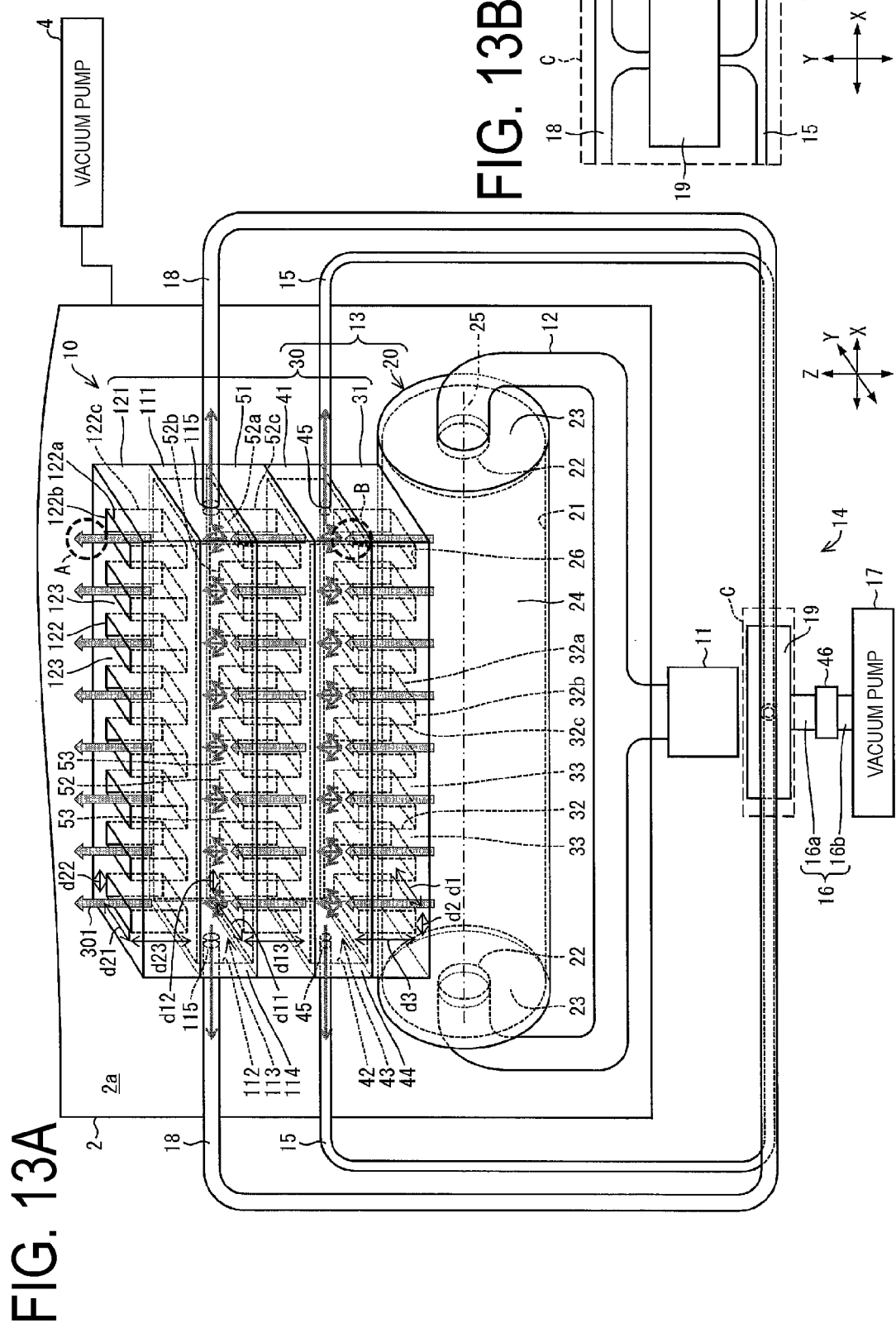

VAPOR DEPOSITION SOURCE AND VAPOR DEPOSITION DEVICE FOR PRODUCING VAPOR DEPOSITION FILM WITH HIGH MATERIAL USAGE EFFICIENCY

TECHNICAL FIELD

The disclosure relates to a vapor deposition source, a vapor deposition device including the vapor deposition source, and a vapor deposition film producing method for producing a vapor deposition film (specifically, forming a vapor deposition film) using the vapor deposition device.

BACKGROUND ART

An electro luminescence (hereinafter, abbreviated as "EL") display device including EL elements using EL of organic materials or inorganic materials, which is an all solid-state type, has self-luminosity, and is excellent in low voltage driving and high responsiveness, has been being developed as a candidate of a next generation display technology.

The EL element is generally formed through film formation by a vacuum vapor deposition technique in which vapor deposition particles (component formed into film) are vapor-deposited on a target film forming substrate via a vapor deposition mask (also referred to as a shadow mask) under a reduced pressure (under a high vacuum), the vapor deposition mask having an opening of a prescribed pattern formed thereon. At this time, as a large substrate film formation technology using a large substrate as a target film forming substrate, a scan vapor deposition technique is promising which does not require a vapor deposition mask or vapor deposition source having a size equivalent to a large target film forming substrate. The scan vapor deposition technique performs scan film formation in which the vapor deposition source smaller than the target film forming substrate, or the vapor deposition mask and vapor deposition source smaller than the target film forming substrate are used to perform film formation while scanning the target film forming substrate.

In the film formation through the vacuum vapor deposition technique, a vapor deposition source including a heating portion and an emitting port is located within a vacuum chamber which is capable of keeping an inside thereof in a reduced pressure state such that the vapor deposition material is heated under a high vacuum to evaporate or sublimate the vapor deposition material. The vapor deposition material heated by the heating portion to be evaporated or sublimated is externally emitted to outside from an emitting port as the vapor deposition particles and deposited on the target film forming substrate.

However, the vapor deposition material heated by the heating portion to be evaporated or sublimated is scattered on an inner wall of the vapor deposition source (i.e., inner wall of a holder housing the heating portion), or the vapor deposition particles repeatedly collide with each other, and after that, the vapor deposition material is emitted from the emitting port.

Such scattering of the vapor deposition particles causes the vapor deposition particles emitted from the emitting port to be emitted in various directions.

In the vacuum vapor deposition technique, the vapor deposition particles emitted toward the target film forming substrate contribute to the film formation, but other vapor deposition particles do not contribute to the film formation. Therefore, in the vacuum vapor deposition technique, the vapor deposition particles other than the vapor deposition film deposited on the target film forming substrate are all loss of the materials. For this reason, the lower a directivity of the vapor deposition particles, the lower a material usage efficiency.

In recent years, a method has been proposed in which a directivity of the vapor deposition particles is heightened by limiting scattering directions of the vapor deposition particles, to thereby lead the vapor deposition particles to a vapor deposition region (e.g., PTL 1 or the like).

PTL 1 discloses that a flow of the vapor deposition particles (vapor deposition flow) is controlled by use of regulation plates regulating coming directions of the vapor deposition particles to improve usage efficiency of the vapor deposition material and improve film formation quality such that uniform vapor deposition is performed.

In a vapor deposition device disclosed in PTL 1, a target film forming substrate to be subjected to vapor deposition and a vapor deposition source are located within a vacuum chamber, and the vapor deposition particles discharged from the vapor deposition source are made to deposit on the target film forming substrate to form a vapor deposition film, not illustrated, on the target film forming substrate.

The vapor deposition source disclosed in PTL 1 includes three layered frame structures. A heating coil is wound around these frame structures.

The bottom frame structure is a heating portion (vapor deposition particles generation portion) which accommodates and heats the vapor deposition material to generate the vapor deposition particles. Each of the other two frame structures is a vapor deposition flow regulating layer (vapor deposition flow controller) which regulates directions of the vapor deposition particles from the bottom frame structure as the heating portion toward the target film forming substrate.

In the above two frame structures used as the vapor deposition flow regulating layer, there are formed multiple nozzle-like passing zones (vapor deposition nozzle, emitting port) sectioned by the regulation plates which are provided along the directions from the bottom frame structure used as the heating portion toward the target film forming substrate.

With this configuration, the scattering directions of the vapor deposition particles discharged from the heating portion via the respective passing zones are regulated to a direction along lateral surfaces of the respective regulation plates in the passing zones.

CITATION LIST

Patent Literature

PTL 1: JP 2004-137583 A (published on May 13, 2004)

SUMMARY

Technical Problem

PTL 1 regulates the vapor deposition particles flying in an X-axis direction that is an array direction of the regulation plates. However, in the vapor deposition device disclosed in PTL 1, since a pressure in the passing zone is high and a pressure in the vacuum chamber is low, a pressure difference between the pressure in the passing zone and the pressure in the vacuum chamber is large.

For this reason, in the vapor deposition device disclosed in PTL 1, the particles scatter at an outlet of the passing zone eventually leads to a large amount of unnecessary vapor deposition particles flying in the X-axis direction that is the array direction of the regulation plates.

As a result, in the configuration disclosed in PTL 1, film thickness distribution of the vapor deposition film in the X-axis direction is broad so that the material usage efficiency is lowered.

Especially, in a case of the scan film formation using the scan vapor deposition technique, preferably, a film thickness distribution restricting member not illustrated and called a restriction plate is arranged over the vapor deposition source, a vapor deposition mask not illustrated is fixedly arranged over the film thickness distribution restricting member, and further, a target film forming substrate 200 is arranged over the vapor deposition mask in order to control the vapor deposition flow.

In the configuration disclosed in PTL 1, in this case, the vapor deposition flow is frequently regulated by the restricting member because the film thickness distribution of the vapor deposition film in the X-axis direction is broad. For this reason, the usage efficiency of the material contributing to the film formation is further lowered.

The disclosure has been made in consideration of the above problems, and an object is to provide a vapor deposition source and vapor deposition device which are higher in the material usage efficiency than the related art, and a vapor deposition film producing method.

Solution to Problem

In order to solve the above problems, a vapor deposition source according to an aspect of the disclosure includes a vapor deposition particles ejecting portion configured to include multistage of vapor deposition nozzle portions layered apart from each other in a vertical direction, each of the vapor deposition nozzle portions including at least one vapor deposition nozzle, and at least one space part provided between each two stages of vapor deposition nozzles among the multiple vapor deposition nozzle portions, and to emit vapor deposition particles via the vapor deposition nozzle; and a vacuum exhaust unit configured to include at least one vacuum pump and be connected with the at least one space part.

In order to solve the above problems, a vapor deposition device according to an aspect of the disclosure is a vapor deposition device for forming a vapor deposition film of a prescribed pattern on a target film forming substrate, wherein the vapor deposition device includes a vapor deposition unit including the vapor deposition source described above.

In order to solve the above problems, a vapor deposition film producing method according to an aspect of the disclosure is a vapor deposition film producing method for forming a vapor deposition film on a target film forming substrate by use of the above-described vapor deposition device, the vapor deposition film producing method including: adjusting a pressure in the space part to be lower than a pressure in the vapor deposition nozzle in the vapor deposition nozzle portion on an upstream side in a vapor deposition particles ejecting direction among the vapor deposition nozzle portions interposing the space part, and higher than a pressure in the vapor deposition nozzle in the vapor deposition nozzle portion on a downstream side in the vapor deposition particles ejecting direction; and emitting the vapor deposition particles from the vapor deposition source under a reduced-pressure atmosphere to deposit the vapor deposition particles on the target film forming substrate.

Advantageous Effects of Invention

According to an aspect of the disclosure, it is possible to provide a vapor deposition source and vapor deposition device which are higher in the material usage efficiency than the related art, and a vapor deposition film producing method.

BRIEF DESCRIPTION OF DRAWINGS

FIG. 13A is a perspective view illustrating a schematic configuration of a vapor deposition source according to Modification 2 in another embodiment of the disclosure, and FIG. 13B is a front view illustrating a schematic configuration of a main part of the vapor deposition source illustrated in FIG. 13A.

DESCRIPTION OF EMBODIMENTS

Hereinafter, a description is given in detail of an example of embodiments according to the disclosure.

Embodiment 1

A description follows regarding an embodiment of the disclosure, with reference to FIGS. 1 to 6.

Figure 1:
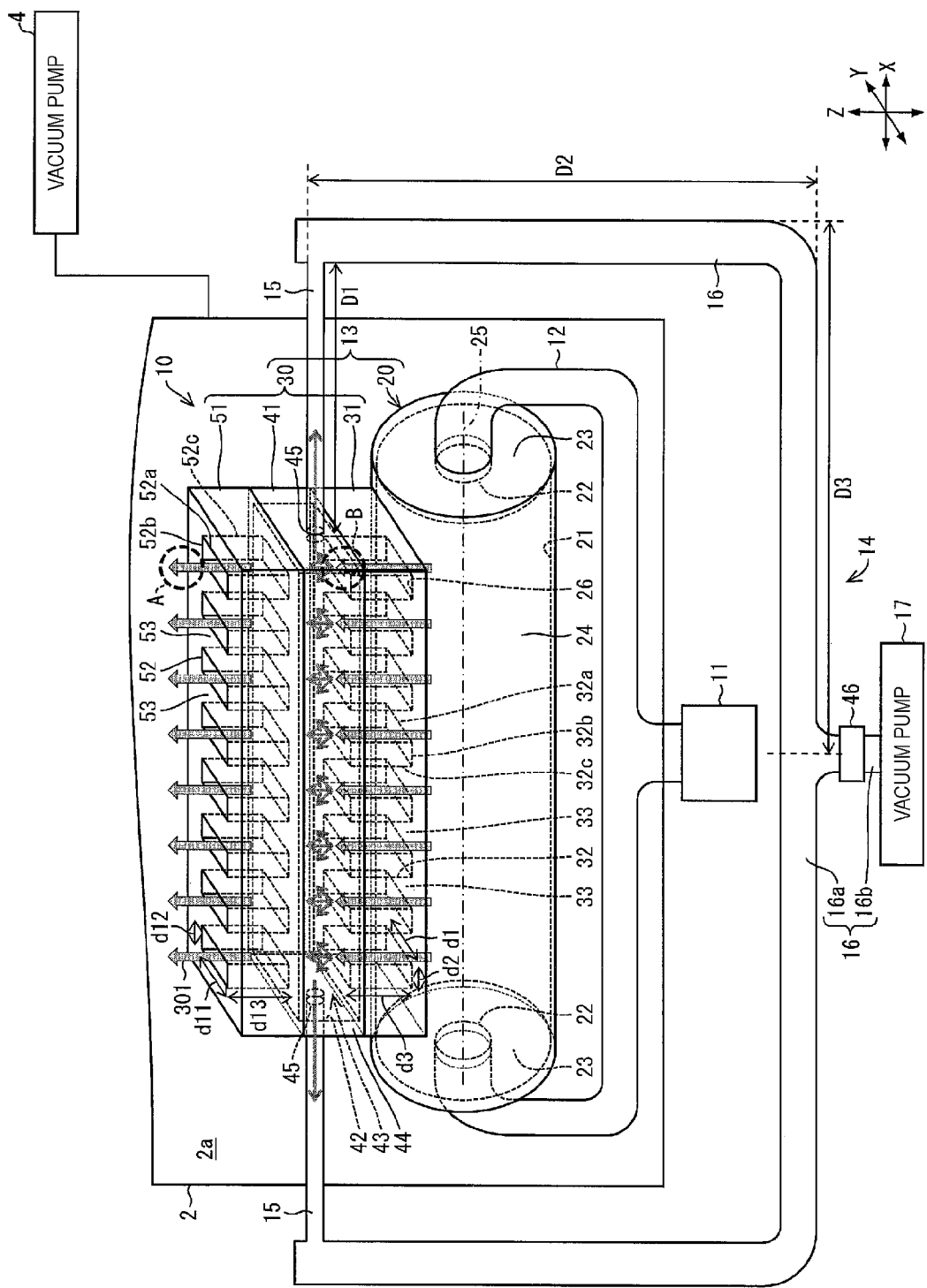
FIG. 1 is a perspective view illustrating a schematic configuration of a vapor deposition source according to Embodiment 1 of the disclosure.
Figure 2:
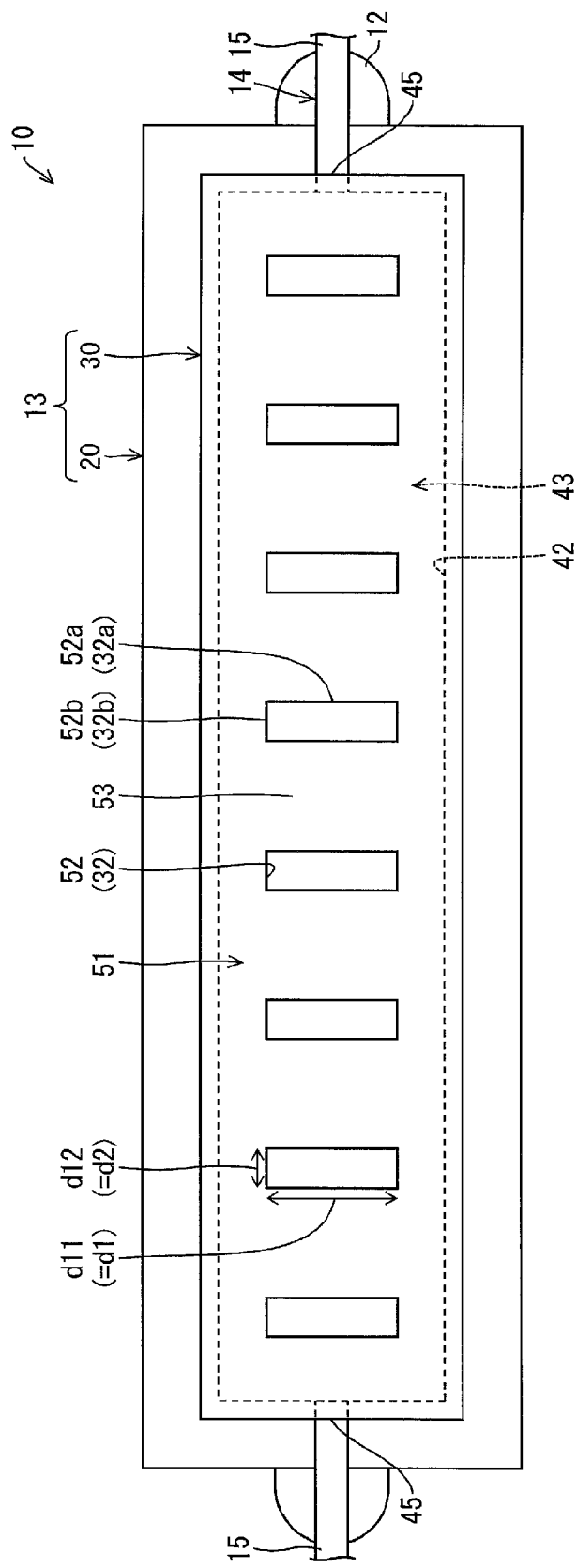
FIG. 2 is a plan view illustrating a schematic configuration of the vapor deposition source illustrated in FIG. 1.
Figure 3:
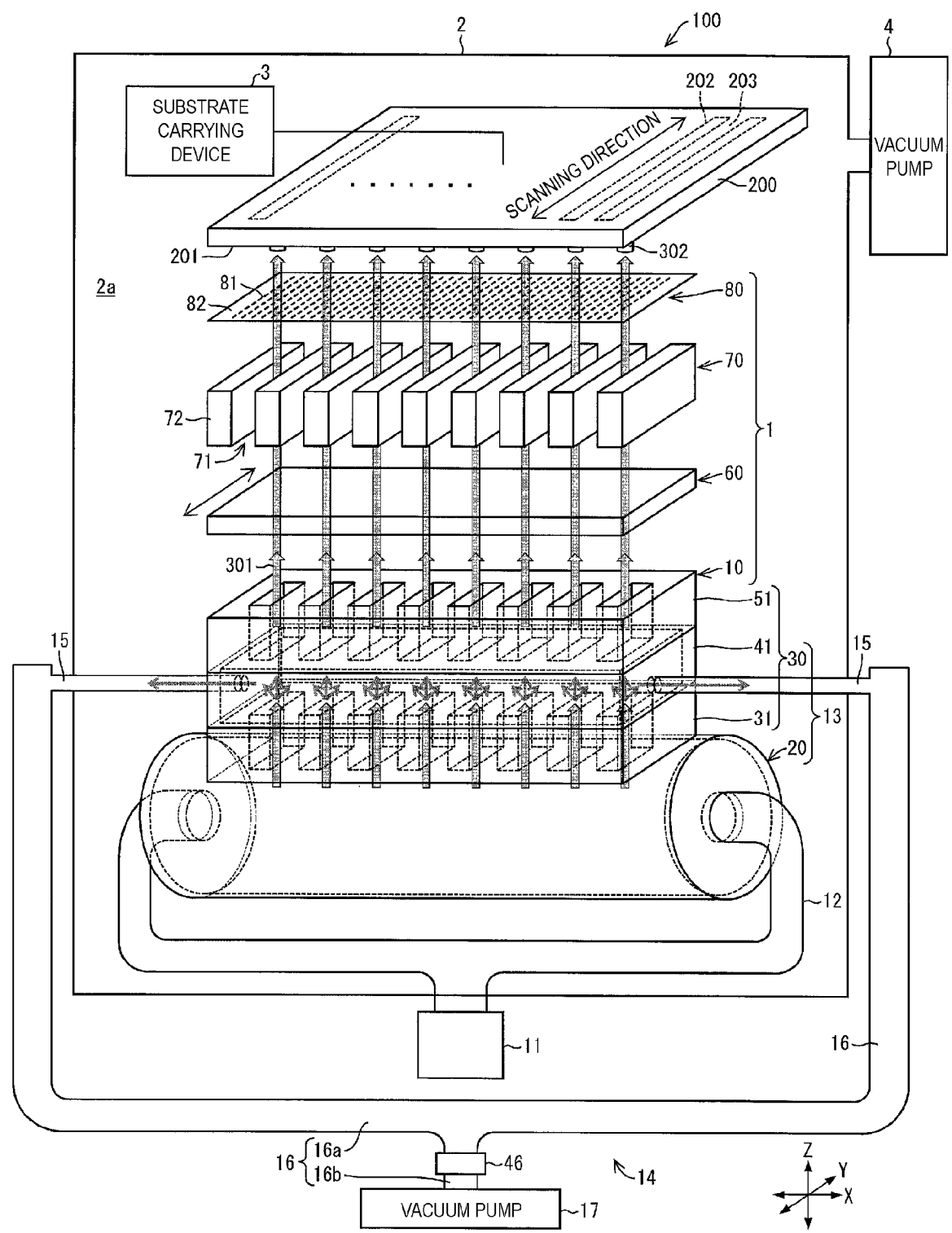
FIG. 3 is a perspective view illustrating a schematic configuration of a main part of a vapor deposition device according to Embodiment 1 of the disclosure.
Figure 4:
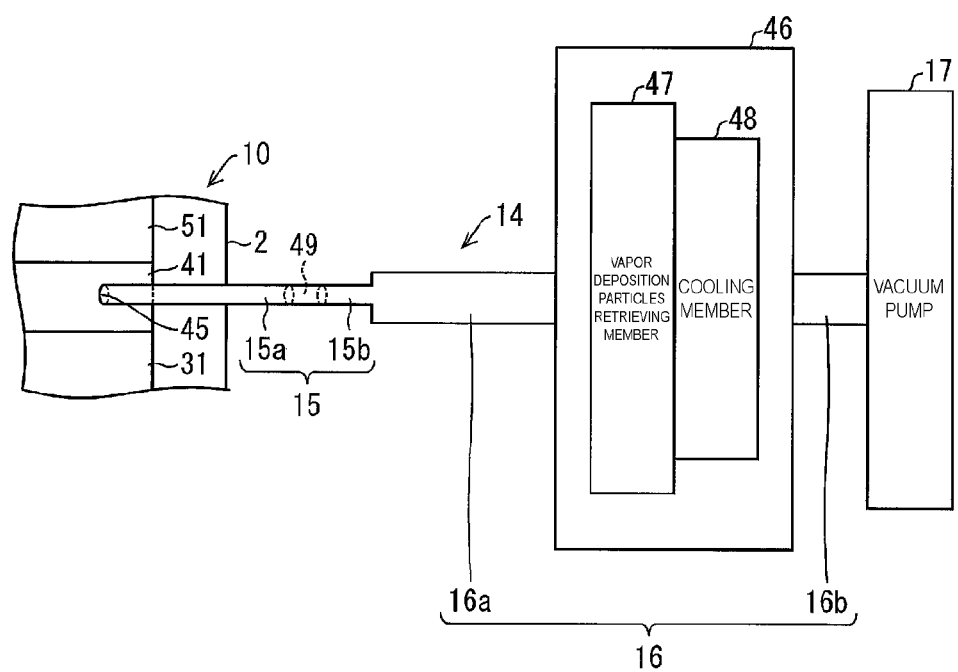
FIG. 4 is a diagram schematically illustrating a schematic configuration of a main part of the vapor deposition source according to Embodiment 1 of the disclosure.

FIG. 1 is a perspective view illustrating a schematic configuration of a vapor deposition source 10 according to the present embodiment. FIG. 2 is a plan view illustrating a schematic configuration of a main part of the vapor deposition source 10 illustrated in FIG. 1. FIG. 3 is a perspective view illustrating a schematic configuration of a main part of a vapor deposition device 100 according to the present embodiment. FIG. 4 is a diagram schematically illustrating a schematic configuration of a main part of the vapor deposition source 10 according to the present embodiment.

FIG. 1 to FIG. 3 illustrate vapor deposition nozzles 32 and 52, restriction plate openings 71, mask openings 81 and the like with some of these being omitted in terms of the number thereof and illustrate a shape of each component in a simplified manner, for the convenience of illustration.

The vapor deposition device 100 (a film formation device) and a vapor deposition film producing method (a film formation method, or a vapor deposition method) according to the present embodiment are advantageous to vapor deposition (film formation) of an EL layer such as a light emitting layer constituting an EL element particularly in an EL display device such as an organic EL display device.

Hereafter, a description is given of a case, as an example, that the vapor deposition device 100 and vapor deposition film producing method according to the present embodiment are applied to producing of the organic EL display device for RGB full color displaying in which organic EL elements for respective red (R), green (G), and blue (B) colors are arrayed as sub pixels on a substrate, for example, and the light emitting layer (organic film) of the organic EL element is formed as a vapor deposition film 302 by a RGB separate coating method.

However, the present embodiment is not limited thereto, and the vapor deposition device 100 and vapor deposition film producing method according to the present embodiment can be applied generally to produce of a device using vapor phase epitaxy technique including produce of the organic EL display device and inorganic EL display device.

In the following description, a description is given assuming that a horizontal direction axis along a substrate carrying direction (scanning direction) of a target film forming substrate 200 is a Y-axis, a horizontal direction axis along a direction perpendicular to the scanning direction of the target film forming substrate 200 is an X-axis, and a normal direction of a target deposition surface 201 of the target film forming substrate 200 that is a vertical direction axis (up-down direction axis) perpendicular to the X-axis and the Y-axis is a Z-axis. Additionally, a description is given assuming that the X-axis direction is a row direction (first direction) and the Y-axis direction is a column direction (second direction), and a side pointed by an upward arrow for the Z-axis is upper (side) unless otherwise specifically referred to for the sake of the description.

Schematic Configuration of Vapor Deposition Device 100

As illustrated in FIG. 3, the vapor deposition device 100 according to the present embodiment includes a vapor deposition unit 1, a vacuum chamber 2, a substrate carrying device 3 (substrate transfer device), a vacuum pump 4 (first vacuum pump, or vacuum exhaust device), and a deposition prevention plate, controller and the like which are not illustrated.

The above vapor deposition unit 1 includes the vapor deposition source 10, a shutter 60, a restriction plate unit 70, a vapor deposition mask 80, and various holding members, not illustrated, holding these vapor deposition source 10, shutter 60, restriction plate unit 70, and vapor deposition mask 80.

As illustrated in FIG. 1 to FIG. 3, the vapor deposition source 10 includes a vapor deposition particles generation unit 11, a pipe 12, a vapor deposition source main body 13, and a vacuum exhaust unit 14. The vacuum exhaust unit 14 includes pipes 15 and 16, a vacuum pump 17 (second vacuum pump, or vacuum exhaust device). Among them, the vapor deposition source main body 13 and a part of pipes 12 and 15 are located within the vacuum chamber 2 together with the substrate carrying device 3, the shutter 60, the restriction plate unit 70, the vapor deposition mask 80, and the various holding members and deposition prevention plate not illustrated.

A part of the pipes 12 and 15, the pipe 16, the vapor deposition particles generation unit 11, the vacuum pumps 4 and 17, and the controller not illustrated are provided outside the vacuum chamber 2.

As illustrated in FIG. 1, FIG. 3, and FIG. 4, a vapor deposition particles retrieving part 46 is preferably provided to a part of the vacuum exhaust path (a vacuum exhaust path on an upstream side of the vacuum pump 17) in the vacuum exhaust unit 14.

As illustrated in FIG. 3, the target film forming substrate 200, the vapor deposition mask 80, the restriction plate unit 70, the shutter 60, and the vapor deposition source 10 are arranged along the Z-axis direction in this order from a side of the target film forming substrate 200, for example, to face each other at a certain distance. Among them, the vapor deposition mask 80, the restriction plate unit 70, and the vapor deposition source 10 are provided with their positional relationship (that is, a positional relationship between the X-axis, the Y-axis, and the Z-axis) being fixed.

Each of the target film forming substrate 200, the vapor deposition mask 80, the restriction plate unit 70, the shutter 60, and the vapor deposition source 10 is held by the holding member not illustrated, as needed. The vapor deposition mask 80, the restriction plate unit 70, the shutter 60, and the vapor deposition source 10 may be held by one identical holding member or by the individual holding members so long as they have the positional relationship described above.

In the following description, a description is given of a case, as an example, that the vapor deposition particles are vapor-deposited upward from underneath (up-deposition) in a state where the vapor deposition source 10 is provided below the target film forming substrate 200 and the target deposition surface 201 of the target film forming substrate 200 is directed downward, and each of the vapor deposition mask 80, the restriction plate unit 70, and the vapor deposition source 10 are fixed by the holding member, or directly to somewhere of an inner wall of the vacuum chamber 2. However, the present embodiment is not limited thereto.

Hereinafter, a description is given in detail of the components described above.

Vacuum Chamber 2

The vacuum chamber 2 is a film formation container having a film formation chamber configured be capable of being sealed and keeping an inside thereof in a reduced pressure state (vacuum state). The vacuum chamber 2 is provided with the vacuum pump 4 which performs evacuation of the inside of the vacuum chamber 2 via an exhaust port, not illustrated, provided to the vacuum chamber 2 in order to keep the inside of the vacuum chamber 2 in the vacuum state (at a prescribed vacuum degree) when vapor-depositing. As described above, the vacuum pump 4 is provided outside the vacuum chamber 2.

The vacuum chamber 2 is preferably kept in a high vacuum state, and the vacuum degree (ultimate vacuum) inside the vacuum chamber 2 (that is, a vacuum chamber space 2a) is preferably $1 \times 10^{-3}$ Pa or higher (in other words, the pressure is preferably $1.0 \times 10^{-3}$ Pa or lower).

In a case where the vacuum degree is $1.0 \times 10^{-3}$ Pa or higher, a necessary and sufficient value of a mean free path of vapor deposition particles 301 can be obtained.

In a case where the vacuum degree of the vacuum chamber space 2a is lower than $1.0 \times 10^{-3}$ Pa, the mean free path of the vapor deposition particles 301 shorts to scatter the vapor deposition particles 301 so that an efficiency of particle arrival to the target film forming substrate 200 may possibly decrease, or collimated components may possibly decrease. As a result, film formation pattern blur may be possibly generated.

For this reason, in the present embodiment, it is assumed that the ultimate vacuum of the vacuum chamber space 2a is $1.0 \times 10^{-3}$ Pa or higher (in other words, the pressure of the vacuum chamber space 2a is $1.0 \times 10^{-3}$ Pa or lower).

Vapor Deposition Source 10

The vapor deposition source 10 heats the vapor deposition material as a film formation material under vacuum to be evaporated or sublimated to emit (discharge) the vapor deposition material such as an organic light emitting material as the vapor deposition particles 301.

As described above, the vapor deposition source 10 according to the present embodiment includes the vapor deposition particles generation unit 11, the pipe 12, the vapor deposition source main body 13, and the vacuum exhaust unit 14.

The vapor deposition particles generation unit 11 is a vapor deposition particles generation portion (vapor deposition particles generation source) which heats the vapor deposition material to generate the vapor deposition particles 301.

The vapor deposition particles generation unit 11 includes a heating container, called a crucible or a boat, which accommodates the vapor deposition material inside thereof, and a heating device (heater) which is provided around the heating container and adjusts and controls a temperature of the heating container to heat the vapor deposition material in the heating container.

The vapor deposition particles generation unit 11 generates gaseous vapor deposition particles 301 (vapor deposition particles gas) by heating the vapor deposition material in the heating container by the heating device to evaporate (in a case where the vapor deposition material is a liquid material) or sublimate (in a case where the vapor deposition material is a solid material) the vapor deposition material to gasify the vapor deposition material. Therefore, the vapor deposition particles generation unit 11 being provided outside the vacuum chamber 2 as described above has an advantage that the vapor deposition material is easy to supplement or exchange.

The pipe 12 is a load lock pipe coupling the vapor deposition particles generation unit 11 with the vapor deposition source main body 13.

The vapor deposition source main body 13 includes a vapor deposition particles diffusion unit 20, and a vapor deposition particles ejecting unit 30.

The vapor deposition particles diffusion unit 20 is a vapor deposition particles diffusion portion including a diffusion space for diffusing the vapor deposition particles 301 to be supplied to the vapor deposition particles ejecting unit 30 in order to uniformly emit the vapor deposition particles 301 from the vapor deposition nozzles 52 which are exposed on the vapor deposition source 10 in the vapor deposition particles ejecting unit 30.

As illustrated in FIG. 1, the vapor deposition particles diffusion unit 20 is formed of a hollow vapor deposition particles diffuse container, and includes therein a vapor deposition particles diffusion room 21 as the diffusion space for diffusing the vapor deposition particles 301 inlet from the vapor deposition particles generation unit 11.

The vapor deposition particles diffusion room 21 preferably has a large space sufficient for the respective vapor deposition nozzles 32 and 52 in the vapor deposition particles ejecting unit 30. This allows the vapor deposition particles 301 to be substantially uniformly emitted from the all vapor deposition nozzles 52. Note that the above vapor deposition nozzles 32 and 52 are described later.

The vapor deposition particles diffusion unit 20 is provided therein (i.e., in the vapor deposition particles diffusion room 21) with vapor deposition particles inlets 22 for inletting the vapor deposition particles 301. The vapor deposition particles inlets 22 are connected with the pipe 12. This allows the vapor deposition material to be supplied (carried) from the vapor deposition particles generation unit 11 through the pipe 12 to the vapor deposition particles diffusion unit 20.

The number and position of the vapor deposition particles inlet 22 are not specifically limited so long as the vapor deposition particles 301 can be uniformly diffused, but is preferably provided at both ends of the vapor deposition particles diffusion unit 20 in the X-axis direction (i.e., on both end surfaces 23 in the X-axis direction), for example.

The vapor deposition particles diffusion unit 20 has a drum-like shape (or a cylindrical shape, that is, a hollow columnar shape), for example.

The vapor deposition particles diffusion unit 20 includes a peripheral surface 24 (i.e., a cylindrical surface parallel to a cylinder axis 25 illustrated by a dashed-dotted line in FIG. 1), a part of which is coupled with the vapor deposition particles ejecting unit 30. This forms the vapor deposition particles diffusion unit 20 and the vapor deposition particles ejecting unit 30 into one body.

A coupled portion on the peripheral surface 24 of the vapor deposition particles diffusion unit 20 with the vapor deposition particles ejecting unit 30 is provided with a delivery port 26 (vapor deposition particles diffusion unit opening) for delivering the vapor deposition particles 301 to the vapor deposition particles ejecting unit 30.

On the other hand, the vapor deposition particles ejecting unit 30 includes multistage of nozzle portions (vapor deposition nozzle portions), and a space part connected with a vacuum exhaust system (vacuum exhaust unit) between the stages of nozzle portions.

The vapor deposition particles ejecting unit 30 illustrated in FIG. 1 to FIG. 3 includes, as the nozzle portions, a first nozzle unit 31 (first vapor deposition nozzle portion) and a second nozzle unit 51 (second vapor deposition nozzle portion). The vapor deposition particles ejecting unit 30 includes a pressure adjusting unit 41 forming a space part 43 as the space part described above between the first nozzle unit 31 and the second nozzle unit 51.

The first nozzle unit 31, the pressure adjusting unit 41, and the second nozzle unit 51 are block-shaped units, and are layered in this order from a side of the vapor deposition particles diffusion unit 20 to be formed into one body.

Each of the first nozzle unit 31 and the second nozzle unit 51 is a plate-like member with a principal surface thereof as an X-Y plane, and has for example, a rectangular shape (oblong shape) in plan view with a long axis thereof as the X-axis direction.

The first nozzle unit 31 is provided with multiple vapor deposition nozzles 32 (nozzle openings, first vapor deposition nozzles; hereafter, referred to as "first-stage nozzles" in some cases) along the X-axis direction at a certain pitch, each vapor deposition nozzle 32 being a nozzle-like opening penetrating in the up-down direction.

Each vapor deposition nozzle 32 has a rectangular shape in plan view with a long axis direction thereof as the Y-axis direction. In other words, each vapor deposition nozzle 32 is shaped into a rectangle in plan view where a long side thereof is a first side 32a parallel to the Y-axis direction and a short side thereof is a second side 32b parallel to the X-axis direction.

The vapor deposition nozzles 32 are arranged in such a manner that the long sides of the vapor deposition nozzles 32 are parallel to the Y-axis and face to each other in plan view. For this reason, multiple regulation plates 33 (non-opening parts) forming a nozzle wall for the vapor deposition nozzles 32 are arrayed as shielding parts along the X-axis direction at a certain pitch between the vapor deposition nozzles 32 which are next to each other in the X-axis direction.

The second nozzle unit 51 is provided with multiple vapor deposition nozzles 52 (nozzle openings, second vapor deposition nozzles; hereafter, referred to as "second-stage nozzles" in some cases) along the X-axis direction at a certain pitch, each vapor deposition nozzle 52 being a nozzle-like opening penetrating in the up-down direction.

Each vapor deposition nozzle 52 has a rectangular shape in plan view with a long axis direction thereof as the Y-axis direction, similar to the vapor deposition nozzle 32. Therefore, each vapor deposition nozzle 52 is shaped into a rectangle in plan view where a long side thereof is a first side 52a parallel to the Y-axis direction and a short side thereof is a second side 52b parallel to the X-axis direction.

The vapor deposition nozzles 52 are arranged in such a manner that the long sides of the vapor deposition nozzles 52 are parallel to the Y-axis and face to each other in plan view. For this reason, multiple regulation plates 53 (non-opening parts) forming a nozzle wall for the vapor deposition nozzles 52 are arrayed as shielding parts along the X-axis direction at a certain pitch between the vapor deposition nozzles 52 which are next to each other in the X-axis direction.

Each vapor deposition nozzle 32 is formed such that a length of the first side 32a parallel to the Y-axis direction (an opening width d1 in the Y-axis direction) is longer than a length of a third side 32c of each vapor deposition nozzle 32 parallel to the Z-axis direction (a depth, a nozzle length d3).

Each vapor deposition nozzle 52 is formed such that, in plan view, a length of the first side 52a parallel to the Y-axis direction (an opening width d11 in the Y-axis direction) is longer than a length of a third side 52c of each vapor deposition nozzle 52 parallel to the Z-axis direction (a depth, a nozzle length d13).

Here, the Y-axis direction indicates the scanning direction of the target film forming substrate 200, in other words, the carrying direction of the target film forming substrate 200. The Z-axis direction indicates an emitting direction of the vapor deposition particles 301 in the vapor deposition particles ejecting unit 30.

In a case of the film formation with the target film forming substrate 200 being carried as described above, a time required for the target film forming substrate 200 to pass an opening region in the vapor deposition particles ejecting unit 30 (i.e., over the vapor deposition nozzles 32 and 52) is preferably as short as possible in order to shorten a tact time. However, an uppermost limit of a film formation rate (vapor deposition rate, film formation speed) in the vapor deposition source 10 is limited. For this reason, in a case of the film formation by carrying the target film forming substrate 200 at a constant speed, the longer the opening widths of the vapor deposition nozzles 32 and 52 in the carrying direction of the target film forming substrate 200 (the opening widths d1 and d11 in the Y-axis direction), the thicker the vapor deposition film 302 can be formed. Therefore, the tact time can be shortened by forming the vapor deposition nozzles 32 and 52 so that the opening widths d1 and d11 in the Y-axis direction of the vapor deposition nozzles 32 and 52 are longer than the nozzle lengths d3 and d13 in the Z-axis direction of the vapor deposition nozzles 32 and 52.

Each delivery port 26 of the vapor deposition particles diffusion unit 20 is coupled with corresponding vapor deposition nozzle 32 in the first nozzle unit 31 arranged at a lowermost stage of the vapor deposition particles ejecting unit 30. The delivery port 26 is coupled with the vapor deposition nozzle 32 by, for example, having a shape the same as the vapor deposition nozzle 32 in plan view to connect an opening edge of the delivery port 26 with an opening edge of the vapor deposition nozzle 32.

The vapor deposition particles diffusion unit 20 is formed to couple with the vapor deposition particles ejecting unit 30 with no gap between the vapor deposition particles diffusion unit 20 and the vapor deposition particles ejecting unit 30.

With this configuration, the vapor deposition particles 301 diffused in the vapor deposition particles diffusion unit 20 is supplied through the delivery ports 26 to the vapor deposition particles ejecting unit 30.

On the other hand, each vapor deposition nozzle 52 in the second nozzle unit 51 arranged at an uppermost stage of the vapor deposition particles ejecting unit 30 is used as an emitting port for emitting the vapor deposition particles 301 out of the vapor deposition source 10.

The delivery port 26, the corresponding vapor deposition nozzle 32, and the corresponding vapor deposition nozzle 52 have the same shape in plan view, and are provided to overlap each other such that central axes (opening centers) thereof coincide with each other. FIG. 2 illustrates that the vapor deposition nozzles 32 and the vapor deposition nozzles 52 fully overlap each other in plan view.

The pressure adjusting unit 41 is a frame-like block shaped member, and includes a space forming opening section 42 forming the space part 43 for coupling the vapor deposition nozzles 32 with the vapor deposition nozzles 52.

The space part 43 is connected, via the emitting port as an outlet of the vapor deposition particles ejecting unit 30 (the vapor deposition nozzles 52 in the present embodiment), to the space part (hereinafter, referred to as the "vacuum chamber space") 2a in the vacuum chamber 2 to form a partially-opened closed space.

The space part 43 is configured to include a bottom wall and a top wall formed by the first nozzle unit 31 and the second nozzle unit 51, respectively, and be surrounded by a sidewall 44 of the pressure adjusting unit 41 in four directions.

On a part of the sidewall 44 that is an outer wall of the pressure adjusting unit 41, openings 45 are formed as exhaust ports (ventilation holes). The openings 45 serve as a pressure adjusting portion to make a pressure in the space part 43 escape.

The openings 45 are preferably provided so that an internal pressure in the space part 43 is constant. Therefore, at least one opening 45 may be provided, but at least one pair of openings is preferably provided, specifically, arranged on both end sides in the X-axis direction of the sidewall 44 of the pressure adjusting unit 41 (on short side sidewall surfaces) to face each other with a central point of the pressure adjusting unit 41 (i.e., a central point of the space part 43) being interposed therebetween.

Accordingly, in the present embodiment, one opening 45 is provided on each of right and left sides of the sidewall 44 of the pressure adjusting unit 41 (i.e., on each of both end sides in the X-axis direction) in FIG. 1 to FIG. 3 such that the pressure is substantially uniform in the space part 43. Several openings 45 may be provided on the periphery at a center of a height of the space part 43 so long as the pressure in the space part 43 is uniform in such a configuration.

The openings 45 may be provided at a part of the sidewall 44 of the pressure adjusting unit 41, but in a case where the openings 45 are too large, the vapor deposition particles 301 discharged from the vapor deposition nozzles 52 decrease. For this reason, a total opening area of the openings 45, that is, a sum of opening areas of the respective the openings 45, is desirably sufficiently small relative to an opening area of the vapor deposition nozzle 52 in the second nozzle unit 51 at the uppermost stage, specifically, is preferably equal to or less than 1/10 of the opening area of each vapor deposition nozzle 52 (in other words, the opening area of one vapor deposition nozzle 52), the nozzle unit 51 being a nozzle unit at a stage subsequent to the space part 43 (at an upper stage, that is, on a downstream side in the vapor deposition particles ejecting direction among two nozzle units interposing the space part 43).

The openings 45 are connected via the pipes 15 and 16 to the vacuum pump 17. To be more specific, the openings 45 are connected with the vacuum exhaust unit 14. The vacuum exhaust units 14 connected with the openings 45 preferably have the same condition so that the internal pressure in the space part 43 is constant.

Therefore, the pipes 15 and 16 connected with the openings 45 are configured, in order to be vacuumized at a uniform pressure, such that pipe diameters of the respective pipes 15 are identical, and pipe lengths of the respective pipes 15 are also identical. Moreover, pipe diameters of the respective pipes 16 connected with the respective pipes 15 are configured to be identical, and pipe lengths of the respective pipes 16 are also configured to be identical. In the present embodiment, in order to make the configuration of the vacuum exhaust unit 14 from the vapor deposition particles ejecting unit 30 until the vacuum pump 17 be right and left symmetric with respect to the vapor deposition particles ejecting unit 30, the right and left pipes 15 and 16 including curved portions of the pipes 16 of the vapor deposition particles ejecting unit 30 are configured to be the same shapes and sizes.

A length D1 of each pipe 15 connected with each opening 45 (i.e., a distance of the vacuum exhaust path between the opening 45 and the pipe 16) is not specifically limited, but in a case where the length D1 of each pipe 15 is too long, a vacuuming efficiency decreases. Therefore, the length D1 of each pipe 15 is preferably within 1 m. An inside diameter of each pipe 15 (pipe diameter) is the same as an opening diameter of the opening 45.

In FIG. 1, the length of the pipe 16 expressed by the length D2+the length D3, that is, a length of a part of the vacuum exhaust path from a connecting part in the pipe 16 with the pipe 15 to the vacuum pump 17, is not specifically limited, but in a case where the length D2+D3 of the pipe 16 is too long, the vacuuming efficiency decreases. Even in a case where the length D2+D3 of the pipe 16 is longer than the length D1 of the pipe 15, there is no problem, because an inside diameter of the pipe 16 is larger than the inside diameter of the pipe 15. Therefore, the length D2+D3 of the pipe 16 is preferably within 5 m, for example.

In the present embodiment, the vacuum exhaust unit 14 adjusts (controls) the pressure in the space part 43 which is provided between the vapor deposition nozzles 32 and the vapor deposition nozzles 52 to be higher than the pressure in the vacuum chamber space 2a and lower than a pressure in the vapor deposition particles generation unit 11 or a pressure in the vapor deposition particles diffusion unit 20.

The vapor deposition source 10 desirably emits the vapor deposition particles 301 gasified by the vapor deposition particles generation unit 11 to outside as a gas, and in order to prevent the vapor deposition material from adhering to or being jammed into the path, is heated to a temperature equal to or higher than a temperature at which the vapor deposition material gasifies (sublimation temperature or evaporate temperature), specifically, the entire vapor deposition source 10 is desirably heated to a temperature 50□ or more higher than the temperature at which the vapor deposition material gasifies.

Therefore, it is desirable in the vapor deposition source 10 that not only the vapor deposition particles generation unit 11 but also the pipes 12, 15, and 16 and the vapor deposition source main body 13 are heated to a temperature equal to or higher than the temperature at which the vapor deposition material gasifies (e.g., a temperature equal to or higher than a temperature of the heating container referred to as the crucible or boat in the vapor deposition particles generation unit 11).

Then, each of the pipes 12, 15, and 16 and the vapor deposition source main body 13 is provided with a heating body (heater) such as an induction coil, not illustrated, for adjusting and controlling the temperature of these pipe 12 and units of vapor deposition source main body 13, specifically, the pipe 12, the vapor deposition particles diffusion unit 20, and the first nozzle unit 31, and the pressure adjusting unit 41, and the second nozzle unit 51 in the vapor deposition particles ejecting unit 30.

The heating body may be provided around each of these pipes 12, 15, and 16, vapor deposition particles diffusion unit 20, first nozzle unit 31, pressure adjusting unit 41, and second nozzle unit 51, or may be provided inside. In the former case, the heating body may be wound or the like around each of these pipes 12, 15, and 16, vapor deposition particles diffusion unit 20, first nozzle unit 31, pressure adjusting unit 41, and second nozzle unit 51, for example. In the latter case, a wall of each of these pipes 12, 15, and 16, vapor deposition particles diffusion unit 20, first nozzle unit 31, pressure adjusting unit 41, and second nozzle unit 51 may be made to be hollow or the like to embed the heating body in the wall or the like, for example.

The temperature of the heating container (e.g., the crucible) in the vapor deposition particles generation unit 11 is preferably a temperature at which the vapor deposition material can be gasified, for example, in a range of 200 to 400□, and preferably in a range of 250□ to 270□ in a case where the vapor deposition material is aluminum quinolinol complex ($Alq_3$), for example.

The temperatures of the pipes 12, 15, and 16, vapor deposition particles diffusion unit 20, first nozzle unit 31, pressure adjusting unit 41, and second nozzle unit 51, specifically, the temperatures of the pipes 12, 15, and 16, vapor deposition particles diffusion room 21, vapor deposition nozzles 32 and 52, and space part 43 are all preferably heated to a temperature sufficiently higher than the temperature at which the vapor deposition material gasifies (e.g., 400□) in order to prevent the vapor deposition material from adhering thereto.

Among the vapor deposition particles 301 supplied from the vapor deposition particles diffusion unit 20 to the vapor deposition particles ejecting unit 30, the vapor deposition particles 301 other than the vapor deposition particles 301 discharged to outside from the openings 45 are emitted from the vapor deposition nozzle 32 via the space part 43 through the vapor deposition nozzles 52 and out of the vapor deposition source 10.

The vapor deposition particles ejecting unit 30 improves linearities of the vapor deposition particles 301 through the physical nozzle lengths d3 and d13 of the respective vapor deposition nozzles 32 and 52 in the normal direction (i.e., the Z-axis direction) in the first nozzle unit 31 and the second nozzle unit 51.

At this time, in the present embodiment, as described above, the pressure in the space part 43 provided between the vapor deposition nozzles 32 and the vapor deposition nozzles 52 is controlled to be higher than the pressure in the vacuum chamber space 2a and lower than the pressure of the vapor deposition particles generation unit 11 or vapor deposition particles diffusion unit 20.

For this reason, the pressure in the vapor deposition particles ejecting unit 30 is in a relationship of pressure in the vapor deposition nozzles 32>pressure in the space part 43>pressure in the vapor deposition nozzles 52>pressure in the vacuum chamber space 2a.

Therefore, according to the above vapor deposition source 10, at a last stage in the vapor deposition particles ejecting unit 30 from which the vapor deposition particles 301 are emitted, it is possible to decrease a pressure difference between the pressure in the vapor deposition nozzle 52 as an outlet (emitting port) for the vapor deposition particles 301 toward the outside and the pressure in the vacuum chamber space 2a (i.e., the pressure difference between before and after emitting the vapor deposition particles 301) so that the scattering of the vapor deposition particles 301 at the outlet can be suppressed. As a result, the vapor deposition particles 301 can be efficiently emitted in a desired emitting direction.

The pressure in the space part 43 can be changed by changing the temperature of the space part 43. However, a pressure control range is small only by changing the temperature of the space part 43.

In the present embodiment, as described above, the vapor deposition nozzles 32, the space part 43, and the vapor deposition nozzles 52 have a constant temperature (i.e., the same temperature) by heating and controlling the vapor deposition source 10.

However, in the present embodiment, as described above, the pressure in the space part 43 can directly escape from the openings 45 by connecting the space part 43 via the openings 45 with the vacuum exhaust system. Therefore, according to the present embodiment, the space pressure can be directly and dynamically changed.

Particularly, according to the present embodiment, the space part 43 being connected via the openings 45 with the vacuum exhaust system, as described above, makes it possible to actively control the pressure in the space part 43. This allows the pressure in the space part 43 to be controlled to have a certain pressure even in the case of heightening the film formation rate or the case of changing the shapes of the vapor deposition nozzles 32 and 52.

According to the present embodiment, as described above, the pressure in the space part 43 can be made positively close to the pressure in the chamber space 2a by controlling the pressure in the space part 43. As a result, according to the present embodiment, it is possible to decrease a difference between the pressure at an outlet portion of the vapor deposition nozzle 52 for the vapor deposition particles 301 toward the outside (i.e., the outside of the vapor deposition source 10, specifically, the vacuum chamber space 2a as a film formation space) and the pressure in the vacuum chamber space 2a. Therefore, particle scattering of the vapor deposition particles 301 can be efficiently suppressed so that components in the vapor deposition particles 301 contributing to the film formation in a prescribed direction can be increased.

The pressure in the vapor deposition particles diffusion unit 20 is preferably several Pa, the pressure in the space part 43 is preferably from $1\times10^{-1}$ Pa to $1\times10^{-3}$ Pa, and the pressure in the vacuum chamber space 2a is preferably from $1\times10^{-3}$ Pa or lower (where, pressure in the space part 43>pressure in the vacuum chamber space 2a).

In a case where pressure differences are large between outlets and inlets of the respective vapor deposition nozzles 32 and 52, the vapor deposition particles 301 tend to largely scatter. For this reason, the pressure of the outlet and the pressure of the inlet of each vapor deposition nozzle 32 are different from each other preferably in the order of 10 to 1000 times, and the pressure of the outlet and the pressure of the inlet of each vapor deposition nozzle 52 are different from each other preferably in the order of 10 to 100 times.

In the vapor deposition device 100, as described above, since the space part 43 is connected via the openings 45 with the vacuum exhaust system, some of the vapor deposition particles 301 are discharged from the openings 45. Therefore, as described above, the vapor deposition particles retrieving part 46 retrieving the vapor deposition particles 301 discharged from the openings 45 is preferably provided to a part of the vacuum exhaust path in the vacuum exhaust unit 14 (i.e., between the openings 45 and the vacuum pump 17) as illustrated in FIG. 1, FIG. 3, and FIG. 4.

The vapor deposition particles retrieving part 46 includes a vapor deposition particles retrieving member 47 and a cooling member 48 cooling the vapor deposition particles retrieving member, for example. Specifically, the vapor deposition particles retrieving member 47 is preferably a cold trap such as a cold plate. Examples of the cooling member 48 include water-cooling member.

The vapor deposition particles 301 discharged from the openings 45 to the outside of the vapor deposition particles ejecting unit are sprayed to the vapor deposition particles retrieving member 47 to decrease in temperature to lower than the temperature at which the particles 301 gasifies, and then, are retrieved by the vapor deposition particles retrieving member 47.

In a case where the vapor deposition particles retrieving member 47 is a cold plate, for example, the vapor deposition particles 301 sprayed to the vapor deposition particles retrieving member 47 adhere, as a solid vapor deposition material, to the cold plate, and are retrieved. The vapor deposition material adhering to the cold plate is rubbed off by mechanical means to be reused.

Preferably provided between the openings 45 and the vacuum pump 17 is a pressure adjusting device (pressure adjusting mechanism) such as a pressure adjusting valve 49, as illustrated in FIG. 4, which adjusts the pressure in the space part 43 by adjusting an opening degree (opening area) of the openings 45.

The pressure adjusting valve 49 being provided between the openings 45 and the vacuum pump 17 makes it possible to easily adjust the pressure in the space part 43 as compared with a case of adjusting the pressure in the space part 43 by only vacuum exhaust performance of the vacuum pump 17.

The pressure adjusting valve 49 is not specifically limited so long as the pressure adjusting valve 49 can adjust the pressure in the space part 43 by adjusting the opening degree of the openings 45, and examples of the pressure adjusting valve 49 include a needle valve.

So long as the pressure adjusting valve 49 is provided between the openings 45 and the vacuum pump 17, the pressure adjusting valve 49 may be provided within the vacuum chamber 2 or outside the vacuum chamber 2 as illustrated in FIG. 4. In a case where the pressure adjusting valve 49 is provided within the vacuum chamber 2, the pressure adjusting valve 49 is preferably an electromagnetic valve in order to keep the vacuum chamber 2 in a reduced-pressure atmosphere (vacuum state).

The respective openings 45 desirably have the same mechanism so that the internal pressure in the space part 43 is constant. Therefore, in a case where the pressure adjusting valve 49 is provided between the openings 45 and the vacuum pump 17 as described above, the pressure adjusting valve 49 is desirably provided to each opening 45 and the same type of pressure adjusting valve 49 is preferably provided to each opening 45.

FIG. 4 illustrates, as an example, the case that the pressure adjusting valve 49 is provided to the pipe 15 (specifically, to a part of the pipe 15, that is, between a pipe 15*a* and a pipe 15*b*). However, the present embodiment is not limited thereto, and the pressure adjusting valve 49 may be provided to the pipe 16.

By providing the pressure adjusting valve 49 between the openings 45 and the vacuum pump 17 as described above, the film formation rate can be adjusted and the vapor deposition particles 301 can be prevented from excessively being emitted (discharged) from the openings 45. In the case where the pressure adjusting valve 49 is provided between the openings 45 and the vacuum pump 17, the pressure adjusting valve 49 is closed to check the film formation rate in advance, and next, the pressure adjusting valve 49 is opened in such a manner that the film formation rate is not excessively decreased, and the film formation rate is adjusted in accordance with the film thickness distribution while vacuuming is performed by the vacuum pump 17. The film formation rate decrease is preferably kept to 30% or less.

FIG. 1 and FIG. 3 illustrate, as an example, the case that the pressure adjusting valve 49 is provided to the pipe 16 (specifically, to a part of the pipe 16, that is, between a pipe 16*a* and a pipe 16*b*), and the pipes 16 coupled with the pipes 15 are formed into one body to provide the vapor deposition particles retrieving part 46 before the pipes 16 are connected to the vacuum pump 17. This makes it possible to easily retrieve the vapor deposition particles 301 discharged from the openings 45 to the outside of the vapor deposition particles ejecting unit 30, for example, at the outside of the vacuum chamber 2.

However, the present embodiment is not limited thereto, and the pressure adjusting valve 49 may be provided to a part of each pipe 15 connected with the opening 45. The pressure adjusting valve 49 may be provided to a part of each pipe 16 before the pipes 16 coupled with pipes 15 are formed into one body.

The vapor deposition particles retrieving part 46 may be provided to a part of each pipe 16 or a part of each pipe 15 before the pipes 16 coupled with pipes 15 are formed into one body.

FIGS. 1, 3, and 4 illustrate the case, as an example, that the pipe 15 is connected with the pipe 16 having the pipe diameter larger than the pipe 15 and the pipe 16 is connected to the vacuum pump 17. However, the present embodiment is not limited thereto, and the pipes 15 connected with the openings 45 may be connected to the vacuum pump 17 without via the pipes 16, for example.

FIG. 1 and FIG. 3 illustrate the case as an example that the pipes 16 coupled with pipes 15 are formed into one body to be connected to the vacuum pump 17, as described above, but the present embodiment is not limited thereto.

FIG. 4 illustrates the vacuum exhaust path from one opening 45 of the openings 45 and 45 provided to the pressure adjusting unit 41 until the vacuum pump 17, but the pipes 16 are not necessarily formed into one body as illustrated in FIG. 1 and FIG. 2, the vapor deposition source 10 may include multiple vacuum exhaust paths as illustrated in FIG. 4 (i.e., the same number of vacuum exhaust paths as the openings 45). In other words, the openings 45 illustrated in FIG. 1 and FIG. 3 may be provided with vacuum exhaust units 14 different from each other to perform evacuation of the space part 43 through the vacuum exhaust paths independent from each other by multiple vacuum pumps 17 independent from each other.

In this case, the vacuum exhaust units 14 connected with the respective openings 45 preferably have the same condition so that the internal pressure in the space part 43 is constant. Therefore, in order for the pipes 15 and 16 connected with the openings 45 to be vacuumized at a uniform pressure, it is desirable that the pipe diameters of the respective pipes 15 are configured to be identical and the pipe lengths thereof are configured to be identical, the pipe diameters of the respective pipes 16 connected with the respective pipes 15 are configured to be identical and the pipe lengths thereof are configured to be identical, and kinds of the vacuum pumps 17 connected with the respective pipes 16 are identical and configuration conditions thereof are identical.

However, as illustrated in FIG. 1 and FIG. 3, the pipes 16 are formed into one body to connect the respective openings 45 to the shared vacuum exhaust system (i.e., connect to the shared vacuum pump 17) such that other vacuum exhaust systems than the vacuum exhaust system performing evacuation of the vacuum chamber 2 can be integrated. As a result, a device configuration can be simplified, and the pipe can be prevented from being complexed.

In the present embodiment, as described above, the openings 45 are connected with the vacuum pump 17 other than the vacuum pump 4 through the pipes 15 and 16 which are as other vacuum exhaust system than the vacuum exhaust system connected with the vacuum chamber space 2*a*.

However, the present embodiment is not limited thereto, the openings 45 may be connected with the vacuum pump 4 connected to the vacuum chamber 2, instead of the vacuum pump 17. To be more specific, the vacuum exhaust system performing evacuation of the space part 43 may be the same as the vacuum exhaust system for the vacuum chamber 2, or may be provided with another system.

In the case where the openings 45 are connected with the vacuum pump 17 other than the vacuum pump 4 connected to the vacuum chamber 2, a vacuum pump having an exhaust capacity (vacuum exhaust capacity) smaller than the vacuum pump 4 can be used for the vacuum pump 17, for example, to adjust (control) the pressure in the space part 43 not to decrease to the pressure of the vacuum chamber space 2*a* or lower.

On the other hand, in the case where the openings 45 are connected with the vacuum pump 4 connected to the vacuum chamber 2, the pipe connecting the vacuum pump 4 and the vacuum chamber 2 can be branched, for example, to connect the openings 45 with the vacuum pump 4. In this case, for example, an inside diameter of the pipe connecting the vacuum pump 4 and the opening 45 can be made smaller than an inside diameter of the pipe connecting the vacuum pump 4 and the vacuum chamber 2, or the pressure adjusting device such as the pressure adjusting valve 49 can be provided to the pipe connecting the vacuum pump 4 and the vacuum chamber 2, to adjust (control) the pressure in the space part 43 not to decrease to the pressure of the vacuum chamber space 2a or lower.

Even in the case where the openings 45 are connected with the vacuum pump 17 other than the vacuum pump 4 connected to the vacuum chamber 2, a relationship between the inside diameter of the pipe connecting the openings 45 and the vacuum pump 17 and the inside diameter of the pipe connecting the vacuum chamber 2 and the vacuum pump 4 may be adjusted depending on the vacuum exhaust capacities of the vacuum pumps 4 and 17, or the pressure adjusting device such as the pressure adjusting valve 49 may be provided to the pipe connecting the vacuum pump 4 and the vacuum chamber 2, to adjust (control) the pressure in the space part 43 not to decrease to the pressure of the vacuum chamber space 2a or lower.

Although not illustrated, each of the vacuum pumps 4 and 17 preferably includes a vacuum pump for rough pumping and a vacuum pump for main pumping, and switches between the vacuum pump for rough pumping and the vacuum pump for main pumping (i.e., high vacuuming) using a valve such as a three-way valve, such that the vacuum pump for rough pumping is used for rough pumping of the vacuum chamber space 2a and the space part 43, and thereafter, the vacuum pump of main pumping is used for film formation.

Examples of the vacuum pump for rough pumping include a dry pump, and a rotary pump. Examples of the vacuum pump for main pumping include a cryopump, and a turbo pump.

Whether the vacuum chamber 2 and the space part 43 share the vacuum exhaust system or are connected with the different systems, the vacuum pump for main pumping used for film formation is preferably a turbo pump. In the case of using a cryopump, the vapor deposition particles 301 discharged in the vacuum chamber 2 or the vapor deposition particles 301 discharged from the openings 45 are accumulated in the cryopump, which may possibly damage the vacuum pump, and then, the vacuum pump may be required to be restored. In contrast, by use of a turbo pump for the vacuum pump for main pumping, the vapor deposition particles 301 are easy to be retrieved, and there is no pump damage in contrast to the case of using the cryopump for the vacuum pump for main pumping.

Substrate Carrying Device 3

The substrate carrying device 3, which holds the target film forming substrate 200 and includes a motor not illustrated, drives the motor based on signals from a motor drive controller in a controller, not illustrated, to transfer the target film forming substrate 200.

In the present embodiment, as illustrated in FIG. 3, in a state of holding the target film forming substrate 200 with the target deposition surface 201 thereof facing a mask surface of the vapor deposition mask 80, the target film forming substrate 200 is carried (in-line carried) in the Y-axis direction to pass over the vapor deposition mask 80 so that the vapor deposition material is vapor-deposited.

The substrate carrying device 3 is not specifically limited and include various known transfer devices such as a roller type transfer device, and a hydraulic transfer device may be used.

Vapor Deposition Mask 80

The vapor deposition mask 80 is a plate-like object with a mask surface as a principal surface thereof being parallel to the X-Y plane. The present embodiment, as illustrated in FIG. 3, performs the scan vapor deposition with the Y-axis direction being the scanning direction. Therefore, used is the vapor deposition mask 80 having a size smaller at least in the Y-axis direction than the target film forming substrate 200.

The principal surface of the vapor deposition mask 80 is provided with the multiple mask openings 81 (openings). The mask openings 81 are through holes, and serve as a passed part through which the vapor deposition particles 301 (vapor deposition material) are made to pass in vapor deposition. On the other hand, other region than the mask openings 81 on the vapor deposition mask 80 is a non-opening part 82, and serves as a blocking part blocking a flow of the vapor deposition particles 301 in vapor deposition.

Each mask opening 81 is provided to correspond to a part of a pattern of each vapor deposition film 302 to be formed on the target film forming substrate 200. In pattern film formation of the vapor deposition film 302, in a case where the respective colors light emitting layers of the organic EL element are formed by separate coating, as described above, the mask openings 81 are formed to match a size and pitch of each of these light emitting layers in the X-axis direction.

FIG. 3 illustrates, as an example, a case that the multiple slot-shaped mask openings 81 are two-dimensionally arranged. However, the present embodiment is not limited thereto, and numerous mask openings 81 may be formed on the vapor deposition mask 80 to match a prescribed vapor deposition film pattern, and, for example, multiple mask openings 81 having a slit-like shape and extending along Y-axis direction may be arrayed in the X-axis direction.

Using the vapor deposition mask 80 allows only the vapor deposition particles 301 passing through the mask openings 81 to reach the target film forming substrate 200, such that the vapor deposition film 302 having the pattern depending on the mask openings 81 is formed on the target film forming substrate 200. In the present embodiment, the vapor deposition mask 80 described above is used to perform vapor deposition while scanning the target film forming substrate 200 in the Y-axis direction, such that the stripe-like vapor deposition film 302 is formed on the target film forming substrate 200.

In a case where the vapor deposition material is a material for the light emitting layer in the organic EL display device, vapor deposition of the light emitting layer in an organic EL vapor deposition process is performed for each color of the light emitting layer.

A portion in the target film forming substrate 200 where the vapor deposition particles are not desired to adhere is covered by the shutter 60 and the deposition prevention plate, not illustrated, or the like.

Examples of the vapor deposition mask 80 preferably include a metallic mask, but not limited thereto, and a mask made of resin or ceramic, or a mask composed of these materials may be used.

The vapor deposition mask 80 may be used as it is, or may be fixed to a mask frame, not illustrated, in a tensioned state in order to suppress deflection by its own weight. The mask frame is formed to have an outer shape which is the same as the vapor deposition mask 80, or is a rectangular shape slightly larger than the vapor deposition mask 80, in plan view. The phrase "in plan view" represents a view seen in a direction perpendicular to the principal surface of the vapor deposition mask 80 (i.e., a direction parallel to the Z-axis).

Restriction Plate Unit 70

The vapor deposition particles ejecting unit 30 is provided to the vapor deposition source 10 to be formed into one body with the vapor deposition particles generation unit 11 as the vapor deposition particles generation source, and serves as a unit to emit the vapor deposition particles 301 in a prescribed direction, whereas the restriction plate unit 70 is provided apart from the vapor deposition source 10, and serves as a unit to control the flow of the vapor deposition particles 301 discharged from the vapor deposition particles generation unit 11 to change the scattering direction of the vapor deposition particles 301 discharged. Therefore, the restriction plate unit 70 does not specifically have a pressure condition.

The restriction plate unit 70 includes multiple restriction plates 72 which are provided to extend parallel to the Y-axis parallel in plan view, apart from each other in the X-axis direction, and arrayed at the same pitch parallel to each other. These restriction plates 72 are formed of plate-like members having the same dimensions.

Each of the restriction plate openings 71 (through hole) penetrating in the up-down direction is formed between the restriction plates 72 next to each other in the X-axis direction in plan view.

A way to hold the restriction plates 72 is not specifically limited so long as relative positions and posture of the restriction plates 72 can be kept constant. The restriction plate unit 70 includes a holding body part, not illustrated, which holds by coupling the restriction plates 72 with each other, and the restriction plates 72 may be configured to be fixed to the holding body part by screwing, welding, or the like. The restriction plate unit 70, as illustrated in FIG. 3 described later, may be a block-shaped unit in which a single rectangular plate having a principal surface as the X-Y plane in plan view is provided with multiple restriction plate openings 71 at a certain pitch along the X-axis direction, and thereby, the restriction plates 72 are formed between the restriction plate openings 71 next to each other and are arrayed in the X-axis direction at a certain pitch.

FIG. 3 omits to illustrate the holding body part, but the restriction plate unit 70 has an outer shape the size of which is the same as or larger than the vapor deposition mask 80 in plan view.

The pitch of the restriction plate openings 71 is the same as the pitch of the vapor deposition nozzles 52 in the vapor deposition source 10, and the restriction plate openings 71 and the vapor deposition nozzles 52 are arranged in a one-to-one relation.

On the other hand, the pitch of the restriction plate openings 71 is larger than the pitch of the mask openings 81, and the multiple mask openings 81 are arranged between the restriction plates 72 next to each other in the X-axis direction in plan view.

The restriction plate unit 70 restricts a passing angle of each of the vapor deposition particles 301 emitted from the vapor deposition source 10 by partitioning by use of the restriction plates 72 a space between the vapor deposition mask 80 and the vapor deposition source 10 into multiple vapor-deposition spaces formed of the restriction plate openings 71.

The vapor deposition particles 301 emitted from the vapor deposition nozzles 52 pass through the restriction plate openings 71 and the mask openings 81 to reach the target film forming substrate 200.

Since the vapor deposition particles 301 emitted from the vapor deposition nozzles 52 pass through the restriction plate openings 71, an angle of the vapor deposition particles 301 incident on the target film forming substrate 200 is restricted to a certain angle or less.

In a case where the restriction plate unit 70 is used to perform the scan vapor deposition, the vapor deposition particles 301 having an emission angle larger than a diffuse angle of the vapor deposition particles 301 restricted by the restriction plates 72 is blocked (trapped) by the restriction plates 72.

Therefore, the smaller the diffuse angle of the vapor deposition particles 301 incident on the restriction plate unit 70, the greater an amount of the vapor deposition flow passing through the restriction plate openings 71 increases, and the material usage efficiency is improved.

In the vapor deposition source 10 according to the present embodiment, there are arranged multistage of nozzle units including the vapor deposition nozzles such as the vapor deposition nozzles 32 and 52 (e.g., the first nozzle unit 31 and the second nozzle unit 51).

Therefore, directivity of the vapor deposition flow is high, and a ratio of the vapor deposition particles 301 passing through the restriction plate openings 71 increases as compared with the related art. Then, the material usage efficiency of the vapor deposition material improves as compared with the related art.

The vapor deposition film 302 is formed, on the target film forming substrate 200, of only the vapor deposition particles 301 passing through the restriction plate openings 71, and therefore the film thickness distribution of the film formation pattern formed on the target film forming substrate 200 can be improved. Therefore, the vapor deposition film 302 can be formed on the target film forming substrate 200 with high accuracy.

In the present embodiment, the vapor deposition nozzles 32 and 52 and the corresponding restriction plate opening 71 are formed to overlap each other such that opening centers (central axes) thereof coincide with each other in plan view. For this reason, the diffusion of the vapor deposition flow can be suppressed with higher accuracy.

However, as illustrated in FIG. 3, in the present embodiment, the vapor deposition nozzles 32 and 52 and the corresponding restriction plate opening 71 are different from each other in an opening size in plan view.

The size of the restriction plate opening 71 may be adequately configured depending on the size of the target film forming substrate 200 or the film formation pattern to be formed, and is not specifically limited.

The restriction plate unit 70 is not heated to remain at a room temperature or is preferably cooled by a cooling mechanism (heat exchanger), not illustrated, in order to block an angled component of the vapor deposition particles 301. Therefore, the restriction plates 72 are lower in temperature than the vapor deposition nozzles 32 and 52. The cooling mechanism cooling the restriction plates 72 is provided in this way to be able to solidify and trap unnecessary vapor deposition particles 301 not parallel to the Z-axis brought into contact with the restriction plates 72. Therefore, a traveling direction of the vapor deposition particles 301 can be made further closer to the normal direction of the target film forming substrate 200.

The cooling mechanism is not specifically limited, but is desirably a water-cooling type cooling mechanism which circulates coolant water for water-cooling. To be more specific, the restriction plate unit 70 (restriction plates 72) is desirably a water-cooling type restriction plate unit (water-cooling type restriction plates 72).

Shutter 60

The shutter 60 is provided between the vapor deposition mask 80 and the vapor deposition source 10, or between the restriction plate unit 70 and the vapor deposition source 10 in the present embodiment, the shutter 60 determining whether the vapor deposition particles 301 are made to pass toward the target film forming substrate 200 in order to control the vapor deposition particles 301 emitted from the vapor deposition source 10 to reach the vapor deposition mask 80.

The shutter 60 interrupts an emission path of the vapor deposition particles 301 so that the vapor deposition particles 301 do not reach the target film forming substrate 200 when the vapor deposition rate is stabilized or when vapor deposition is not necessary.

The shutter 60 is provided to be able to be extracted and retracted, for example, between the vapor deposition mask 80 and the vapor deposition source 10 by a shutter operating device not illustrated.

The shutter operating device holds the shutter 60, and operates the shutter 60, based on a vapor deposition OFF signal/vapor deposition ON signal from a controller not illustrated.

The shutter operating device operates to adequately insert the shutter 60 between the restriction plate unit 70 and the vapor deposition source 10 as illustrated in FIG. 3, such that vapor deposition on an unintended part (non-target deposition region 203) of the target film forming substrate 200 can be prevented.

Vapor Deposition Film Producing Method

Next, a description is given of a producing method (film formation method) of the vapor deposition film 302 as a vapor deposition method using the vapor deposition source 10.

In the present embodiment, a scan film formation scheme which performs film formation while scanning the target film forming substrate 200 is used as a film formation scheme, in which the vapor deposition source 10 and the target film forming substrate 200 are relatively moved in such a manner that the Y-axis direction is the scanning direction to perform the scan vapor deposition.

To be more specific, in the present embodiment, a substrate carrying film formation scheme is used to perform film formation in which film formation is performed with the target film forming substrate 200 being carried. In other words, in the present embodiment, the vapor deposition device 100 is provided with the shutter 60, the restriction plate unit 70, and the vapor deposition mask 80 between the vapor deposition source 10 and the target film forming substrate 200 as described above, such that the vapor deposition mask 80, the restriction plate unit 70, and the vapor deposition source 10 are fixed to somewhere of the inner wall of the vacuum chamber 2, and the substrate carrying device 3 is used to move the target film forming substrate 200 relative to the vapor deposition mask 80, the restriction plate unit 70, and the vapor deposition source 10 to perform vapor deposition (scan vapor deposition) while scanning the target film forming substrate 200. At this time, the shutter 60 is adequately inserted between the restriction plate unit 70 and the vapor deposition source 10 to prevent the vapor deposition on an unintended part (non-target deposition region 203) of the target film forming substrate 200.

Therefore, in the present embodiment, first, the vapor deposition source 10, the shutter 60, the restriction plate unit 70, the vapor deposition mask 80, and the target film forming substrate 200 are arranged to face each other at a certain distance.

At this time, performed are relative positioning of the vapor deposition mask 80 and the target film forming substrate 200, that is, alignment adjustment, by use of an alignment marker, not illustrated, which is provided to each of the vapor deposition mask 80 and the target film forming substrate 200, and adjustment of a gap between the vapor deposition mask 80 and the target film forming substrate 200 (gap control).

By use of the alignment marker, not illustrated, which is provided to each of the vapor deposition mask 80, the restriction plate unit 70, and the vapor deposition source 10, the vapor deposition mask 80 and the restriction plate unit 70 are arranged to face each other, and relative positioning of the target film forming substrate 200 and the vapor deposition unit 1 is performed such that the central axis (opening center) of each vapor deposition nozzle 52 in the vapor deposition source 10 coincides with the central axis (opening center) of corresponding restriction plate opening 71 of the restriction plate unit 70 (positioning process).

After that, the vacuum pumps 4 and 17 are used to perform evacuation of the vacuum chamber space 2a and the space part 43, and adjust the pressure in the space part 43 to be lower than the pressure in the vapor deposition particles generation unit 11 and higher than the pressure in the vacuum chamber space 2a. This allows the pressure in the space part 43 to be lower than the pressure of the vapor deposition nozzles 42 and higher than the pressure of the vapor deposition nozzles 52. Then, the vapor deposition particles 301 are emitted from the vapor deposition source 10 under the reduced-pressure atmosphere (in the vacuum state) (vapor deposition particles emitting process).

At this time, in a case where the pressure adjusting valve 49 is provided between the openings 45 and the vacuum pump 17, in the vapor deposition particles emitting process, first, the film formation rate is checked by emitting the vapor deposition particles 301 from the vapor deposition source 10 in the state where the pressure adjusting valve 49 is closed (film formation rate check process). After that, the pressure adjusting valve 49 is opened to decrease the pressure in the space part 43 to be lower than the pressure in the vapor deposition nozzles 32 in the first nozzle unit 31 which is a nozzle unit on the upstream side in the vapor deposition particles ejecting direction among the nozzle units interposing the space part 43, and then, the vapor deposition particles 301 are emitted from the vapor deposition source 10 while checking the film thickness distribution of the vapor deposition film 302 formed on the target film forming substrate 200 (e.g., the film thickness distribution of the vapor deposition film 302 formed on the non-target deposition region 203 of the target film forming substrate 200) to adjust the film formation rate (film formation rate adjustment process).

Next, the target film forming substrate 200 is transferred along the scanning direction in plan view (that is, the Y-axis direction which is perpendicular to an arrangement direction of the vapor deposition nozzles 52 and the restriction plate openings 71) to move the target film forming substrate 200 relative to the vapor deposition unit 1, while the vapor deposition particles 301 are deposited on a target deposition region 202 of the target film forming substrate 200 (deposition process).

At this time, in the present embodiment, in the deposition process, while the pressure in the space part 43 escapes from the openings 45 connected with the vacuum exhaust unit 14, the vapor deposition particles 301 (vapor deposition flow) from the vapor deposition nozzles 32 via the space part 43 are finally emitted by the vapor deposition nozzles 52 toward the target film forming substrate 200.

For this reason, in the present embodiment, in the deposition process, the pressure of the space part 43 between the vapor deposition nozzles 32 and the vapor deposition nozzle 52 in the vapor deposition particles ejecting unit 30 is lower than the pressure in the vapor deposition nozzles 32 on the upstream side in the vapor deposition particles ejecting direction with the space part 43 being interposed and higher than the pressure of vapor deposition nozzles 52 on the downstream side in the vapor deposition particles ejecting direction with the space part 43 being interposed. Therefore, the pressure in the vapor deposition particles ejecting unit 30 has a relationship of vapor deposition nozzles 32>space part 43>vapor deposition nozzles 52>vacuum chamber space 2a, and the pressure gradually decreases from the side of the vapor deposition nozzles 32.

In this way, according to the present embodiment, the pressure in the vapor deposition particles ejecting unit 30 can be made gradually closer to the pressure in the vacuum chamber space 2a along the emission path. As a result, it is possible to decrease the pressure difference from the vapor deposition source 10 for the vapor deposition particles 301 in the vicinity of the outlet of the vapor deposition source 10, that is, the pressure difference from the vacuum chamber space 2a in a boundary between the vapor deposition source 10 and the vacuum chamber space 2a, and scattering of the vapor deposition particles 301 at the outlet of the vapor deposition nozzles 52 can be suppressed.

Therefore, according to the present embodiment, the vapor deposition particles 301 wasted by the scattering can be decreased to increase the vapor deposition particles 301 emitted in a prescribed direction. Accordingly, the present embodiment enables the material usage efficiency to be improved as compared to the related art.

As described above, in a case where the vapor deposition particles retrieving part 46 is provided between the openings 45 and the vacuum pump 17, in the deposition process, the vapor deposition particles 301, discharged from the openings 45, not contributing to the film formation of the vapor deposition film 302 on the target film forming substrate 200 are retrieved by the vapor deposition particles retrieving part 46 to be reused.

In the present embodiment, an unnecessary component in the vapor deposition particles 301 emitted from the vapor deposition nozzles 52 is further blocked by the restriction plate unit 70, and the coming direction is made constant. Then, after that, the particles 301 are subjected to pattern film formation regularly on the target film forming substrate 200 through the vapor deposition mask 80 having many mask openings 81. Therefore, the directivity of the vapor deposition particles 301 is high, allowing the highly fine vapor deposition film 302 to be formed.

According to the above method, the scan vapor deposition using the vapor deposition device 100 can decrease the size of the vapor deposition mask 80, allowing the pattern film formation with high accuracy. According to the above method, the pattern film formation on a large-sized target film forming substrate 200 is enabled by using the small vapor deposition mask 80.

Advantageous Effects

Hereinafter, a description is specifically given of advantageous effects of the vapor deposition source 10 according to the present embodiment, using results of measurement of the film thickness distribution. However, dimensions, shapes, vapor deposition materials, and the like of the components of the vapor deposition source 10 used in the measurement below are merely concrete examples, and the scope of the disclosure should not be construed in a limited way based on these illustrated examples.

Film Thickness Distribution

It is commonly known that the film thickness distribution can be estimated using an n value. The n value is a value quantitatively expressing a film formation state intrinsic to the material (flying/diffuse states in the vacuum chamber 2), and a parameter indicating the distribution of the vapor deposition particles 301 emitted from the vapor deposition nozzles (in other words, the directivity of the vapor deposition nozzles). The n value is described below.

Figure 5A:
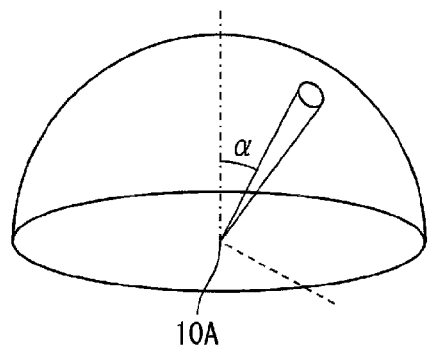
FIGS. 5A to 5C are diagrams for describing deriving an n value.
Figure 5B:
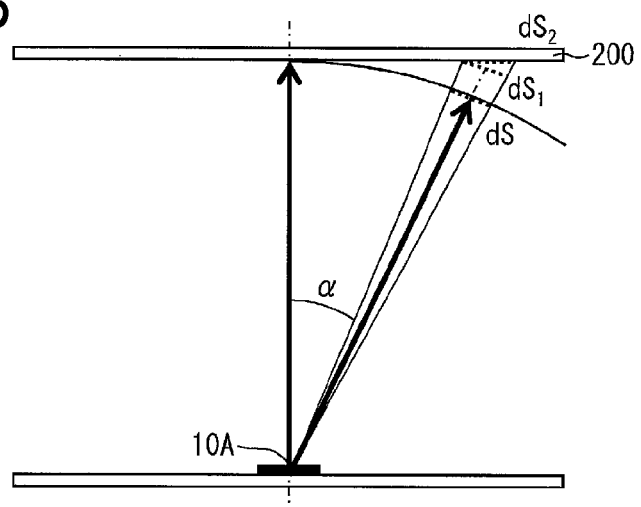
Figure 5C:
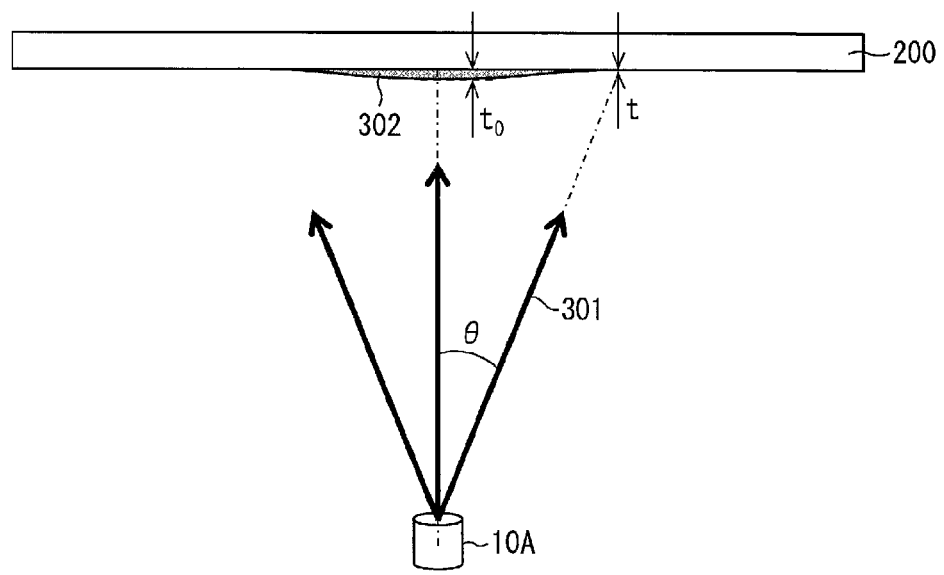

FIGS. 5A to 5C are diagrams for describing deriving the n value.

Assuming a point vapor deposition source (vapor deposition nozzle, hereinafter, referred to as a "vapor deposition nozzle 10A") on a plane as illustrated in FIG. 5A and FIG. 5B, a density distribution $\Phi(\alpha)$ of a vapor deposition flow is expressed, based on Lambert's cosine law, by Equation (1) below.

$$\Phi(\alpha) = \Phi_0 \times \cos \alpha \tag{1}$$

However, the distribution is actually limited because of non-flatness of a vapor deposition surface, or an influence of a nozzle wall of the vapor deposition nozzle 10A, or the like.

In a case where an angle $\alpha$ with respect to a direction directly above the vapor deposition nozzle 10A illustrated in FIG. 5A is not too large and the vapor deposition nozzle 10A is sufficiently small, the density distribution $\Phi(\alpha)$ of the vapor deposition flow from the vapor deposition nozzle 10A can be approximated by Equation (2) below.

$$\Phi(\alpha) = \Phi_0 \times \cos^n \alpha \tag{2}$$

Therefore, for example, assuming that a vapor deposition rate at a position directly above the vapor deposition nozzle 10A is $R_0$, a vapor deposition rate $Rsp(\alpha)$ on a spherical surface having a radius of Lo is expressed by Equation (3) below.

$$Rsp(\alpha) = R_0 \times \cos \alpha \tag{3}$$

In a case where this is replaced with a rate on the target film forming substrate 200 as illustrated in FIG. 5B, the rate is multiplied by an amount of an increase in distance $\cos^2 \alpha$ and an amount of correction to an angle $\cos \alpha$. Therefore, a vapor deposition amount (vapor deposition rate) $R(\alpha)$ per unit area and per unit time at a position on the target film forming substrate 200, which position forms the angle $\alpha$ with the right above direction of the vapor deposition nozzle 10A, is found by Equation (4) below.

$$R(\alpha) = R_0 \times \cos^n \alpha \times \cos^2 \alpha \times \cos \alpha = R_0 \times \cos^{n+3} \alpha \tag{4}$$

Here, performance of the vapor deposition nozzle 10A itself is indicated by the n value. Note that an element of "+3" is expressed in terms of a geometric element.

Therefore, as illustrated in FIG. 5C, assuming that t is a film thickness at a position on the target film forming substrate 200, which position forms an angle $\theta$ with the direction directly above the vapor deposition nozzle 10A and $t_0$ is a film thickness at a position on the target film forming substrate 200 located directly above the vapor deposition nozzle 10A, the n value is derived from Equation (5) below.

$$t/t_0 = \cos^{n+3} \theta \tag{5}$$

As can be seen from the above Equation (5), the thickness of the vapor deposition film 302 vapor-deposited on the target film forming substrate 200 is the largest at the position right above the nozzle as illustrated in FIG. 5C, and gradually decreases as it is farther from the position right above the vapor deposition nozzle 10A. The n value represents the directivity of the vapor deposition nozzle 10A as described above, and therefore, the larger the n value, the higher the directivity. For this reason, it can be said that the larger the n value, the less uniform the film thickness distribution of the vapor deposition film 302 formed of the vapor deposition particles 301 emitted from the vapor deposition nozzle 10A.

Measurement Condition of Film Thickness Distribution

The film thickness distribution was measured in such a way that the vapor deposition source 10 and the target film forming substrate 200 were arranged to face each other, both of which were put in a rest state to perform film formation, and a set film thickness (film thickness of the vapor deposition film 302 at the position right above the vapor deposition nozzle 52) was 200 nm, to optically measure the film thickness of the vapor deposition film 302 formed of the vapor deposition particles 301 emitted from one vapor deposition nozzle 52, at a measurement pitch of every 1 mm using the known ellipsometry. Note that a distance between the vapor deposition source 10 and the target film forming substrate 200 was 200 mm.

Aluminum quinolinol complex ($Alq_3$) that is an organic material was used as the vapor deposition material, and a glass substrate was used as target film forming substrate 200.

The length of each of the first sides 32a and 52a parallel to the Y-axis direction of the vapor deposition nozzles 32 and 52 in the vapor deposition source 10 used for the measurement (each of the opening widths d1 and d11 in the Y-axis direction) was 60 mm. The length of each of the second sides 32b and 52b parallel to the X-axis direction of the vapor deposition nozzles 32 and 52 (each of the opening widths d2 and d12 in the X-axis direction) was 3 mm. Therefore, an opening area of each of the vapor deposition nozzles 32 and 52 was 180 $mm^2$. The length of each of the third sides 32c and 52c parallel to the Z-axis direction of the vapor deposition nozzles 32 and 52 (each of the depths, or the nozzle lengths d3 and d13) was 60 mm.

A height in the Z-axis direction of the space part 43 (i.e., a distance between the vapor deposition nozzles 32 and 52) was 30 mm, a length in the X-axis direction was 180 mm, and a length in the Y-axis direction was 100 mm.

Both the opening diameter of each opening 45 and the inside diameter of each pipe 15 had a diameter ($\Phi$) of 3.2 mm and a sectional area (opening area) of 8.0 $mm^2$. Therefore, a sum of opening areas of two openings 45 (total opening area of the openings 45 (total opening area)) was 16 $mm^2$. From the above, the total opening area of the openings 45 provided to the space part 43 was equal to or less than 1/10 of the opening area of each vapor deposition nozzle 52 (180 $mm^2$) of the second nozzle unit 51, which was the nozzle unit on the downstream side in the vapor deposition particles ejecting direction among the nozzle units interposing the space part 43 (i.e., the nozzle unit at the uppermost stage).

The length D1 of each pipe 15 connected with each opening 45 (i.e., a distance between the opening 45 and the pipe 16) was 0.5 m.

In FIG. 1, the pipe length of the pipe 16 connected with each pipe 15 expressed by D2+D3 was 4 m, and the inside diameter of the pipe 16 had a diameter ($\Phi$) of 30 mm and a sectional area of 707 $mm^2$.

A size of the vapor deposition particles diffusion unit 20 (drum size) was a diameter of 200 mm and the length in the X-axis direction (cylinder axis direction) of 200 mm.

As described above, the pressure in the vapor deposition particles diffusion unit 20 was several Pa, the pressure in the space part 43 was $1 \times 10^{-1}$ Pa to $1 \times 10^{-3}$ Pa, and the pressure in the vacuum chamber space 2a was $1 \times 10^{-3}$ Pa or lower.

The temperature of the heating container (crucible) in the vapor deposition particles generation unit 11 was in a range 250□ to 270□, and the respective vapor deposition nozzles 32 and 52, the space part 43, the vapor deposition particles diffusion room 21, and the pipe 12 were heated to 400□ by the heater to have a temperature sufficiently higher than a temperature at which the vapor deposition material gasifies, so that the vapor deposition material did not adhere to the respective vapor deposition nozzles 32 and 52.

Measurement Result of Film Thickness Distribution

Figure 6:
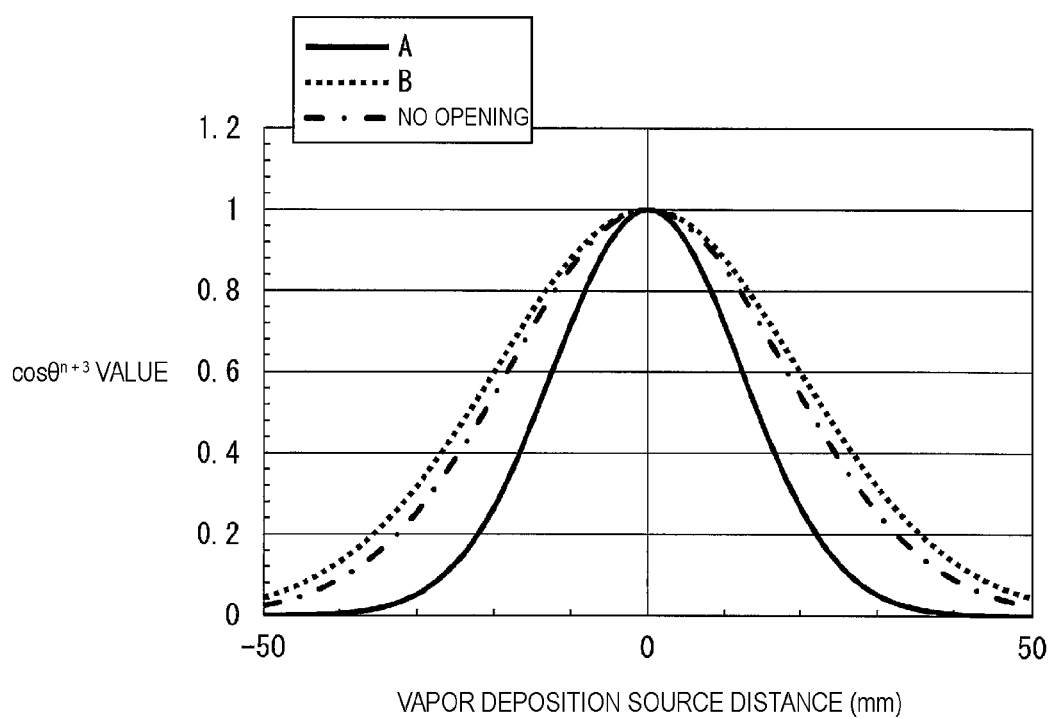
FIG. 6 is a graph illustrating an advantageous effect of the vapor deposition device according to Embodiment 1 of the disclosure.

FIG. 6 is a graph illustrating an advantageous effect of the vapor deposition source 10 according to the present embodiment.

In FIG. 6, a graph represented by a solid line illustrates film thickness distribution performance of one vapor deposition nozzle 52 at a cross section of the target film forming substrate 200 in the X-axis direction (i.e., a relationship between a value of $\cos^{n+3}$ and the vapor deposition source distance) in a case where the vapor deposition film 302 was formed on the target film forming substrate 200 by using the vapor deposition source 10 according to the present embodiment.

In FIG. 6, the $\cos^{n+3}$ value is represented by normalizing the film thickness of each region in the X-axis direction with assumption that a maximum value for the vapor deposition film 302 formed on the target film forming substrate 200 (i.e., the $\cos^{n+3}$ value at a position right above one vapor deposition nozzle 52 or vapor deposition nozzle 32) is 1. The vapor deposition source distance represents a distance, on the target film forming substrate 200, of one vapor deposition nozzle 52 or vapor deposition nozzle 32 in the X-axis direction from a position right above the central axis of the nozzle.

In other words, the graph represented by the solid line is a graph represented by normalizing the film thickness distribution in the X-axis direction of the vapor deposition film 302 formed of the vapor deposition particles 301, indicated by a character A illustrated in FIG. 1, passing through the vapor deposition nozzle 52 (second-stage nozzle) after passing through the vapor deposition nozzle 32 (first-stage nozzle).

In FIG. 6, a graph represented by a dotted line illustrates the film thickness distribution performance of one vapor deposition nozzle 32 at a cross section of the target film forming substrate 200 in the X-axis direction in a case where the vapor deposition source 10 provided with only one stage of the vapor deposition nozzles (specifically, only the vapor deposition nozzle 32) is used to form the vapor deposition film 302 on the target film forming substrate 200. Specifically, the graph represented by the dotted line is a graph represented by normalizing the film thickness distribution in the X-axis direction of the vapor deposition film 302 formed of the vapor deposition particles 301, indicated by a character B in FIG. 1, passing through the vapor deposition nozzle 32 (first-stage nozzle).

In FIG. 6, a graph represented by a dashed-dotted line illustrates the film thickness distribution performance of one vapor deposition nozzle 52 at a cross section of the target film forming substrate 200 in the X-axis direction in a case where the vapor deposition source 10 not provided with the opening 45 in the pressure adjusting unit 41 is used to form the vapor deposition film 302 on the target film forming substrate 200. In other words, the graph represented by the dashed-dotted line is a graph represented by normalizing the film thickness distribution in the X-axis direction of the vapor deposition film 302 formed of the vapor deposition particles 301 passing through the vapor deposition nozzle 52

(second-stage nozzle) after passing through the vapor deposition nozzle 32 (first-stage nozzle) in a case where, as disclosed in PTL 1, the space part 43 between the vapor deposition nozzle 32 (first-stage nozzle) and the vapor deposition nozzle 52 (second-stage nozzle) is closed except for the connecting parts with the vapor deposition nozzles 32 and 52.

In the case of the scan vapor deposition with the Y-axis direction being the scanning direction of the target film forming substrate 200, the vapor deposition film 302 formed of the vapor deposition particles 301 emitted from the vapor deposition nozzle 52 has a stripe-like pattern extending in the Y-axis direction. Therefore, the Y-axis direction is a film formation direction, and therefore the scattering of the vapor deposition particles 301 in the Y-axis direction contribute to the film formation. For this reason, the film thickness distribution in the Y-axis direction, even in a case of broad, does not matter as much as in the film thickness distribution in the X-axis direction.

One the other hand, the X-axis direction is a direction for separate coating of the vapor deposition material. the scattering of the vapor deposition particles 301 in the X-axis direction may cause the film formation to blur or the color to be mixed, or may fly to the vacuum chamber space 2a to lower the material usage efficiency. Therefore, the vapor deposition particles 301 are preferably prevented from diffusing in the X-axis direction as much as possible.

Especially, in the case of the scan film formation using the scan vapor deposition technique as described above, preferably, the restriction plate unit 70 including the restriction plates 72 is arranged over the vapor deposition source 10 and the vapor deposition mask 80 is arranged over the restriction plate unit 70 in order to control the vapor deposition flow, as illustrated in FIG. 3. For this reason, in a case where the film thickness distribution of the vapor deposition film 302 in the X-axis direction is broad, the vapor deposition flow is frequently regulated by these restricting members to further lower the usage efficiency of the material contributing to the film formation.

However, as can be seen from FIG. 6, the film thickness distribution in the X-axis direction becomes sharp by providing multistage of vapor deposition nozzles 32 and 52 to the vapor deposition source 10, providing the openings 45 connected with the vacuum exhaust unit 14 to the sidewalls 44 of the pressure adjusting unit 41 surrounding the space part 43 between the vapor deposition nozzles 32 and 52, and setting the pressure in the space part 43 to be higher than the pressure in the vacuum chamber space 2a and lower than the pressure in the vapor deposition particles generation unit 11 or the vapor deposition particles diffusion unit 20.

The sharper the film thickness distribution, the more the material usage efficiency improves and the less the film thickness distribution, thus, the vapor deposition film 302 as a uniform film can be obtained.

It can be found from a result of comparing the graph represented by the dashed-dotted line and the graph represented by the dotted line in FIG. 6, that, in a case where the opening 45 is not provided, that is, in a case where the space part 43 between the vapor deposition nozzles 32 and 52 is closed except for the connecting parts with the vapor deposition nozzles 32 and 52, the film thickness distribution of the vapor deposition film 302 in the X-axis direction is not much different from the film thickness distribution in the X-axis direction of the vapor deposition film 302 formed of the vapor deposition particles 301 passing through the vapor deposition nozzle 32 (first-stage nozzle).

In other words, in the case where the opening 45 is not provided, and the space part 43 between the vapor deposition nozzles 32 and 52 is closed except for the connecting parts with the vapor deposition nozzles 32 and 52, the space part 43 merely serves as a portion midway through the pipe (nozzle). In the case where the opening 45 is not provided, the closed space part 43 between the first-stage vapor deposition nozzle 32 and the second-stage vapor deposition nozzle 52 causes the vapor deposition particles 301 scattered from the first-stage vapor deposition nozzle 32 to flow in the second-stage vapor deposition nozzle 52. Therefore, in the case where the opening 45 is not provided, the collimation is merely improved to a degree of the increase in the nozzle length, and as a result, only the film thickness distribution which reflects the shape of the last stage vapor deposition nozzle 52 on the downstream in the emitting direction is obtained.

Therefore, in PTL 1, the vapor deposition flow regulating layers including the regulation plates 506 are laminated as the member regulating the coming direction of the vapor deposition particles 301, but a space communicating with the outside is not provided between these vapor deposition flow regulating layers, and therefore the pressure difference is increased between the vacuum chamber space and the nozzle formed by the regulation plate 506 at the outlet for the vapor deposition particles 301 toward the outside, and as a result, the particle scattering occurs. Then, in PTL 1, the components in an oblique direction of the vapor deposition particles increase with respect to the vapor deposition particles ejecting direction, lowering the material usage efficiency.

Accordingly, it can be understood from the result illustrated in FIG. 6 that, by use of the vapor deposition source 10 according to the present embodiment as the vapor deposition source, the scattering of the vapor deposition particles 301 at the outlet of the last stage vapor deposition nozzle 52 can be suppressed, and the material usage efficiency can be improved as compared with the related art, and parallel property (collimation) of the vapor deposition particles 301 can be heightened.

According to the present embodiment, the parallel property of the vapor deposition particles 301 can be heightened, and therefore, it can be found that the directivity of the vapor deposition particles 301 is high, the vapor deposition can be performed with high accuracy, and the highly fine vapor deposition film 302 can be formed.

According to the present embodiment, the space part 43 being connected via the openings 45 with the vacuum exhaust unit 14 makes it possible to actively control the pressure in the space part 43. Therefore, the pressure in the space part 43 can be freely adjusted, and the pressure in the space part 43 can be made closer to the vacuum chamber space 2a as compared with the case that the sidewall 44 is merely provided with the opening. Accordingly, the film thickness distribution can be made sharper as compared with the case that the sidewall 44 is merely provided with the opening.

Embodiment 2

Figure 7:
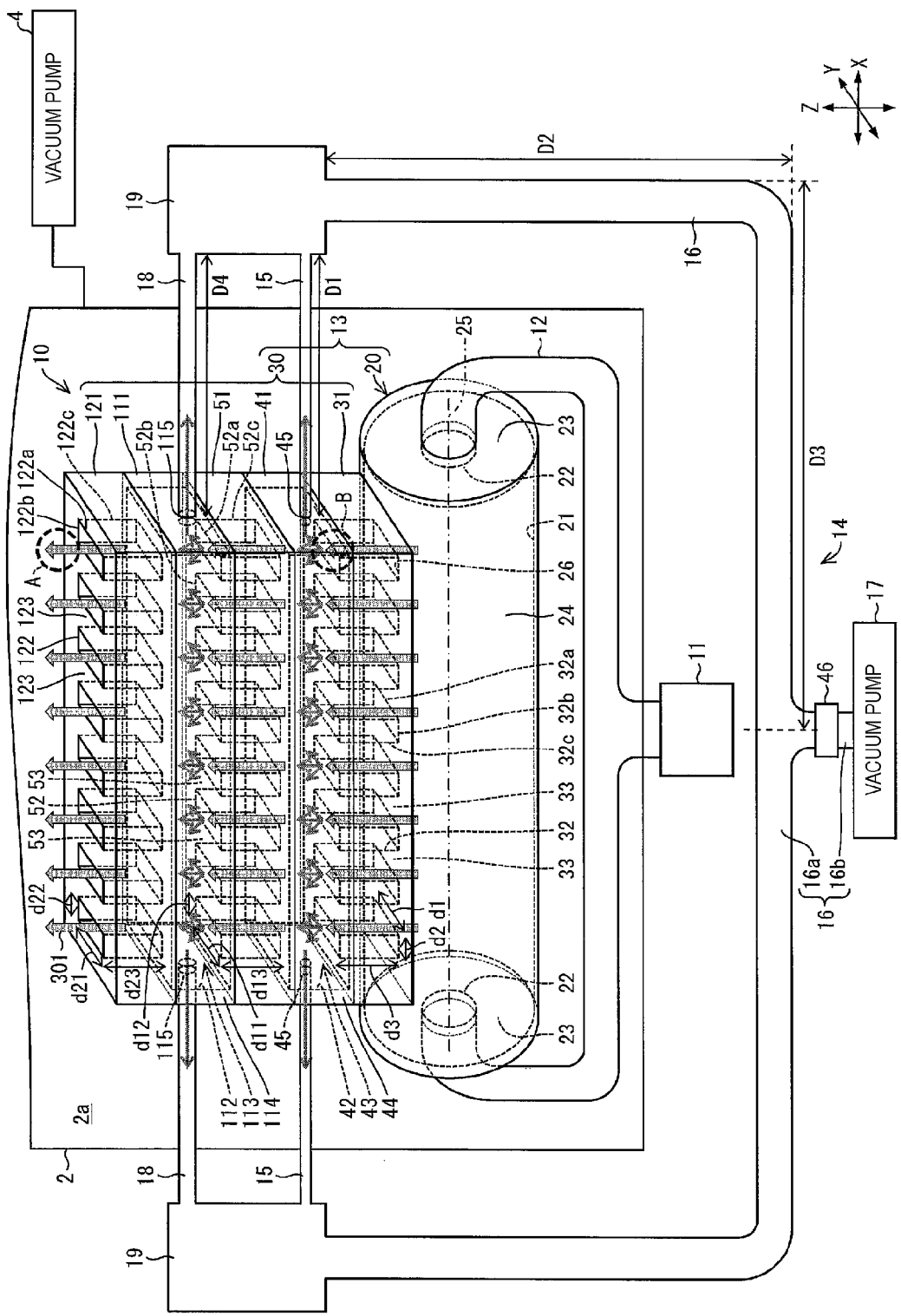
FIG. 7 is a perspective view illustrating a schematic configuration of a vapor deposition source according to Embodiment 2 of the disclosure.
Figure 8:
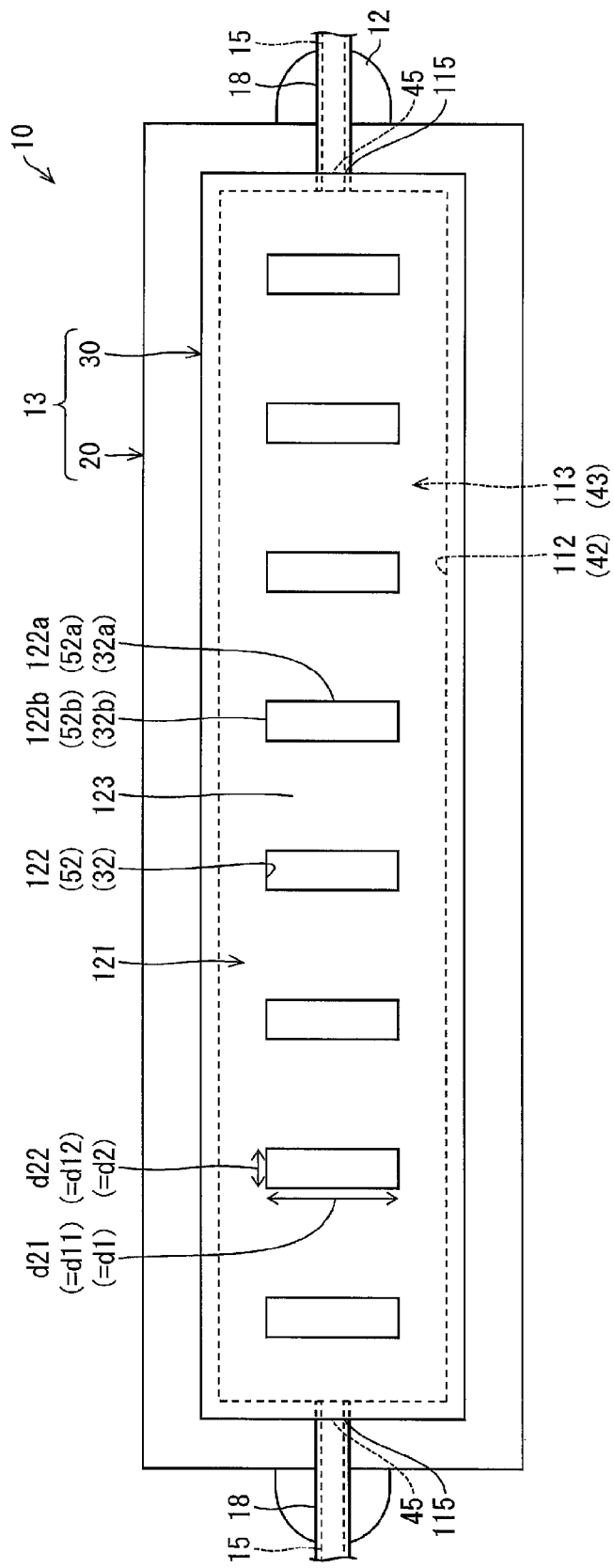
FIG. 8 is a plan view illustrating the schematic configuration of the vapor deposition source illustrated in FIG. 7.
Figure 9:
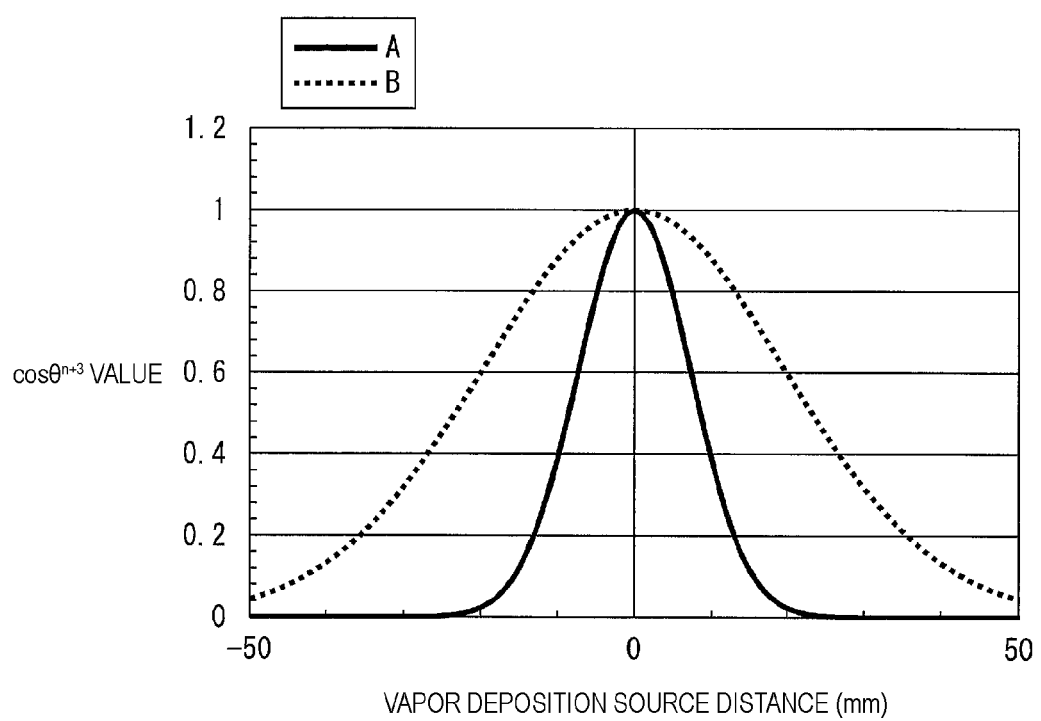
FIG. 9 is a graph illustrating an advantageous effect of the vapor deposition source according to Embodiment 2 of the disclosure.

A description follows regarding another embodiment of the disclosure, mainly with reference to FIGS. 7 to 9. The present embodiment will be described on the differences between the present embodiment and Embodiment 1, and components having the same function as the components used in Embodiment 1 are appended with the same reference numbers, and the description thereof is omitted.

Schematic Configuration of Vapor Deposition Source 10

FIG. 7 is a perspective view illustrating a schematic configuration of the vapor deposition source 10 according to the present embodiment. FIG. 8 is a plan view illustrating the schematic configuration of the vapor deposition source 10 illustrated in FIG. 7. In FIG. 7 and FIG. 8, some of vapor deposition nozzles 32, 52, and 122 are omitted in terms of the number thereof and a shape of each component is simplified, for the convenience of illustration.

The vapor deposition device 100 according to the present embodiment is the same as, for example, the vapor deposition device 100 according to Embodiment 1, except that the vapor deposition particles ejecting unit 30 is configured to include three stages of nozzle units (nozzle portions), two space parts each connected with the vacuum exhaust system (vacuum exhaust unit 14) are provided between the respective stages of nozzle units, and the vacuum exhaust unit 14 includes pipes 15, 16, and 18, vacuum exhaust ports 19 (pipe, vacuum exhaust box), and the vacuum pump 17. Thus, the illustration of the entire vapor deposition device 100 is omitted in the present embodiment.

In the vapor deposition device 100 according to the present embodiment, as illustrated in FIG. 7 and FIG. 8, the vapor deposition particles ejecting unit 30 further includes a third nozzle unit 121 (a third vapor deposition nozzle portion) at an uppermost stage as the nozzle unit, and includes a pressure adjusting unit 111 forming a space part 113 between the second nozzle unit 51 and the third nozzle unit 121.

Therefore, in the vapor deposition particles ejecting unit 30, the vapor deposition nozzles 122 in the third nozzle unit 121 is used, instead of the vapor deposition nozzles 52 in the second nozzle unit 51, as an emitting port for emitting the vapor deposition particles 301 out of the vapor deposition source 10.

The pressure adjusting unit 111 and the third nozzle unit 121 illustrated in FIG. 7 are block-shaped units similar to the first nozzle unit 31, the pressure adjusting unit 41, the second nozzle unit 51, the pressure adjusting unit 111, and the third nozzle unit 121, and the first nozzle unit 31, the pressure adjusting unit 41, the second nozzle unit 51, the pressure adjusting unit 111, and the third nozzle unit 121 are layered in this order from a side of the vapor deposition particles diffusion unit 20 to be formed into one body.

The third nozzle unit 121 has similar configuration to the first nozzle unit 31 and the second nozzle unit 51. Therefore, the third nozzle unit 121 is a plate-like member with a principal surface thereof as the X-Y plane, and has for example, a rectangular shape (oblong shape) in plan view with a long axis thereof as the X-axis direction.

The third nozzle unit 121 is provided with multiple vapor deposition nozzles 122 (nozzle openings, third vapor deposition nozzles; hereafter, referred to as "third-stage nozzles" in some cases) along the X-axis direction at a certain pitch, each vapor deposition nozzle 122 being a nozzle-like opening penetrating in the up-down direction.

Each vapor deposition nozzle 122 has a rectangular shape in plan view with a long axis direction thereof as the Y-axis direction, similar to the vapor deposition nozzles 32 and 52. In other words, each vapor deposition nozzle 122 is shaped into a rectangle in plan view where a long side thereof is a first side 122a parallel to the Y-axis direction and a short side thereof is a second side 122b parallel to the X-axis direction.

Each vapor deposition nozzle 122 is arranged in such a manner that the long sides of the vapor deposition nozzle 122 are parallel to the Y-axis and face to each other in plan view. For this reason, multiple regulation plates 123 (non-opening parts) forming a nozzle wall for the vapor deposition nozzles 122 are arrayed as shielding parts along the X-axis direction at a certain pitch between the vapor deposition nozzles 122 which are next to each other in the X-axis direction.

Each vapor deposition nozzle 122 is formed similar to the vapor deposition nozzles 32 and 52 such that, in plan view, a length of the first side 122a parallel to the Y-axis direction (an opening width d21 in the Y-axis direction) is longer than a length of a third side 122c of each vapor deposition nozzle 122 parallel to the Z-axis direction (a depth, a nozzle length d23). In this way, since the respective vapor deposition nozzles 32, 52, or 122, particularly, the uppermost stage (the last stage) of vapor deposition nozzle 122, has an opening shape elongated in the Y-axis direction in plan view, the tact time can be shortened similar to Embodiment 1, for example.

The delivery port 26, and the corresponding vapor deposition nozzle 32, the corresponding vapor deposition nozzle 52, and the corresponding vapor deposition nozzle 122 have the same shape in plan view, and are provided to overlap each other such that central axes (opening centers) thereof coincide with each other.

The pressure adjusting unit 111 has the same configuration as the pressure adjusting unit 41. The pressure adjusting unit 111 is a frame-like block shape member similar to the pressure adjusting unit 41. The pressure adjusting unit 41 includes a space forming opening section 42 forming the space part 43 for coupling the vapor deposition nozzles 32 with vapor deposition nozzles 52, whereas the pressure adjusting unit 111 includes a space forming opening 112 forming a space part 113 for coupling the vapor deposition nozzles 52 with the vapor deposition nozzles 122.

Size of the space parts 43 and 113 are the same, or the space part 113 which is formed at a position closer to the emitting port for the vapor deposition particles 301 toward the outside is preferably formed lager than the space part 43. In the present embodiment, a space size of the space part 43 is the same as a space size of the space part 113, and the space size of the space part 43 is the same as in Embodiment 1. In the present embodiment, the openings are provided to each of the space parts 43 and 113, and these openings are respectively connected with the vacuum exhaust system (vacuum exhaust unit 14) different from the vacuum exhaust system for the vacuum chamber 2.

The space part 113 is connected, via the emitting port as the outlet of the vapor deposition particles ejecting unit 30 (the vapor deposition nozzle 122 in the present embodiment), with the vacuum chamber space 2a to form a partially-opened closed space, similar to the space part 43.

The space part 113 is configured to have a bottom wall and a top wall as the second nozzle unit 51 and the third nozzle unit 121, and be surrounded by a sidewall 114 of the pressure adjusting unit 111 in four directions.

On a part of the sidewall 114 that is an outer wall of the pressure adjusting unit 111, openings 115 are formed as exhaust ports (ventilation holes). The openings 115 serve as pressure adjusting portions to make a pressure in the space part 113 escape.

The openings 115 are preferably provided so that an internal pressure in the space part 113 is constant similar to the openings 45, and at least one opening may be provided, but at least one pair of the openings is preferably provided.

The openings 115 are preferably arranged on both end sides in the X-axis direction of the sidewall 114 of the pressure adjusting unit 111 (on short side sidewall surfaces) to face each other with a central point of the pressure adjusting unit 111 (i.e., a central point of the space part 113) being interposed therebetween.

Then, in the present embodiment, one opening 45 is provided on each of right and left sides of the sidewall 44 of the pressure adjusting unit 41 (i.e., on each of both end sides in the X-axis direction), and one opening 115 is provided on each of right and left sides of the sidewall 114 of the pressure adjusting unit 111 (i.e., on each of both end sides in the X-axis direction) in FIG. 7 such that the pressure is substantially uniform in each of the space parts 43 and 113. In the present embodiment, several openings 45 may be provided on the periphery at a center of a height of the space part 43 so long as the pressure in the space part 43 is uniform in such a configuration. Similarly, several openings 115 may be provided on the periphery at a center of a height of the space part 113 so long as the pressure in the space part 113 is uniform in such a configuration.

The openings 115 may be provided at a part of the sidewall 114 of the pressure adjusting unit 111, but in a case where the openings 115 are too large, the vapor deposition particles 301 discharged from the vapor deposition nozzle 122 decrease, similar to the openings 45. For this reason, a total opening area of the openings 115 is preferably sufficiently small relative to an opening area of the vapor deposition nozzles 122 in the third nozzle unit 121 at the uppermost stage, specifically, is preferably equal to or less than 1/10 of the opening area of each vapor deposition nozzle 122 (in other words, the opening area of one vapor deposition nozzle 122), the nozzle unit 121 being a nozzle unit at a stage subsequent to the space part 113 (at an upper stage, that is, on a downstream side in the vapor deposition particles ejecting direction among two nozzle units interposing the space part 113).

To be more specific, a total opening area of the openings which are provided to each space part between the nozzle units and connected with the vacuum exhaust system is desirably sufficiently small relative to an opening area of the vapor deposition nozzle in nozzle unit arranged on the stage subsequent to each space part (i.e., on a downstream side in the vapor deposition particles ejecting direction among nozzle units interposing each space part), specifically, is preferably equal to or less than 1/10 of the opening area of the vapor deposition nozzle. Even in a case where multiple space parts are provided as described above, the nozzle units interposing the space part refer to two nozzle units interposing the space part, that is, the nozzle units directly interposing the space part.

In the present embodiment, the space parts 43 and 113 are all connected through the pipes, the opening diameters of the openings 45 and 115 provided respectively to the space parts 43 and 113 are made different and the inside diameters (pipe diameters) of the pipes connected with the openings 45 and 115 are made different, and the openings 45 and 115 are connected with the same vacuum exhaust system.

Each opening 45 is connected through the pipe 15, the vacuum exhaust port 19, and the pipe 16 to the vacuum pump 17. Each opening 115 is connected through the pipe 18, the vacuum exhaust port 19, and the pipe 16 to the vacuum pump 17. An inside diameter of each pipe 15 (pipe diameter) is the same as an opening diameter of the corresponding opening 45. An inside diameter of each pipe 18 (pipe diameter) is the same as an opening diameter of the corresponding opening 115.

In the present embodiment, in FIG. 7, the pipes 15 and 18 which are connected with the openings 45 and 115 provided on the right and left sides of the pressure adjusting units 41 and 111, respectively, are brought together at each of the right and left vacuum exhaust ports 19 which are provided to interpose the vapor deposition particles ejecting unit 30 in the horizontal direction, and then, are connected with the vacuum pump 17 through the pipes 16 connected with the vacuum exhaust ports 19. With this configuration, the pipe 15 linked to the space part 43 and the pipe 18 linked to the space part 113 are mutually vacuumed at a uniform pressure. Therefore, a ratio of vacuuming the space parts 43 and 113 can be easily adjusted by, for example, the sectional areas the pipes 15 and 18.

In the present embodiment, the vacuum exhaust ports 19 have a pipe diameter (sectional area) sufficiently larger than the pipes 15 and 18 connected with the space parts 43 and 113.

In order to make the configuration of the vacuum exhaust unit 14 from the vapor deposition particles ejecting unit 30 to the vacuum pump 17 be right and left symmetric with respect to the vapor deposition particles ejecting unit 30, the right and left pipes 15, 16, and 18 including curved portions of the pipes 16 of the vapor deposition particles ejecting unit 30 and the right and left vacuum exhaust ports 19 have the same shapes and sizes.

In the present embodiment, the length D1 of each pipe 15 (a distance of the vacuum exhaust path between the opening 45 and the vacuum exhaust port 19 in the present embodiment) and a length D4 of each pipe 18 (i.e., a distance of the vacuum exhaust path between the opening 115 and the vacuum exhaust port 19) are not specifically limited as well, but in a case where the lengths D1 and D4 are too long, the vacuuming efficiency decreases. Therefore, each of the lengths D1 and D4 is preferably within 1 m. In the present embodiment, the inside diameter of the pipe 15 (pipe diameter) is the same as the opening diameter of the corresponding opening 45 as well. The inside diameter of the pipe 18 (pipe diameter) is the same as the opening diameter of the opening 115.

In FIG. 7, the length of the pipe 16 expressed by D2+D3 is also not specifically limited, but is preferably within 5 m, for example, as described in Embodiment 1.

In this way, the length D1 of the pipe 15 connected with the opening 45 and the length D4 of the pipe 18 connected with the opening 115 are the same length. In the present embodiment, the configuration is such that the pipe diameters of the respective pipes 15 are identical, and the pipe lengths of the respective pipes 15 are also identical. Moreover, the configuration is such that pipe diameters of the respective pipes 16 connected with the respective vacuum exhaust ports 19 are identical, and the pipe lengths of the respective pipes 16 are also identical.

Therefore, a ratio of vacuuming the pipe 15 and the pipe 18 (i.e., the vacuum exhaust capacity by the pipes 15 and 18) is determined only based on the inside diameters (pipe diameters) of the pipe 15 and the pipe 18.

In the present embodiment, the opening diameter of each opening 115 and the inside diameter (sectional area) of each pipe 18 are configured to be larger than the opening diameter of each opening 45 and the inside diameter (sectional area) of each pipe 15 so that the pressure in the vapor deposition particles ejecting unit 30 decreases gradually as it is farther from the upstream side toward the downstream side in the emitting direction of the vapor deposition particles 301.

In the present embodiment, the opening diameter of each opening 115 and the inside diameter of each pipe 18 are set to about 4 mm, and the opening diameter of each opening 45 and the inside diameter of each pipe 15 are set to about slightly less than 2 mm. Therefore, the vacuum exhaust capacity of each pipe 18 is higher than the vacuum exhaust capacity of each pipe 15, and the vacuum degree of the space part 113 is lower than the vacuum degree of the space part 43.

A ratio of the sectional area of each pipe 18 to the sectional area of each pipe 15 (the sectional area of the pipe 18/the sectional area of the pipe 15), in other words, a ratio of the sectional area of each opening 115 to the sectional area of each opening 45, is preferably in a range from 2 to 20. In the present embodiment, the ratio is 2.6, as an example.

In the film formation of the vapor deposition film 302, the gaseous vapor deposition particles 301 are continuously supplied from the respective vapor deposition nozzles 32, 52, and 122. Therefore, in a case where there is a difference between the vacuum exhaust capacities of the space parts 43 and 113, the pressure difference occurs between the space parts 43 and 113.

In the present embodiment, since the opening diameter of each opening 115 on the space part 113 and the inside diameter of each pipe 18 are larger than the opening diameter of each opening 45 on the space part 43 and the inside diameter of each pipe 15, the following relationship is satisfied: the pressure at the inlet of the vapor deposition nozzle 43>the pressure in the space part 43>the pressure in the space part 113>the pressure at the outlet of the vapor deposition nozzle 122.

To be more specific, the following relationship is satisfied: the pressure in the vapor deposition particles diffusion unit 20 and the pressure in the vapor deposition nozzles 32>the pressure in the space part 43>the pressure in the vapor deposition nozzles 52>the pressure in the space part 113>the pressure in the vapor deposition nozzles 122>the pressure in the vacuum chamber space 2a.

From the above, the pressure in the space part 43 is lower than the pressure in the vapor deposition nozzles 32 on the inlet side for the vapor deposition particles 301 toward the space part 43, and higher than the pressure in the vapor deposition nozzles 52 on the outlet side for the vapor deposition particles 301, and therefore the scattering of the vapor deposition particles 301 at the outlet portion for the vapor deposition particles 301 toward the vapor deposition nozzles 52 can be suppressed.

Further, the pressure in the space part 113 is lower than the pressure in the vapor deposition nozzles 52 on the inlet side for the vapor deposition particles 301, and higher than the pressure in the vapor deposition nozzles 122 on the outlet side for the vapor deposition particles 301, and therefore, the scattering of the vapor deposition particles 301 at the outlet portion for the vapor deposition particles 301 toward the vapor deposition nozzles 122 can be suppressed.

As a result, according to the vapor deposition source 10 described above, the scattering of the vapor deposition particles 301 at the outlet of the vapor deposition nozzles 122 as the final outlet (emitting port) for the vapor deposition particles 301 can be efficiently suppressed, and therefore, the vapor deposition particles 301 wasted by the scattering can be decreased to increase the components in the vapor deposition particles 301 contributing to the film formation in a prescribed direction. This makes it possible to heighten film formation efficiency.

In the present embodiment, it is preferable that the pressure in the vapor deposition particles diffusion unit 20 is several tens of Pa to several Pa, the pressure in the space part 43 is $1 \times 10^{-0}$ Pa to $1 \times 10^{-2}$ Pa, the pressure in the space part 113 is $1 \times 10^{-1}$ Pa to $1 \times 10^{-3}$ Pa, and the pressure in the vacuum chamber space 2a is $1 \times 10^{-3}$ Pa or lower (where, the pressure in the space part 43>the pressure in the space part 113>the pressure in the vacuum chamber space 2a).

In the present embodiment, among the vapor deposition particles 301 supplied from the vapor deposition particles diffusion unit 20 to the vapor deposition particles ejecting unit 30, the vapor deposition particles 301 other than the vapor deposition particles 301 discharged to outside from the openings 45 and 115 are emitted from the vapor deposition nozzles 32 via the space part 43 and incident on the vapor deposition nozzles 52, and then, from the vapor deposition nozzles 52 via the space part 113 through the vapor deposition nozzles 122 and out of the vapor deposition source 10.

The vapor deposition particles ejecting unit 30 improves the linearities of the vapor deposition particles 301 through the physical nozzle lengths d3, d13, and d23 of the respective vapor deposition nozzles 32, 52, and 122 in the normal direction (i.e., the Z-axis direction) in the first nozzle unit 31, the second nozzle unit 51, and the third nozzle unit 121.

The present embodiment describes, as an example, the case that the number of stages of nozzle units is three as illustrated in FIG. 7, but, the closer to the upstream side in the vapor deposition particles ejecting direction, the higher the pressure in the vapor deposition particles ejecting unit 30, the closer to the downstream side in the vapor deposition particles ejecting direction, the lower the pressure in the vapor deposition particles ejecting unit 30, and the more the number of stages of nozzle units, the less the difference between the pressure at the outlet (emitting port) for the vapor deposition particles 301 toward the vacuum chamber space 2a and the pressure in the vacuum chamber space 2a.

Therefore, the closer to the downstream side of the vapor deposition particles emitting port, the less the pressure difference between the outlet and inlet of the vapor deposition nozzles in the second and subsequent stages.

The pressure of the outlet and the pressure of the inlet of each vapor deposition nozzle 32 are different from each other preferably in the order of 10 to 1000 times, and the pressure of the outlet and the pressure of the inlet of each vapor deposition nozzle 52 at the second and subsequent stage, for example, the pressure of the outlet and the pressure of the inlet of each vapor deposition nozzle 52, and the pressure of the outlet and the pressure of the inlet of each vapor deposition nozzle 122, are different from each other preferably in the order of 10 to 100 times.

In the present embodiment, the vacuum pump for main pumping used for film formation is preferably a turbo pump for the same reason as in Embodiment 1.

In the present embodiment, as illustrated in FIG. 7, the vapor deposition particles retrieving part 46 may be provided to a part of the vacuum exhaust path (a vacuum exhaust path on the upstream side of the vacuum pump 17) in the vacuum exhaust unit 14. This makes it possible to easily retrieve the vapor deposition particles 301 discharged from the openings 45 and 115 by the vapor deposition particles retrieving part 46.

FIG. 7 illustrates, as an example, the case that the pipes 16 coupled with the vacuum exhaust ports 19 are formed into one body to provide the vapor deposition particles retrieving part 46 before the pipes 16 are connected to the vacuum pump 17. This makes it possible to easily retrieve the vapor deposition particles 301 discharged from the openings 45 and 115 to the outside of the vapor deposition particles ejecting unit 30, for example, at the outside of the vacuum chamber 2.

However, the present embodiment is not limited thereto, and the vapor deposition particles retrieving part 46 may be provided to a part of pipes 16 or a part of pipes 15 and 18, or in each vacuum exhaust port 19 before the pipes 16 are formed into one body.

In the present embodiment, the vapor deposition source 10 is preferably heated to a temperature equal to or higher than the temperature at which the vapor deposition material gasifies.

Therefore, the pressure adjusting unit 111, the third nozzle unit 121, the pipes 18, and the vacuum exhaust ports 19 are preferably heated to a temperature 50□ or more higher than the temperature at which the vapor deposition material gasifies (e.g., 400□) by the heating body (heater), not illustrated, similar to the pipes 12, 15, and 16, the vapor deposition particles diffusion unit 20, the first nozzle unit 31, the pressure adjusting unit 41, and the second nozzle unit 51.

In the present embodiment, the openings 45 and 115 may be connected through the pressure adjusting device such as the pressure adjusting valve 49 (see FIG. 4) to the vacuum pump 17. Specifically, the pipes 15 and 18 may be provided with the pressure adjusting valve 49.

By providing the pressure adjusting valve 49 to the pipes 15 and 18 to adjust the opening degrees (opening areas) of the openings 45 and 115 in this way, even in a case where the space parts 43 and 113 are connected with the same vacuum pump 17 (or the vacuum pump 4), the ratio of vacuuming the space parts 43 and 113 (the vacuum exhaust capacities of the pipes 15 and 18) can be adjusted in coordinate with the adjustment of the pipe diameters of the pipes 15 and 18, or independent from the adjustment of the pipe diameters of the pipes 15 and 18.

In addition, by providing the pressure adjusting valve 49 to the pipes 15 and 18 to adjust the opening degrees (opening areas) of the openings 45 and 115, as in the case, described as an example in Embodiment 1, that the pressure adjusting valve 49 is provided between each opening 45 and the vacuum pump 17, the film formation rate can be more easily adjusted and the vapor deposition particles 301 can be prevented from excessively being emitted (discharged) from the openings 45 and 115.

In this case, in the present embodiment, in the film formation rate check process, the film formation rate is checked by emitting the vapor deposition particles 301 from the vapor deposition source 10 in the state where the all pressure adjusting valves 49 are closed. Then, in the film formation rate adjustment process, the pressure adjusting valves 49 provided to the pipes 15 and 18 are opened while vacuuming by the vacuum pump 17, so as to decrease the pressure in the space part 43 to be lower than the pressure in the vapor deposition nozzles 32 in the first nozzle unit 31 which is a nozzle unit on the upstream side in the vapor deposition particles ejecting direction among the nozzle units interposing the space part 43, and to decrease the pressure in the space part 113 to be lower than the pressure in the vapor deposition nozzles 52 in the second nozzle unit 51 which is a nozzle unit on the upstream side in the vapor deposition particles ejecting direction among the nozzle units interposing the space part 113. After that, the vapor deposition particles 301 may be emitted from the vapor deposition source 10 while checking the film thickness distribution of the vapor deposition film 302 formed on the target film forming substrate 200 to adjust the film formation rate.

In the present embodiment, the space part 43 and the space part 113 are connected to the shared vacuum exhaust system (vacuum exhaust unit 14). For this reason, according to the present embodiment, other vacuum exhaust systems than the vacuum exhaust system performing evacuation of the vacuum chamber 2 can be integrated, which can simplify the vapor deposition source 10, and a device configuration of the vapor deposition device 100 as well. In addition, the pipes can be also prevented from being complexed. However, the present embodiment is not limited thereto, and the space part 43 and the space part 113 may be connected to the vacuum exhaust systems different from each other.

The present embodiment describes, as an example, the case that the space part 43 and the space part 113 are connected to the vacuum pump 17 provided separately from the vacuum pump 4, but the space part 43 and the space part 113 may be connected with the vacuum pump 4 also in the present embodiment.

Embodiment 2 illustrates the case, as an example, that the vacuum exhaust ports 19 are located outside the vacuum chamber 2, but the vacuum exhaust ports 19 may be provided in the vacuum chamber space 2a.

The present embodiment describes, as an example, the case that one opening 45 is provided on each of right and left sides of the sidewall 44 of the pressure adjusting unit 41 (i.e., on each of both end sides in the X-axis direction), and one opening 115 is provided on each of right and left sides of the sidewall 114 of the pressure adjusting unit 111 (i.e., on each of both end sides in the X-axis direction) in FIG. 7. However, as described above, three or more openings 45 and 115 may be provided so long as the pressures in the space parts 43 and 113 are uniform, for example.

The same number of openings 45 and 115 may be provided, but the openings 115 which are closer to the emitting port for the vapor deposition particles 301 toward the outside (particle discharge outlet) (i.e., on the downstream side in the vapor deposition particles ejecting direction) may be provided more than the of openings 45.

The reason why is because the vapor deposition particles ejecting unit 30 needs to be formed so that the pressure in the space part on the downstream side of the vapor deposition particles emitting port is lower than the pressure in the space part on the upstream side of the vapor deposition particles emitting port, and since the closer to the downstream side of the vapor deposition particles emitting port, the more collimated respective stages of vapor deposition nozzles make the vapor deposition particles 301, the closer the space part is to the downstream side of the vapor deposition particles emitting port, the lower a ratio of the vapor deposition particles 301 discharged (leaked out) from the openings provided to the space part when exhausted.

Advantageous Effects

Hereinafter, a description is specifically given of advantageous effects of the vapor deposition source 10 according to the present embodiment, using results of measurement of the film thickness distribution.

Measurement Condition of Film Thickness Distribution

In the following description, the film thickness distribution was measured similar to Embodiment 1 except that the vapor deposition source 10 illustrated in FIG. 7 was used in place of the vapor deposition source 10 illustrated in FIG. 1.

The length of each of the first sides 32a, 52a, and 122a parallel to the Y-axis direction of the vapor deposition nozzles 32, 52, and 122 in the vapor deposition source 10 used for the measurement in the present embodiment (each of the opening widths d1, d11, and d21 in the Y-axis direction) was 60 mm. The length of each of the second sides 32b, 52b, 122b parallel to the X-axis direction of the vapor deposition nozzles 32, 52, and 122 (each of the opening widths d2, d12, and d22 in the X-axis direction) was 3 mm.

Therefore, an opening area of each of the vapor deposition nozzles 32, 52, and 122 was 180 mm². The length of each of the third sides 32c, 52c, and 122c parallel to the Z-axis direction of the vapor deposition nozzles 32, 52, and 122 (each of the depths, or the nozzle lengths d3, d13, and d23) was 60 mm.

A height in the Z-axis direction of each of the space parts 43 and 113 (i.e., a distance between the vapor deposition nozzles 32 and 52, and a distance between the vapor deposition nozzles 52 and 122) was 30 mm, each length in the X-axis direction was 180 mm, and each length in the Y-axis direction was 100 mm.

In the present embodiment, both the opening diameter of each opening 45 and the inside diameter of each pipe 15 had a diameter (Φ) of 2 mm and a sectional area (opening area) of 3.1 mm². Therefore, a sum of opening areas of two openings 45 (total opening area of the openings 45 (total opening area)) was 6.2 mm². From the above, the total opening area of the openings 45 provided to the space part 43 was equal to or less than ⅒ of the opening area of each vapor deposition nozzle 52 (180 mm²) of the second nozzle unit 51, which was the nozzle unit on the downstream side in the vapor deposition particles ejecting direction among the nozzle units interposing the space part 43.

Both the opening diameter of each opening 115 and the inside diameter of each pipe 18 had a diameter (Φ) of 3.2 mm and a sectional area (opening area) of 8.0 mm². Therefore, a sum of opening areas of two openings 115 (total opening area of the openings 115 (total opening area)) was 16 mm². From the above, the total opening area of the openings 115 provided to the space part 113 was equal to or less than ⅒ of the opening area of each vapor deposition nozzle 122 (180 mm²) of the third nozzle unit 121, which was the nozzle unit on the downstream side in the vapor deposition particles ejecting direction among the nozzle units interposing the space part 113.

A ratio of the sectional area of the pipe 18 to the sectional area of the pipe 15 (in other words, a ratio of the sectional area of the opening 115 to the sectional area of the opening 45) is 2.6, as described above.

The length D1 of each pipe 15 (i.e., a distance between the opening 45 and the vacuum exhaust port 19) and the length D4 of each pipe 18 (i.e., a distance between the opening 115 and the vacuum exhaust port 19) were 0.5 m.

In FIG. 7, the pipe length of each pipe 16 expressed by D2+D3 was 4 m, and the inside diameter of the pipe 16 had a diameter (Φ) of 30 mm and a sectional area of 707 mm².

As described above, the pressure in the vapor deposition particles diffusion unit 20 was several Pa, the pressure in the space part 43 was $1\times10^{-0}$ Pa to $1\times10^{-3}$ Pa, the pressure in the space part 113 was $1\times10^{-1}$ Pa to $1\times10^{-3}$ Pa, and the pressure in the vacuum chamber space 2a was $1\times10^{-3}$ Pa or lower.

The temperature of the heating container (crucible) in the vapor deposition particles generation unit 11 was in a range 250☐ to 270☐, and the respective vapor deposition nozzles 32, 52, and 122, the space parts 43 and 113, the vapor deposition particles diffusion room 21, the pipes 12, 15, 16, and 18, and the vacuum exhaust ports 19 were heated to 400☐ by the heater to have a temperature sufficiently higher than a temperature at which the vapor deposition material gasifies. Other conditions were the same as in Embodiment 1.

Measurement Result of Film Thickness Distribution

FIG. 9 is a graph illustrating an advantageous effect of the vapor deposition source 10 according to the present embodiment.

In FIG. 9, a graph represented by a solid line illustrates film thickness distribution performance of one vapor deposition nozzle 122 at a cross section of the target film forming substrate 200 in the X-axis direction (i.e., a relationship between a value of $\cos^{n+3}$ and the vapor deposition source distance) in a case where the vapor deposition film 302 was formed on the target film forming substrate 200 by using the vapor deposition source 10 according to the present embodiment. The $\cos^{n+3}$ value is represented by normalizing with assumption that a maximum value for the vapor deposition film 302 formed on the target film forming substrate 200 is 1.

Therefore, the graph represented by the solid line in FIG. 9 is a graph represented by normalizing the film thickness distribution in the X-axis direction of the vapor deposition film 302 formed of the vapor deposition particles 301 emitted from the vapor deposition source 10 to the outside, indicated by a character A in FIG. 7. However, in the present embodiment, the vapor deposition particles 301 emitted from the vapor deposition source 10 to the outside pass through the vapor deposition nozzle 32 (first-stage nozzle) and the vapor deposition nozzle 52 (second-stage nozzle), and thereafter, pass through the vapor deposition nozzle 122 (the third-stage nozzle).

In FIG. 9, a graph represented by a dotted line illustrates the film thickness distribution performance of one vapor deposition nozzle 32 at a cross section of the target film forming substrate 200 in the X-axis direction in a case where the vapor deposition source 10 provided with only one stage of the vapor deposition nozzles (specifically, only the vapor deposition nozzle 32) is used to form the vapor deposition film 302 on the target film forming substrate 200.

Specifically, the graph represented by the dotted line in FIG. 9 is a graph obtained by normalizing the film thickness distribution in the X-axis direction of the vapor deposition film 302 formed of the vapor deposition particles 301, indicated by a character B in FIG. 7, passing through the vapor deposition nozzle 32 (first-stage nozzle).

According to the present embodiment, by increasing the number of stages of nozzle portions more than in Embodiment 1, at the last stage in the vapor deposition particles ejecting unit 30 from which the vapor deposition particles 301 are emitted, it is possible to decrease the pressure difference between the vacuum chamber space 2a and a portion as the outlet (emitting port) of the vapor deposition nozzle 122 for the vapor deposition particles 301 toward the outside, so that the scattering of the vapor deposition particles 301 can be further suppressed. To be more specific, the parallel property of the vapor deposition particles 301 can be further heightened, while the pressure, in the vapor deposition source 10, at the outlet (emitting port) portion (in the vicinity of the outlet) for the vapor deposition particles 301 toward the outside can be made closer to the pressure in the vacuum chamber space 2a.

For this reason, according to the present embodiment, as illustrated in FIG. 9, the film thickness distribution in the X-axis direction can be made sharper as compared with the case represented by the solid line in FIG. 6 in Embodiment 1.

In the present embodiment, the respective vapor deposition nozzles 32, 52, and 122 have a rectangular shape elongated in the Y-axis direction in plan view, and therefore the film thickness distribution of the vapor deposition film 302 formed of the vapor deposition particles 301 emitted from the vapor deposition nozzle 122 is a film thickness distribution which is broad in a long side direction as in Embodiment 1. However, similar to Embodiment 1, the Y-axis direction is a film formation direction, and therefore the scattering of the vapor deposition particles 301 in the Y-axis direction contribute to the film formation. For this reason, the film thickness distribution in the Y-axis direction, even in a case of broad, does not matter as much as in the film thickness distribution in the X-axis direction.

Embodiment 3

Figure 10:
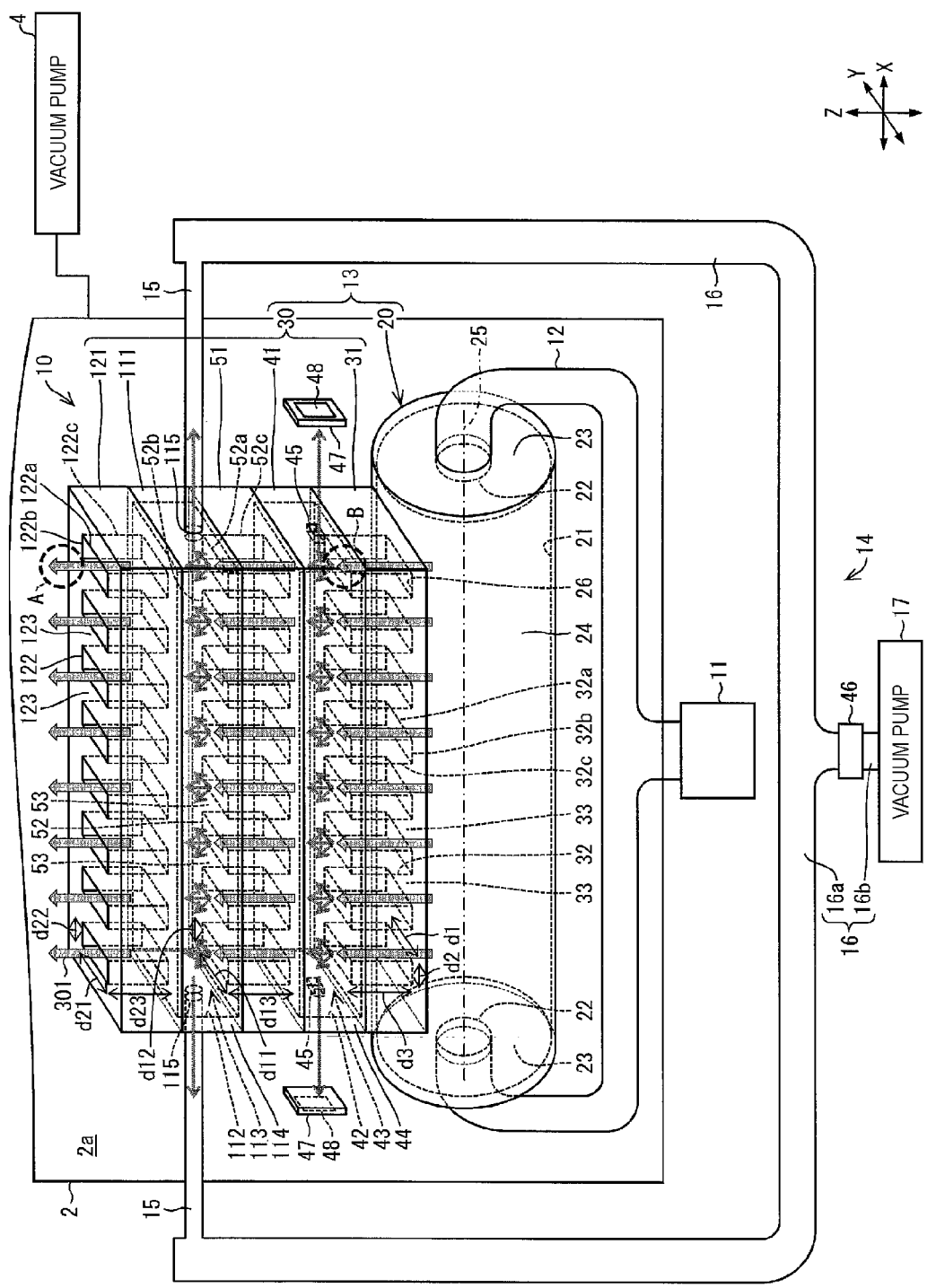
FIG. 10 is a perspective view illustrating a schematic configuration of a vapor deposition source according to Embodiment 3 of the disclosure.
Figure 11:
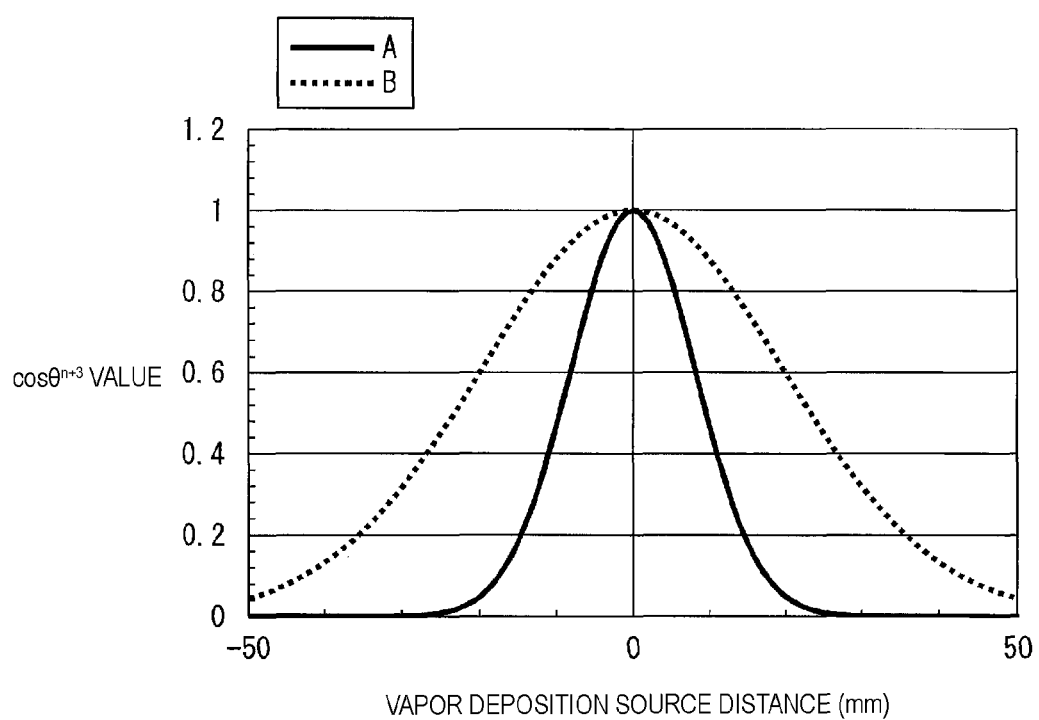
FIG. 11 is a graph illustrating an advantageous effect of the vapor deposition source according to Embodiment 3 of the disclosure.

A description follows regarding yet another embodiment of the disclosure, mainly with reference to FIGS. 10 and 11. The present embodiment will be described on the differences between the present embodiment and Embodiments 1 and 2. Components having the same function as the components used in Embodiments 1 and 2 are appended with the same reference numbers, and the description thereof is omitted.
Schematic Configuration of Vapor Deposition Source 10

FIG. 10 is a perspective view illustrating a schematic configuration of a vapor deposition source 10 according to the present embodiment. In FIG. 10, some of vapor deposition nozzles 32, 52, and 122 are omitted in terms of the number thereof and a shape of each component is simplified, for the convenience of illustration.

The vapor deposition device 100 according to the present embodiment is the same as the vapor deposition device 100 according to Embodiment 2, except that in the nozzle unit at the last stage of the vapor deposition source 10 (the stage from which the vapor deposition particles 301 are finally discharged outside the vapor deposition source 10), the space part of the pressure adjusting unit immediately below the vapor deposition nozzle which is to be the emitting port for the outside is connected with the vacuum exhaust system, and the space part of the pressure adjusting unit other than the former is connected with the vacuum chamber space 2a. Thus, the illustration of the entire vapor deposition device 100 is omitted also in the present embodiment.

Therefore, in the vapor deposition device 100 illustrated in FIG. 10, the sidewall 114 surrounding the space part 113 immediately below the vapor deposition nozzles 122 in the third nozzle unit 121 is provided with openings 115 connected with the vacuum exhaust unit 14, whereas the sidewall 44 surrounding the space part 43 is provided with the openings 45 open to face the outside of the vapor deposition source 10 (i.e., the vacuum chamber space 2a).

Specifically, in the present embodiment, the space part 113 is connected via the openings 115 to the vacuum exhaust unit 14, whereas the space part 43 is connected via the openings 45 to the vacuum chamber space 2a. In the present embodiment, the vacuum exhaust unit 14 includes the pipes 15 and 16 and the vacuum pump 17 similarly to Embodiment 1, and each opening 115 is connected via the pipes 15 and 16 to the vacuum pump 17.

In the present embodiment, the pressure adjusting unit 41 is provided with the space part 43 and the openings 45, where the space part 43 couples the vapor deposition nozzles 32 with the vapor deposition nozzles 52, and the openings 45 as a connection port couples the space part 43 with the vacuum chamber space 2a that is a vacuum space, so that the pressure in the space part 43 decreases naturally. On the other hand, in the present embodiment, the pressure adjusting unit 111 is provided with the openings 115 connected with the vacuum exhaust unit 14 to adjust the pressure in the space part 113 so that a relationship of the pressure in the space part 43>the pressure in the space part 113>the pressure in the vacuum chamber space 2a holds.

In a case where the pressure in the space part 113 is lower the pressure in the vacuum chamber space 2a, impurities such as vacuum chamber contamination are absorbed into the vapor deposition nozzle 122, which may probably cause a degree of purity of the formed vapor deposition film 302 to decrease or dusts to be generated.

Then, in the present embodiment, in order to make the pressure in the space part 113 not lower than the pressure in the vacuum chamber space 2a, it is desirable to use, as the vacuum pump 17, a vacuum pump with a relative low exhaust capacity (specifically, a vacuum pump with the exhaust capacity lower than the vacuum pump 4 which performs evacuation of the vacuum chamber 2), or connect the space part 113 via the pressure adjusting device such as the pressure adjusting valve 49 (see FIG. 4) to the vacuum pump 17. The inside diameter of the pipes 15 and 16 (pipe diameters) may be configured such that the pressure in the space part 113 is not made lower than the pressure in the vacuum chamber space 2a.

In the present embodiment, the above configuration gives the relationship: the pressure in the vapor deposition particles diffusion unit 20 and the pressure in the vapor deposition nozzle 32>the pressure in the space part 43>the pressure in the vapor deposition nozzles 52>the pressure in the space part 113>the pressure in the vapor deposition nozzles 122>the pressure in the vacuum chamber space 2a.

From the above, in the present embodiment, the pressure in the space part 43 is lower than the pressure in the vapor deposition nozzles 32 on the inlet side for the vapor deposition particles 301 toward the space part 43, and higher than the pressure in the vapor deposition nozzles 52 on the outlet side for the vapor deposition particles 301, and therefore the scattering of the vapor deposition particles 301 at the outlet portion for the vapor deposition particles 301 toward the vapor deposition nozzles 52 can be suppressed.

The pressure in the space part 113 is lower than the pressure in the vapor deposition nozzles 52 on the inlet side for the vapor deposition particles 301, and higher than the pressure in the vapor deposition nozzles 122 on the outlet side for the vapor deposition particles 301, and therefore, the scattering of the vapor deposition particles 301 at the outlet portion for the vapor deposition particles 301 toward the vapor deposition nozzles 122 can be suppressed.

Therefore, in the present embodiment, the scattering of the vapor deposition particles 301 at the outlet of the vapor deposition nozzles 122 as the final outlet (emitting port) for the vapor deposition particles 301 can be efficiently suppressed, and therefore the film formation efficiency can be heightened.

According to the present embodiment, as described above, the pressure in the space part 43 can be passively adjusted and the pressure in the space part 113 can be actively adjusted, and therefore the space pressure can be efficiently adjusted.

In the present embodiment, it is preferable that the pressure in the vapor deposition particles diffusion unit 20 is several tens of Pa to several Pa, the pressure in the space part 43 is $1 \times 10^{-0}$ Pa to $1 \times 10^{-2}$ Pa, the pressure in the space part 113 is $1 \times 10^{-1}$ Pa to $1 \times 10^{-3}$ Pa, and the pressure in the vacuum chamber space 2a is $1 \times 10^{-3}$ Pa or lower (where, the pressure in the space part 43>the pressure in the space part 113>the pressure in the vacuum chamber space 2a).

In the present embodiment, the pressure adjusting units 41 and 111 are provided with the openings 45 and 115, and therefore some of the vapor deposition particles 301 are discharged from the openings 45 and 115.

Therefore, the vapor deposition particles retrieving part 46 is preferably between the openings 115 and the vacuum pump 17, as illustrated in FIG. 10.

In order to retrieve the vapor deposition particles 301 discharged from the openings 45, the vapor deposition particles retrieving member 47 and the cooling member 48, for example, are preferably provided between each opening 45 and the vacuum chamber 2 via the vacuum chamber space 2a (i.e., apart from the opening 45). At this time, the vapor deposition particles retrieving member 47 and the cooling member 48 are preferably arranged to face the corresponding opening 45 and be closer to the corresponding opening 45 as much as possible.

Advantageous Effects

Hereinafter, a description is specifically given of advantageous effects of the vapor deposition source 10 according to the present embodiment, using results of measurement of the film thickness distribution.

Measurement Condition of Film Thickness Distribution

In the following description, the film thickness distribution was measured similar to Embodiments 1 and 2 except that the vapor deposition source 10 illustrated in FIG. 10 was used in place of the vapor deposition source 10 illustrated in FIG. 1 or the vapor deposition source 10 illustrated in FIG. 7.

In the present embodiment, both the opening diameter of each opening 115 and the inside diameter of each pipe 15 had a diameter ($\Phi$) of 3.2 mm and a sectional area (opening area) of 8.0 mm². Therefore, a sum of opening areas of two openings 115 (total opening area of the openings 115 (total opening area)) was 16 mm². From the above, the total opening area of the openings 115 provided to the space part 113 was equal to or less than 1/10 of the opening area of each vapor deposition nozzle 122 (180 mm²) of the third nozzle unit 121, which was the nozzle unit on the downstream side in the vapor deposition particles ejecting direction among the nozzle units interposing the space part 113.

The opening diameter of openings 45 was 1 mm×8 mm (the length of the side parallel to the Z-axis direction x the length of the side parallel to the Y-axis direction). Therefore, a sum of opening areas of two openings 45 (total opening area of the openings 45 (total opening area)) was 16 mm², similar to the openings 115. From the above, the total opening area of the openings 45 provided to the space part 43 was equal to or less than 1/10 of the opening area of each vapor deposition nozzle 52 (180 mm²) of the second nozzle unit 51, which was the nozzle unit on the downstream side in the vapor deposition particles ejecting direction among the nozzle units interposing the space part 43.

The length of each pipe 15 (i.e., a distance between the opening 45 and the pipe 16) was 0.5 m. The pipe length of the pipe 16 connected with each pipe 15 was 4 m, and the inside diameter of the pipe 16 had a diameter ($\Phi$) of 30 mm and a sectional area of 707 mm². Other conditions were the same as in Embodiments 1 and 2.

Measurement Result of Film Thickness Distribution

FIG. 11 is a graph illustrating an advantageous effect of the vapor deposition source 10 according to the present embodiment.

In FIG. 11, a graph represented by a solid line illustrates film thickness distribution performance of one vapor deposition nozzle 122 at a cross section of the target film forming substrate 200 in the X-axis direction (i.e., a relationship between a value of $\cos^{n+3}$ and the vapor deposition source distance) in a case where the vapor deposition film 302 was formed on the target film forming substrate 200 by using the vapor deposition source 10 according to the present embodiment. The $\cos^{n+3}$ value is represented by normalizing with assumption that a maximum value for the vapor deposition film 302 formed on the target film forming substrate 200 is 1.

Therefore, the graph represented by the solid line in FIG. 11 is a graph represented by normalizing the film thickness distribution in the X-axis direction of the vapor deposition film 302 formed of the vapor deposition particles 301 emitted from the vapor deposition source 10 to the outside, indicated by a character A in FIG. 10.

In FIG. 11, a graph represented by a dotted line illustrates the film thickness distribution performance of one vapor deposition nozzle 32 at a cross section of the target film forming substrate 200 in the X-axis direction in a case where the vapor deposition source 10 provided with only one stage of the vapor deposition nozzles (specifically, only the vapor deposition nozzle 32) is used to form the vapor deposition film 302 on the target film forming substrate 200.

Specifically, the graph represented by the dotted line in FIG. 11 is a graph obtained by normalizing the film thickness distribution in the X-axis direction of the vapor deposition film 302 formed of the vapor deposition particles 301, indicated by a character B in FIG. 10, passing through the vapor deposition nozzle 32 (first-stage nozzle).

According to the present embodiment, as illustrated in FIG. 11, although the film thickness distribution was slightly spread as compared with the case represented by the solid line in FIG. 9 in Embodiment 2, the film thickness distribution in the X-axis direction can be made sharper, similar to Embodiment 2, as compared with the case represented by the solid line in FIG. 6 in Embodiment 1. According to the present embodiment, the inter-nozzle pressures, specifically, the pressures in the space parts 43 and 113 can be more efficiently adjusted.

Other Embodiments

A description is given below of more modifications of Embodiments 1 to 3 as other embodiments of the disclosure. In the followings, the differences between the present embodiments and Embodiments 1 to 3, and components having the same function as the components used in Embodiments 1 to 3 are appended with the same reference numbers, and the description thereof is omitted.

Modification 1

Figure 12:
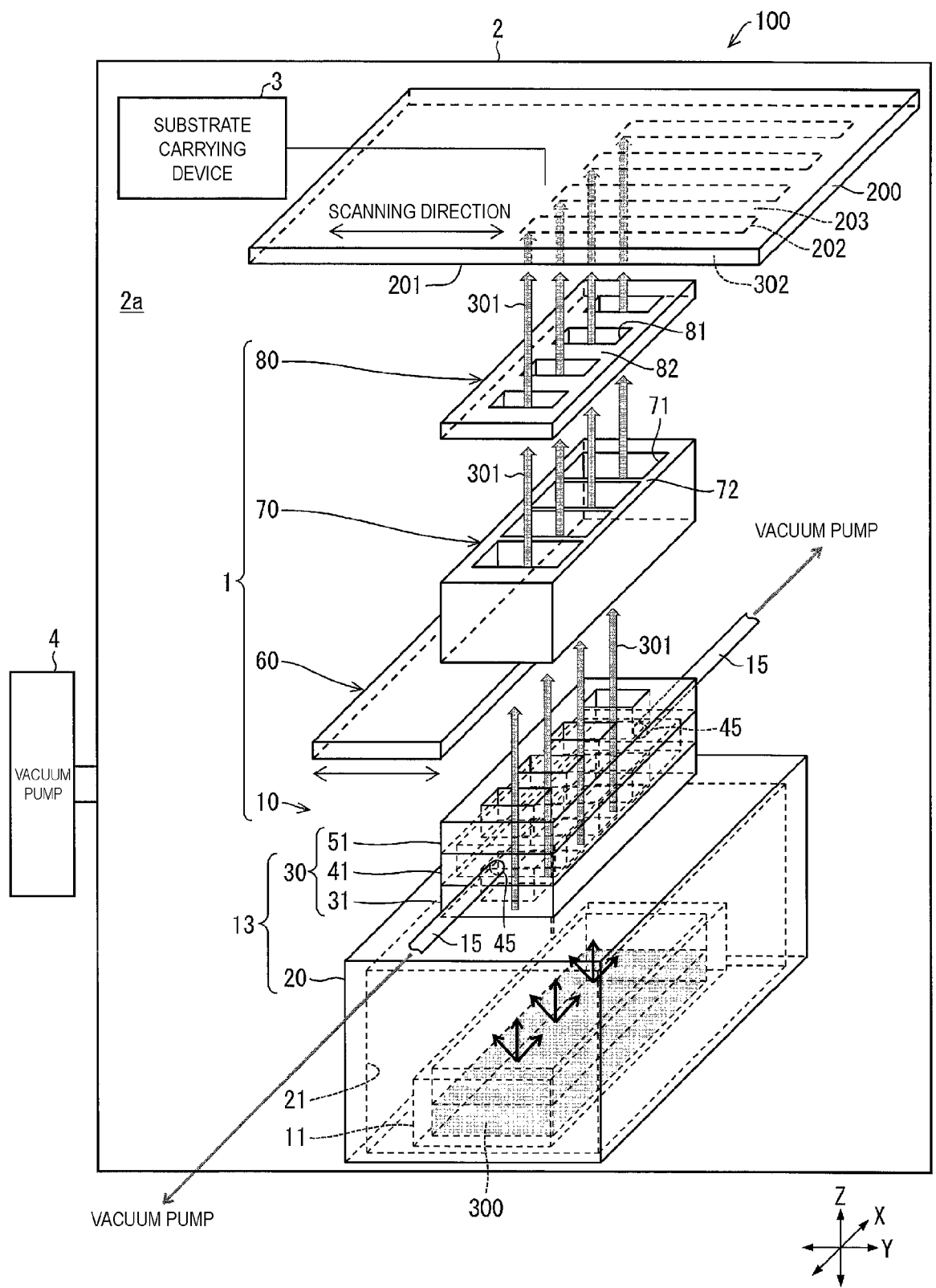
FIG. 12 is a perspective view illustrating a schematic configuration of a main part of a vapor deposition device according to an example of Modification 1 in another embodiment of the disclosure.

FIG. 12 is a perspective view illustrating a schematic configuration of a main part of the vapor deposition device 100 according to the present modification. FIG. 12 also illustrates vapor deposition nozzles 32 and 52, plate openings 71, mask openings 81 and the like with some of these being omitted in terms of the number thereof and illustrate a shape of each component in a simplified manner, for the convenience of illustration.

Embodiment 1 to 3 illustrate the case, as an example, that the vapor deposition particles diffusion unit 20 has the drum-like shape (cylindrical shape). However, the shape of the vapor deposition particles diffusion unit 20 is not limited thereto, and so long as the vapor deposition particles diffusion unit 20 is provided with the vapor deposition particles diffusion room 21 therein as a diffusion space in which the vapor deposition particles 301 are diffused, the shape is not specifically limited. Therefore, the vapor deposition particles diffusion unit 20 may be a hollow container having a square pole-shaped outer shape, for example, as illustrated in FIG. 12. The square pole-shape may be a cuboid shape, or a cubic shape.

Embodiment 1 to 3 describe, as an example, the case that the vapor deposition particles generation unit 11 is provide separate from the vapor deposition source main body 13, and the vapor deposition source main body 13 and the vapor deposition particles generation unit 11 are connected through the pipe 12. However, the vapor deposition particles generation unit 11 may be provided, for example, within the vapor deposition source main body 13 as illustrated by a dotted line in FIG. 12. For example, the vapor deposition particles diffusion room 21 may house, as the vapor deposition particles generation unit 11, a heating container accommodating a vapor deposition material 300 inside thereof such as a crucible and the heater so that the vapor deposition particles diffusion unit 20 (the vapor deposition particles diffusion room 21) serves as both the vapor deposition particles generation portion and the vapor deposition particles diffusion portion. In a case where the vapor deposition particles diffusion room 21 houses the vapor deposition particles generation unit 11, the pipe 12 and the vapor deposition particles inlet 22 do not need to be provided. In this case, the vapor deposition source 10 is entirely located within the vacuum chamber 2.

The present modification includes the configuration as described above in which the vapor deposition particles generation unit 11 is provided within the vapor deposition particles diffusion room 21 such that the vapor deposition source 10 is entirely located within the vacuum chamber 2, but the disclosure is not limited thereto. For example, regarding the vapor deposition source 10 illustrated in Embodiment 1 to 3, the vapor deposition source main body 13, the pipe 12, and the vapor deposition particles generation unit 11 may be located within the vacuum chamber 2 so that the vapor deposition source 10 is entirely located within the vacuum chamber 2.

FIG. 2 illustrates, as an example, the case that the multiple slot-shaped mask openings 81 are two-dimensionally arranged. However, the vapor deposition mask 80 may have the configuration illustrated in FIG. 12 as an example of the case that the multiple mask openings 81 slit-like shaped extending along Y-axis direction may be arrayed in the X-axis direction, as described above. FIG. 2 and FIG. 12 illustrates as an example the case that the vapor deposition mask 80 includes the multiple mask openings 81 provided along at least the X-axis direction, but the vapor deposition mask 80 may be a so-called open mask provided with only one mask opening 81. In this case, the scattering of the vapor deposition particles 301 can be suppressed, and therefore, the effects in the embodiments described above can be obtained as well.

Modification 2

FIG. 13A is a perspective view illustrating a schematic configuration of a vapor deposition source 10 according to the present modification, and FIG. 13B is a front view illustrating a schematic configuration of a main part of the vapor deposition source 10 illustrated in FIG. 13A. FIG. 13B illustrates the schematic configuration of the vapor deposition source 10 of a portion C indicated by a surrounding frame in FIG. 13A. FIG. 13A illustrates also the vapor deposition nozzles 32, 52, and 122 and the like with some of these being omitted in terms of the number thereof and illustrates a shape of each component in a simplified manner, for the convenience of illustration.

Embodiment 2 describes, as an example, the case that the pipes 15 connected with the openings 45 and the pipes 18 connected with the openings 115 are brought together at the vacuum exhaust ports 19, and are connected with the vacuum pump 17 through the pipes 16 connected with the vacuum exhaust ports 19.

However, the disclosure is not limited thereto, and as illustrated in FIGS. 13A and 13B, the pipes connected with each of the space parts 43 and 113 may be brought together for each of the space parts 43 and 113, and connected with one vacuum exhaust port 19.

To be more specific, it may be such that the pipes 15 coupled with the openings 45 are brought together and the pipes 18 coupled with the openings 115 are brought together, and then these pipes 15 and 18 are connected with the same vacuum exhaust port 19.

In this case, in order to make the configuration of the vapor deposition source 10 be right and left symmetric, as illustrated in FIGS. 13A and 13B, the vacuum exhaust port 19 is preferably arranged at a center portion in the X-axis direction which is perpendicular to the Y-axis direction as the scanning direction.

Modification 3

The above-described embodiments describe, as an example, the case that the vapor deposition particles ejecting unit 30 includes, as the multistage of nozzle portions (vapor deposition nozzle portions), the first nozzle unit 31 and the second nozzle unit 51, or the first nozzle unit 31, the second nozzle unit 51, and additionally further the third nozzle unit 121. However, the multistage of nozzle portions may include four or more stages of nozzle portions (nozzle units).

The more the number of stages of nozzle portions, the longer the physical nozzle length can be made, and therefore, the linearity of the vapor deposition particles 301 can be improved. Moreover, as described above, the more the number of stages of the nozzle portions, the less the difference between the pressure at the outlet (emitting port) for the vapor deposition particles 301 toward the vacuum chamber space 2a and the pressure in the vacuum chamber space 2a. Therefore, the directivity of the vapor deposition particles 301 can be further improved.

Modification 4

Embodiment 1 to 3 describes, as an example, the case that the vapor deposition nozzles in the respective nozzle units have the same shape in plan view, and are located to overlap each other such that the central axes (opening centers) thereof coincide with each other. However, the present embodiment is not limited thereto.

The openings of the vapor deposition nozzles in the respective nozzle units may have the same combination of the long side direction and the short side direction, or the combinations intersecting at a 90 degree angle.

Specifically, although not illustrated, for example, in Embodiment 1, the arrangement directions of the vapor deposition nozzle 32 and the vapor deposition nozzle 52 may be shifted at 90 degree angle.

To be more specific, it may be such that the vapor deposition nozzles 32 are arranged in such a way that, in plan view, with the Y-axis direction being the long axis direction, the long sides of the vapor deposition nozzles 32 are parallel to the X-axis, the vapor deposition nozzles 32 next to each other are aligned along the X-axis direction, and the short sides of the vapor deposition nozzles 32 face each other, whereas the vapor deposition nozzles 52 are arranged in such way that, in plan view, the long sides of the vapor deposition nozzles 52 are parallel to the Y-axis and face each other. In other words, the configuration may be such that each vapor deposition nozzle 32 is shaped into a rectangle in plan view where the short side thereof is the first side 32a parallel to the Y-axis direction and the long side thereof is the second side 32b parallel to the X-axis direction, whereas each vapor deposition nozzle 52 is shaped into a rectangle in plan view where the long side thereof is the first side 52a parallel to the Y-axis direction and the short side thereof is the second side 52b parallel to the X-axis direction.

In a case where the opening shapes of the vapor deposition nozzles 32 and 52 in plan view are rectangular shapes each having the long side and the short side in this way, the film thickness distribution of the vapor deposition film 302 which are formed of the vapor deposition particles 301 emitted from the vapor deposition nozzles 32 and 52 can be realizes as a film thickness distribution broad in the long side direction and a film thickness distribution sharp in the short side direction.

Then, the vapor deposition nozzles 32 and 52 are layered via the space part 43 with the arrangement directions thereof being shifted at a 90 degree angle to be able to obtain the sharp film thickness distribution such as an angled shape or square pole shape.

As illustrated in the embodiments described above, in the case where the Y-axis direction is the scanning direction, the X-axis direction is a direction for separate coating of the vapor deposition material. For this reason, in a case where the vapor deposition nozzles 32 and 52 having the same shape are layered via the space part 43 with the arrangement direction thereof being shifted at a 90 degree angle as described above, the vapor deposition nozzle 52 to be the emitting port for the outside desirably has a rectangular shape in plan view with the long side thereof being in the Y-axis direction and the short side thereof being in the X-axis direction as described above, in order to prevent the vapor deposition particles 301 from diffusing in the X-axis direction as much as possible.

In the case of the film formation with the target film forming substrate 200 being carried, the longer the opening widths of the vapor deposition nozzles in the carrying direction of the target film forming substrate 200 (the opening widths d1 and d11 in the Y-axis direction), the more preferable, and it is preferable that the opening widths d1 and d11 in the Y-axis direction are longer than the nozzle lengths d3 and d13 in the Z-axis direction, in order to shorten a tact time.

Therefore, the length of the long side of the vapor deposition nozzle 52 with the long side being in the Y-axis direction (i.e., the first side 52a parallel to the Y-axis direction) (that is, the opening width d11 of the vapor deposition nozzle 52 in the Y-axis direction) is preferably formed to be longer than the nozzle length d13 of the vapor deposition nozzle 52 in the Z-axis direction.

In the case of the scan vapor deposition, the Y-axis direction is a film formation direction, and therefore, the scattering of the vapor deposition particles 301 in the Y-axis direction contribute to the film formation. For this reason, the film thickness distribution in the Y-axis direction, even in a case of broad, does not matter as much as in the film thickness distribution in the X-axis direction.

However, in the scan vapor deposition, first, the vapor deposition particles 301 are emitted from the vapor deposition source 10, and thereafter, the target film forming substrate 200 and/or the vapor deposition unit 1 is moved relative to each other while the vapor deposition particles 301 are emitted to perform vapor deposition. Then, reciprocatory scanning is performed by reversing the scanning direction of the target film forming substrate 200 along the Y-axis direction to perform vapor deposition multiple times on the same place in order to obtain a desired film thickness.

Therefore, even in the case of the scan vapor deposition, the wasted vapor deposition material caused by the vapor deposition particles 301 diffusing occurs both ends of the target film forming substrate 200 in the Y-axis direction.

Regardless of whether the scan vapor deposition is performed, the vapor deposition particles 301 not reaching the target deposition region 202 of the target film forming substrate 200 are all to be loss of the vapor deposition material. Particularly, the organic material constituting an organic layer (organic EL layer) in the organic EL element is a special functional material having electrical conductivity, carrier transport property, light-emitting property, thermal and electrical stability and the like, and a unit price of the material is very expensive.

For this reason, it is more desirable to improve the directivity of the vapor deposition particles 301 to make the film thickness distribution make sharp in both the X-axis direction and the Y-axis direction, from a view point of further improving the usage efficiency of the vapor deposition material.

In the example described above, the direction of the vapor deposition nozzle 52 is rotated by 90 degrees with respect to the vapor deposition nozzle 32, which suppresses the vapor deposition particles 301 diffusing in the X-axis direction. Then, the openings 45 are provided to the space part 43 between the vapor deposition nozzles 32 and 52 to suppress the scattering of the vapor deposition particles 301 at the outlet of the vapor deposition nozzle 32 and the outlet of the vapor deposition nozzle 52 (or no scatter is generated), so that no vapor deposition particles 301 diffuses in the Y-axis direction. Therefore, in the example described above, the film formation performed in the Y-axis direction in a state where the distribution of the vapor deposition particles 301 when passing through the vapor deposition nozzles 32 is maintained as it is, which maintains the film thickness distribution due to the vapor deposition particles 301 having passed through the vapor deposition nozzles 32 also after passing through the vapor deposition nozzles 52. Therefore, in this case, the film thickness distribution which is sharp in both the X-axis direction and the Y-axis direction can be achieved.

In a case where three or more stages of nozzle units (vapor deposition nozzle portions) are provided as described in Embodiment 2 or 3, the vapor deposition nozzle to be the emitting port for the outside (e.g., the vapor deposition nozzle 122) may be provided to have a rectangular shape in plan view with the long side thereof being in the Y-axis direction and the short side thereof being in the X-axis direction, and to partially overlap with each other in such a manner that the long side direction and short side direction of the vapor deposition nozzle in each stage of nozzle units are perpendicular to those in another.

In the above-described embodiments, description is given of the case, as an example, that any of the vapor deposition nozzles 32, 52, and 122 in the respective stages has a rectangular shape in plan view, but at least one of these vapor deposition nozzles 32, 52, and 122 may be formed into a square shape in plan view.

In a case where the vapor deposition nozzle is formed into a square shape in plan view, the vapor deposition particles 301 is restricted in moving and has no way of escape, and therefore, obtained is the film thickness distribution slightly more diffused in the X-axis direction than the film thickness distribution in the short side direction in the case of using the vapor deposition nozzle having a rectangular shape in plan view. For this reason, the film thickness distribution of the vapor deposition film 302 formed through the vapor deposition nozzles has a distribution slightly more diffused in X-axis direction than the film thickness distribution in the case of using the vapor deposition nozzles in Embodiments 1 to 3, for example, but a film thickness distribution can be achieved which is shaper than the film thickness distribution represented by the dotted line in FIG. 6, FIG. 9, or FIG. 11, for example.

In a case where vapor deposition nozzle is formed into a square shape in plan view, the film formation efficiency can be more heightened than the case that the opening shape of the vapor deposition nozzle is formed into a rectangular shape in plan view.

Modification 5

The above-described embodiments describe, as an example, the case that each stage of nozzle portions is provided with the multiple vapor deposition nozzles arrayed in the X-axis direction. In the case where each stage of nozzle portions is provided with multiple vapor deposition nozzles arrayed in the X-axis direction in this way, the multiple vapor deposition films 302 can be formed on the target film forming substrate 200 in the X-axis direction by one vapor deposition source 10. Therefore, the vapor deposition film 302 can be efficiently formed on a large sized target film forming substrate 200.

However, the disclosure in not limited thereto, and each stage of nozzle portions may be provided with at least one vapor deposition nozzle. Since the space part between the vapor deposition nozzles is provided with the openings serving as the pressure adjusting portion (exhaust port) as described above, it is obvious that even in a case where the vapor deposition source 10 has the configuration in which each stage of nozzle portions is provided with only one vapor deposition nozzle, the effects described in the embodiments described above can be obtained from the result of the measurement, illustrated in FIG. 6, FIG. 9, FIG. 11, of the film thickness distribution of the vapor deposition film 302 emitted from one vapor deposition nozzle in the film formation in the rest state.

Modification 6

The above-described embodiments describe, as an example, the case that the nozzle unit and the pressure adjusting unit are each a block-shaped unit, and are formed into one body as the vapor deposition particles ejecting unit 30.

However, the vapor deposition particles ejecting unit 30 is not limited to the above one, and, for example, may have a shape that a top wall and bottom wall of a hollow container are provided with a through hole as the vapor deposition nozzle, and a sidewall (outer wall) of the hollow container is provided with an opening linking a space part between the vapor deposition nozzles to the vacuum chamber space 2a. The vapor deposition particles ejecting unit 30 may have a configuration that an inside of the frame structure is partitioned by multiple regulation plates.

Modification 7

The above-described embodiments describe, as an example, the case that the delivery port 26 and the vapor deposition nozzles have the same shape in plan view, and are provided to overlap each other such that the central axes (opening centers) thereof coincide with each other. However, the shape and size of the delivery port 26 are not limited thereto, and one delivery port 26 may be formed to face the multiple vapor deposition nozzles (e.g., all vapor deposition nozzles 32). Therefore, the delivery port 26 may have a shape that couples the multiple (e.g., all) vapor deposition nozzles 32 with each other.

Modification 8

The above-described embodiments describe, as an example, the case that the vapor deposition mask 80, the restriction plate unit 70, and the vapor deposition source 10 are fixed to somewhere of the inner wall of the vacuum chamber 2, and the substrate carrying device 3 is used to move the target film forming substrate 200 relative to the vapor deposition mask 80, the restriction plate unit 70, and the vapor deposition source 10 to perform vapor deposition (scan vapor deposition) while scanning the target film forming substrate 200.

However, the disclosure is not limited thereto, and, for example, the target film forming substrate 200 may be fixed, and, for example, the vapor deposition mask 80, the restriction plate unit 70, and the vapor deposition source 10 may be moved relative to the target film forming substrate 200 with the Y-axis direction being the scanning direction. Moreover, for example, each of the vapor deposition mask 80, the restriction plate unit 70, the vapor deposition source 10, and the target film forming substrate 200 may be moved relative to others with the Y-axis direction being the scanning direction.

In these cases, the vapor deposition mask 80, the restriction plate unit 70, and vapor deposition source 10 may be unitized as the vapor deposition unit 1. In a case where the vapor deposition mask 80, the restriction plate unit 70, and the vapor deposition source 10 are unitized as one vapor deposition unit (vapor deposition unit 1), these vapor deposition mask 80, restriction plate unit 70, and vapor deposition source 10 may, for example, (i) be fixed to each other by a rigid member, or (ii) have respective independent configurations, and operate in a control operation as one unit. Specifically, at least one of the vapor deposition unit 1 and the target film forming substrate 200 may be moved relative to the other with the Y-axis direction being the scanning direction.

The configuration may be such that the vapor deposition mask 80, the restriction plate unit 70, and the vapor deposition source 10 are held by one identical holding member, and the shutter operating device (shutter transfer device) is provided to hold the holding member to the vapor deposition mask 80, the restriction plate unit 70, the shutter 60, and the vapor deposition source 10 by the identical holding member (holder). In other words, the vapor deposition unit 1 may be provided with the shutter 60.

In a case where the vapor deposition mask 80, the restriction plate unit 70, and the vapor deposition source 10 are moved relative to the target film forming substrate 200 as described above, the vapor deposition device 100 may further include a carrying device (transfer device), not illustrated, which moves these vapor deposition mask 80, restriction plate unit 70, and vapor deposition source 10 relative to the target film forming substrate 200.

For example, in a case where the vapor deposition mask 80, the restriction plate unit 70, and the vapor deposition source 10 are held the respective holding members (i.e., a vapor deposition mask holding member, a restriction plate unit holding member, and a vapor deposition source holding member), the vapor deposition device 100 may further include, for example, a vapor deposition mask carrying device, a restriction plate unit carrying device, and a vapor deposition source carrying device as carrying devices which move these vapor deposition mask 80, restriction plate unit 70, and vapor deposition source 10 relative to the target film forming substrate 200. These vapor deposition mask carrying device, restriction plate unit carrying device, and vapor deposition source carrying device are controlled in their operations by a controller, not illustrated, so that the positional relationship between the vapor deposition mask 80, the restriction plate unit 70, and vapor deposition source 10 is fixed.

In the case where vapor deposition mask 80, the restriction plate unit 70, and the vapor deposition source 10 are unitized as one vapor deposition unit, the vapor deposition device 100 may further include a vapor deposition unit carrying device (vapor deposition unit transfer device), not illustrated, which moves the vapor deposition unit relative to the target film forming substrate 200.

Examples of the carrying devices include various known transfer devices such as a roller type transfer device, and a hydraulic transfer device.

In a case where the target film forming substrate 200 is fixed and the vapor deposition mask 80, the restriction plate unit 70, and the vapor deposition source 10 are moved relative to the target film forming substrate 200, the substrate carrying device 3 does not need to be provided.

Modification 9

The above-described embodiments describe, as an example, the case that the length of the vapor deposition mask 80 in the Y-axis direction is shorter than the length of the target film forming substrate 200 in Y-axis direction, and the positional relationship between the vapor deposition mask 80, the restriction plate unit 70, and the vapor deposition source 10 is fixed (i.e., the positional relationship in all of the X-axis, the Y-axis, and the Z-axis is fixed).

However, the disclosure is not limited thereto, and the configuration may be such that the vapor deposition mask 80 has the size substantially the same as the target film forming substrate 200 in plan view (e.g., identical size), and the target film forming substrate 200 and the vapor deposition mask 80 are arranged to be brought into contact with each other. In this case, (i) the restriction plate unit 70 may have a configuration in which, as illustrated in FIG. 3 and FIG. 12, for example, the length of the restriction plate 72 in the Y-axis direction is shorter than the length of the target film forming substrate 200 in the Y-axis direction, and the positional relationship between the restriction plate unit 70 and the vapor deposition source 10 is fixed, or (ii) have the size substantially the same as the vapor deposition mask 80 and the target film forming substrate 200 in plan view (e.g., identical size) although not illustrated.

In the case where the target film forming substrate 200 and the vapor deposition mask 80 have substantially the same size in plan view, and the positional relationship between the restriction plate unit 70 and the vapor deposition source 10 is fixed, at least one of (i) the target film forming substrate 200 and vapor deposition mask 80, and (ii) the restriction plate unit 70 and vapor deposition source 10 can be moved relative to the other to perform the scan vapor deposition.

In a case where the target film forming substrate 200, the vapor deposition mask 80, and the restriction plate unit 70 have substantially the same size in plan view, at least one of (i) the target film forming substrate 200, vapor deposition mask 80, and restriction plate unit 70, and (ii) the vapor deposition source 10 can be moved relative to the other to perform the scan vapor deposition.

In a case where the target film forming substrate 200 and the vapor deposition mask 80 have substantially the same size in plan view, the mask openings 81 are provided to correspond to the pattern of each vapor deposition film 302 to be formed on the target film forming substrate 200.

Modification 10

The vapor deposition source 10 according to the embodiments described above can be preferably used for the scan vapor deposition as described above. However, vapor deposition source 10 according to the disclosure is not limited thereto, and can be preferably used for (i) a method in which the positional relationship between the target film forming substrate 200, the vapor deposition mask 80, the restriction plate unit 70, and the vapor deposition source 10 is fixed to perform the vapor deposition, or (ii) a step vapor deposition in which the vapor deposition mask 80 is successively moved relative to the target film forming substrate 200 and is brought into (tight) contact with substrate 200 each time to perform the film formation. In this case, the film thickness distribution can be improved at least in the X-axis direction as compare with the related art. According to the present modification, the space part between the vapor deposition nozzles is provided with the openings serving as the pressure adjusting portion (exhaust port) so that the scattering of the vapor deposition particles 301 at outlet of each vapor deposition nozzle can be suppressed, and therefore the film thickness distribution can be improved also in the Y-axis direction as compared with the case that the opening is not provided.

However, in the case of using the vapor deposition scheme described above in (i) or (ii), it is desirable to change the opening shape of the vapor deposition nozzle in plan view, for example, as described in Modification 4, in order to improve the directivities in both the X-axis direction and Y-axis direction.

FIG. 3 and FIG. 12 illustrate, as an example, the case that the restriction plate unit 70 and the shutter 60 are provided between the vapor deposition mask 80 and the vapor deposition source 10. However, the restriction plate unit 70 and the shutter 60 are not needed. For example, in a case where the target film forming substrate 200 and the vapor deposition mask 80 are brought into (tight) contact with each other to perform the vapor deposition as described above, the restriction plate unit 70 and the shutter 60 can be omitted.

Modification 11

The above-described embodiments describe, as an example, the case that the vapor deposition particles 301 are subjected to up-deposition for vapor-depositing upward from underneath. However, the disclosure is not limited thereto, and the vapor deposition particles 301 may be vapor-deposited downward from the above (down-deposition) on the target film forming substrate 200.

In this case, the holding members for holding the target film forming substrate 200, vapor deposition mask 80, restriction plate unit 70, shutter 60, and vapor deposition source 10 are provided to reverse the arrangement of these components, and the vapor deposition source 10 is arranged so that the vapor deposition particles ejecting unit 30 is located below the vapor deposition particles diffusion unit 20.

In the case of performing the vapor deposition by the down-deposition in this way, a highly fine pattern can be accurately formed all over the target film forming substrate 200 without using a scheme such as an electrostatic chuck in order to suppress deflection by its own weight.

Supplement

The vapor deposition source 10 according to Aspect 1 of the disclosure includes (i) a vapor deposition particles ejecting portion (the vapor deposition particles ejecting unit 30) configured to include multistage of vapor deposition nozzle portions (e.g., the first nozzle unit 31, the second nozzle unit 51, and the third nozzle unit 121) layered apart from each other in a vertical direction, each of the vapor deposition nozzle portions including at least one vapor deposition nozzle (e.g., the vapor deposition nozzle 32, 52, or 122), and at least one space part (e.g., the space part 43 or 113) provided between the vapor deposition nozzles in the multistage of vapor deposition nozzle portions, and to emit vapor deposition particles 301 via the vapor deposition nozzle, and (ii) a vacuum exhaust unit 14 configured to include at least one vacuum pump (the vacuum pump 4 or 17) and be connected with the at least one space part.

According to the above configuration, the linearities of the vapor deposition particles 301 emitted from the vapor deposition particles ejecting portion are improved through the physical nozzle length of the vapor deposition nozzle.

According to the above configuration, the at least one space part is connected with the vacuum exhaust unit 14, and therefore it is possible to adjust the pressure in the space part connected with the vacuum exhaust unit 14. Therefore, according to the above configuration, it is possible to adjust the pressure in the space part to be lower than the pressure in the vapor deposition nozzle in the vapor deposition nozzle portion on the upstream side in the vapor deposition particles ejecting direction among the vapor deposition nozzle portions interposing the space part, and higher than the pressure in the vapor deposition nozzle in the vapor deposition nozzle portion on the downstream side in the vapor deposition particles ejecting direction.

Therefore, according to the above configuration, it is possible to decrease the difference between the pressure at the outlet portion of the vapor deposition nozzle for the vapor deposition particles 301 toward the outside (i.e., the outside of the vapor deposition source 10, specifically, the vacuum chamber space 2a as a film formation space) and the pressure of the outside. Therefore, particle scattering of the vapor deposition particles 301 can be efficiently suppressed so that components in the vapor deposition particles 301 contributing to the film formation in a prescribed direction can be increased. Then, by use of the vapor deposition source 10, the directivity of the vapor deposition particles 301 can be improved, and the material usage efficiency can be improved as compared with the related art.

According to the above configuration, the pressure in the space part can be actively controlled, and therefore it is possible to control the pressure in the space part to have a certain pressure, and positively make the pressure in the space part close to the pressure of the outside even in the case of heightening the film formation rate or the case of changing the shapes of the vapor deposition nozzle.

In the vapor deposition source 10 according to Aspect 2 of the disclosure in Aspect 1, the space part preferably has a pressure lower than a pressure in the vapor deposition nozzle in a vapor deposition nozzle portion on an upstream side in a vapor deposition particles ejecting direction among the vapor deposition nozzle portions interposing the space part, and higher than a pressure in the vapor deposition nozzle in the vapor deposition nozzle portion on a downstream side in the vapor deposition particles ejecting direction.

According to the above configuration, it is possible to decrease the difference between the pressure at the outlet portion of the vapor deposition nozzle for the vapor deposition particles 301 toward the outside (film formation space) and the pressure of the outside. Therefore, particle scattering of the vapor deposition particles 301 can be efficiently suppressed so that components in the vapor deposition particles 301 contributing to the film formation in a prescribed direction can be increased. Then, by use of the vapor deposition source 10, the directivity of the vapor deposition particles 301 can be improved, and the material usage efficiency can be improved as compared with the related art.

The vapor deposition source 10 according to Aspect 3 of the disclosure in Aspect 1 or 2 includes a vapor deposition particles generation portion (vapor deposition particles generation unit 11) configured to heat a vapor deposition material to generate the vapor deposition particles in a gaseous state, and at least the vapor deposition particles ejecting portion is located within the vacuum chamber 2, and the space part preferably has a pressure lower than a pressure in the vapor deposition particles generation portion, and higher than a pressure in the vacuum chamber 2.

According to the above configuration, it is possible to decrease the difference between the pressure at the outlet portion of the vapor deposition nozzle for the vapor deposition particles 301 toward the outside (the film formation space, the vacuum chamber space 2a) and the pressure of the outside (the film formation space). Therefore, particle scattering of the vapor deposition particles 301 can be efficiently suppressed so that components in the vapor deposition particles 301 contributing to the film formation in a prescribed direction can be increased. Then, by use of the vapor deposition source 10, the directivity of the vapor deposition particles 301 can be improved, and the material usage efficiency can be improved as compared with the related art.

According to the above configuration, impurities in the vacuum chamber 2 are not absorbed into the vapor deposition nozzle, and therefore, it is possible to prevent a degree of purity of the formed vapor deposition film 302 from decreasing or dusts from being generated.

In the vapor deposition source 10 according to Aspect 4 of the disclosure in Aspect 3, the at least one space part includes multiple space parts, the vapor deposition particles ejecting portion includes the multiple space parts, and the space part located closer to the upstream side in the vapor deposition particles ejecting direction has a higher pressure.

According to the above configuration, the pressure in the vapor deposition particles ejecting portion can be made gradually closer to the pressure in the vacuum chamber 2 along the emission path of the vapor deposition particles 301.

The space part is provided between respective stages of the vapor deposition nozzles in the multistage of vapor deposition nozzle portions. Therefore, according to the above configuration, at least three stages of vapor deposition nozzle portions are provided in the vapor deposition particles ejecting portion. The more the number of stages of nozzle portions, the longer the physical nozzle length can be made, and therefore, the linearity of the vapor deposition particles 301 can be improved.

The more the number of stages of the vapor deposition nozzle portions, the less the difference between the pressure at the outlet for the vapor deposition particles 301 toward the outside (the film formation space, the vacuum chamber space 2a) and the pressure of the outside.

Therefore, according to the above configuration, the directivity of the vapor deposition particles 301 can be further improved.

In the vapor deposition source 10 according to Aspect 5 of the disclosure in Aspect 4, the vacuum exhaust unit 14 includes multiple pipes (the pipes 15, 16, and 18) connected with the space parts, the space parts are connected with the identical vacuum pump through the pipes connected with the space parts, and the pipe connected with the space part located closer to the downstream side in the vapor deposition particles ejecting direction preferably has a larger sectional area.

According to the above configuration, the exhaust capacity by the pipes is determined depending on the sectional areas of the pipes (i.e., the pipe diameters). Therefore, according to the above configuration, the ratio of vacuuming the space parts can be changed by adjusting the sectional areas of the pipes.

According to the above configuration, the number of vacuum pumps connected with each space part can be one, and therefore the configuration can be simplified. The pipe can be also prevented from being complexed.

In the vapor deposition source 10 according to Aspect 6 of the disclosure in Aspect 5, the multiple pipes connected with the space parts are preferably connected through a shared pipe (the vacuum exhaust port 19 and pipe 16) to the identical vacuum pump.

According to the above configuration, the pipes connected with the space parts can be mutually vacuumed at a uniform pressure. Therefore, the ratio of vacuuming the space part can be easily adjusted by the sectional areas of the pipes.

In the vapor deposition source 10 according to Aspect 7 of the disclosure in Aspect 4, preferably, the vacuum exhaust unit 14 is connected with the space part (the space part 113) located the closest to the downstream side in the vapor deposition particles ejecting direction among the multiple space parts, and other space parts (the space part 43) than the closest space part are connected with a space in the vacuum chamber (vacuum chamber space 2a).

According to the above configuration, the space in the vacuum chamber is connected with other space parts than the space part located the closest to the downstream side in the vapor deposition particles ejecting direction among the multiple space parts, and therefore the pressure in each of other space parts than the space part located the closest to the downstream side in the vapor deposition particles ejecting direction decreases naturally.

Therefore, according to the above configuration, the pressure is actively adjusted in the space part located the closest to the downstream side in the vapor deposition particles ejecting direction among the multiple space parts, and the pressure can be passively adjusted in other space parts than the space part, and therefore the space pressure can be efficiently adjusted.

In the vapor deposition source 10 according to Aspect 8 of the disclosure in any one of Aspects 1 to 7, the vacuum exhaust unit 14 includes at least one pressure adjusting mechanism (the pressure adjusting valve 49), and the at least one space part is preferably connected through the pressure adjusting mechanism to the vacuum pump.

According to the above configuration, for example, the pressure in the space part can be easily adjusted as compared with the case of adjusting the pressure in the space part by only the vacuum exhaust performance of the vacuum pump. In a case where the multiple space parts are provided, the ratio of vacuuming the space parts can be adjusted even in a case where the space parts are connected with the same vacuum pump.

In addition, according to the above configuration, the film formation rate can be more easily adjusted and the vapor deposition particles 301 can be prevented from excessively being emitted (discharged) from the openings to the vacuum exhaust unit 14.

The vapor deposition source 10 according to Aspect 9 of the disclosure in Aspect 3 preferably further includes a vapor deposition particles diffusion portion (the vapor deposition particles diffusion unit 20) configured to diffuse and supply the vapor deposition particles 301 generated by the vapor deposition particles generation portion to the vapor deposition particles ejecting portion.

According to the above configuration, it is possible to uniformly emit the vapor deposition particles 301 from the vapor deposition nozzle in the vapor deposition nozzle portion the closest to the downstream side in the vapor deposition particles ejecting direction (i.e., the uppermost stage) in the vapor deposition particles ejecting portion.

In the vapor deposition source 10 according to Aspect 10 of the disclosure in any one of Aspects 1 to 9, preferably, a pressure of an outlet and a pressure of an inlet of a vapor deposition nozzle portion (the first nozzle unit 31) the closest to an upstream side in a vapor deposition particles ejecting direction (i.e., the lowermost stage) among the multistage of vapor deposition nozzle portions are different from each other in the order of 10 to 1000 times, and a pressure of an outlet and a pressure of an inlet of other vapor deposition nozzle portions (i.e., the second and subsequent stages of vapor deposition nozzles, specifically, the second nozzle unit 51 and the third nozzle unit 121) are different from each other in the order of 10 to 100 times.

In a case where the pressure difference is large between the outlet and inlet of the vapor deposition nozzle in the stages of vapor deposition nozzle portions, the vapor deposition particles 301 tend to largely scatter. For this reason, the pressure difference between the outlet and inlet of the vapor deposition nozzle in each vapor deposition nozzle portion is desirably within the above range.

In the vapor deposition source 10 according to Aspect 11 of the disclosure in any one of Aspects 1 to 10, preferably, the space part (the space part 43 or 113) is surrounded by an outer wall (the sidewall 44 or 114) in four directions of the space part, and a part of the outer wall is provided with multiple openings (the openings 45 and 115) connected with the vacuum exhaust unit 14, and the openings are arranged on the outer wall at positions facing each other with a central point of the space part being interposed between the openings.

According to the above configuration, the internal pressure in the space part can be constant.

In the vapor deposition source 10 according to Aspect 12 of the disclosure in any one of Aspects 1 to 11, the vapor deposition nozzles in the multistage of vapor deposition nozzle portions have a rectangular shape composed of a pair of long sides and a pair of short sides in plan view, and preferably are provided to overlap each other in such a manner that a direction of the long side and a direction of the short side coincide with each other.

According to the above configuration, the film thickness distribution of the vapor deposition film 302 formed of the vapor deposition particles 301 can be narrowed down, particularly in the short side direction. Therefore, the vapor deposition film 302 having the film thickness distribution sharp in the short side direction can be formed.

Then, the scan vapor deposition can be performed with the long side direction being the scanning direction to form the highly fine vapor deposition film 302.

In the vapor deposition source 10 according to Aspect 13 of the disclosure in Aspect 12, a length of the long side of the vapor deposition nozzle in the multistage of vapor deposition nozzle portions is preferably longer than a nozzle length of the vapor deposition nozzle in a vertical direction.

In the case of the scan vapor deposition, by making the opening width of the vapor deposition nozzle in the scanning direction longer, the tact time can be shortened. Then, according to the above configuration, the scan vapor deposition can be performed with the long side direction being the scanning direction to shorten the tact time.

The vapor deposition source 10 according to aspect 14 of the disclosure in any one of Aspects 1 to 13 preferably includes the vapor deposition particles retrieving member 47 configured to retrieve the vapor deposition particles 301 discharged from the at least one space part to the vacuum exhaust unit 14.

According to the above configuration, the vapor deposition particles 301, discharged from the at least one space part to the vacuum exhaust unit 14, not contributing the film formation can be retrieved to be reused.

The vapor deposition device 100 according to Aspect 15 of the disclosure is a vapor deposition device for forming the vapor deposition film 302 of a prescribed pattern on the target film forming substrate 200, the vapor deposition device including the vapor deposition source according any one of Aspects 1 to 14.

Therefore, by use of the vapor deposition device 100, the effects similar to Aspect 1 can be obtained.

A vapor deposition film producing method according to Aspect 16 of the disclosure is a vapor deposition film producing method for forming the vapor deposition film 302 on the target film forming substrate 200 by use of the of the vapor deposition device 100 in Aspect 15, the vapor deposition film producing method including adjusting a pressure in the space part to be lower than a pressure in the vapor deposition nozzle in the vapor deposition nozzle portion on an upstream side in a vapor deposition particles ejecting direction among the vapor deposition nozzle portions interposing the space part, and higher than a pressure in the vapor deposition nozzle in the vapor deposition nozzle portion on a downstream side in the vapor deposition particles ejecting direction, and emitting the vapor deposition particles from the vapor deposition source under a reduced-pressure atmosphere to deposit the vapor deposition particles on the target film forming substrate 200.

By forming the vapor deposition film 302 using the vapor deposition film producing method, the effects similar to Aspect 1 can be obtained.

In the vapor deposition film producing method according to Aspect 17 of the disclosure in Aspect 16, preferably, each of the stages of vapor deposition nozzle portions is provided with the multiple vapor deposition nozzles arrayed in a first direction (the X-axis direction) in plan view, and vapor deposition is performed while relatively moving at least one of the vapor deposition unit 1 and the target film forming substrate 200 in a second direction (the Y-axis direction) perpendicular to the first direction in plan view.

According to the above method, the vapor deposition film 302 can be efficiently formed on a large sized target film forming substrate 200.

The disclosure is not limited to each of the present embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the present embodiments.

REFERENCE SIGNS LIST

1 Vapor deposition unit
2 Vacuum chamber
2a Vacuum chamber space
3 Substrate carrying device
4 Vacuum pump
10 Vapor deposition source
10A, 32, 52, 122 Vapor deposition nozzle
11 Vapor deposition particles generation unit (vapor deposition particles generation portion)
12, 15, 16, 18 Pipe
13 Vapor deposition source main body
14 Vacuum exhaust unit
19 Vacuum exhaust port (pipe)
20 Vapor deposition particles diffusion unit (vapor deposition particles diffusion portion)
21 Vapor deposition particles diffusion room
22 Vapor deposition particles inlet
24 Peripheral surface
25 Cylinder axis
26 Delivery port
30 Vapor deposition particles ejecting unit (vapor deposition particles ejecting portion)
31 First nozzle unit (vapor deposition nozzle portion)
32a, 52a, 122a First side
32b, 52b, 122b Second side
32c, 52c, 122c Third side
33, 53, 123 Regulation plate
41, 111 Pressure adjusting unit
42, 112 Space forming opening section
43, 113 Space part
44, 114 Sidewall (outer wall)
45, 115 Opening
46 Vapor deposition particles retrieving part
47 Vapor deposition particles retrieving member
48 Cooling member
49 Pressure adjusting valve (pressure adjusting mechanism)
51 Second nozzle unit (vapor deposition nozzle portion)
60 Shutter
70 Restriction plate unit
71 Restriction plate opening
72 Restriction plate
80 Vapor deposition mask
81 Mask opening
82 Non-opening part
100 Vapor deposition device
121 Third nozzle unit (vapor deposition nozzle portion)
200 Target film forming substrate
201 Target deposition surface
202 Target deposition region
203 Non-target deposition region
300 Vapor deposition material
301 Vapor deposition particles
302 Vapor deposition film

The invention claimed is:

1. A vapor deposition source comprising:
a vapor deposition particles ejecting portion configured to include multistage of vapor deposition nozzle portions layered apart from each other in a vertical direction, each of the vapor deposition nozzle portions including at least one vapor deposition nozzle, and at least one space part provided between each two stages of vapor deposition nozzles among the multiple vapor deposition nozzle portions, and to emit vapor deposition particles via the vapor deposition nozzle;
a vacuum exhaust unit configured to include at least one vacuum pump and be connected with the at least one space part; and
a vapor deposition particles generation portion configured to heat a vapor deposition material to generate the vapor deposition particles in a gaseous state, wherein
at least the vapor deposition particles ejecting portion is located within a vacuum chamber, and the at least one space part has a pressure lower than a pressure in the vapor deposition particles generation portion, and higher than a pressure in the vacuum chamber.

2. The vapor deposition source according to claim 1, wherein the at least one space part has a pressure lower than a pressure in the vapor deposition nozzle in a vapor deposition nozzle portion that is closer to the vapor deposition particles generation portion among the vapor deposition nozzle portions interposing the at least one space part, and higher than a pressure in the vapor deposition nozzle in the vapor deposition nozzle portion that is farther from the vapor deposition particles generation portion.

3. The vapor deposition source according to claim 1, wherein the at least one space part includes multiple space parts,
the vapor deposition particles ejecting portion includes the multiple space parts, and
the space part located closer to the vapor deposition particles generation portion among the multiple space parts has a higher pressure than the space part located farther from the vapor deposition particles generation portion among the multiple space parts.

4. The vapor deposition source according to claim 3, wherein the vacuum exhaust unit includes multiple pipes connected with the space parts,
the multiple space parts are connected with the at least one vacuum pump through the pipes connected with the space parts, and
the pipe connected with the space part located farther from the vapor deposition particles generation portion among the multiple space parts has a larger sectional area than the pipe connected with the space part located closer to the vapor deposition particles generation portion among the multiple space parts.

5. The vapor deposition source according to claim 4, wherein the multiple pipes connected with the space parts are connected through a shared pipe to the at least one vacuum pump.

6. The vapor deposition source according to claim 3, wherein the vacuum exhaust unit is connected with the space part located farthest from the vapor deposition particles generation portion among the multiple space parts, and space parts among the multiple space parts other than the space part located farthest from the vapor deposition particles generation portion are connected with a space in the vacuum chamber.

7. The vapor deposition source according to claim 1, wherein the vacuum exhaust unit includes at least one pressure adjusting mechanism, and
the at least one space part is connected through the pressure adjusting mechanism to the at least one vacuum pump.

8. The vapor deposition source according to claim 1, further comprising:
a vapor deposition particles diffusion portion configured to diffuse and supply the vapor deposition particles generated by the vapor deposition particles generation portion to the vapor deposition particles ejecting portion.

9. The vapor deposition source according to claim 1, wherein a pressure of an outlet and a pressure of an inlet of a vapor deposition nozzle portion closest to the vapor deposition particles generation portion among the multistage of vapor deposition nozzle portions are different from each other in the order of 10 to 1000 times, and a pressure of an outlet and a pressure of an inlet of other vapor deposition nozzle portion are different from each other in the order of 10 to 100 times.

10. The vapor deposition source according to claim 1, wherein the at least one space part is surrounded by an outer wall in four directions of the at least one space part, and a part of the outer wall is provided with multiple openings connected with the vacuum exhaust unit, and
the openings are arranged on the outer wall at positions facing each other with a central point of the at least one space part being interposed between the openings.

11. The vapor deposition source according to claim 1, wherein the vapor deposition nozzles in the multistage of vapor deposition nozzle portions respectively have a rectangular shape composed of a pair of long sides and a pair of short sides in plan view, and are provided to overlap each other in such a manner that a direction of the long side and a direction of the short side coincide with each other.

12. The vapor deposition source according to claim 11, wherein a length of the long side of the vapor deposition nozzle in the multistage of vapor deposition nozzle portions is longer than a nozzle length of the vapor deposition nozzle in a vertical direction.

13. The vapor deposition source according to claim 1, further comprising:
a vapor deposition particles retrieving member configured to retrieve the vapor deposition particles discharged from the at least one space part to the vacuum exhaust unit.

14. A vapor deposition device for forming a vapor deposition film of a prescribed pattern on a target film forming substrate, the vapor deposition device comprising:
a vapor deposition unit including the vapor deposition source according to claim 1.

* * * * *